(12) United States Patent
Gao et al.

(10) Patent No.: US 11,844,313 B2
(45) Date of Patent: Dec. 19, 2023

(54) SELF-MOVING DEVICE AND AUTOMATIC WORKING SYSTEM THEREOF

(71) Applicant: Positec Technology (China) Co., Ltd, Jiangsu (CN)

(72) Inventors: Don Zhendong Gao, Jiangsu (HK); Shiping Jiao, Jiangsu (CN); Jiang Du, Jiangsu (CN); Xiulian Chen, Jiangsu (CN); Fengli Zhao, Jiangsu (CN); Bincai Lan, Jiangsu (CN)

(73) Assignee: Positec Technology (China) Co., Ltd., Jiangsu (CN)

( * ) Notice: Subject to any disclaimer, the term of this patent is extended or adjusted under 35 U.S.C. 154(b) by 937 days.

(21) Appl. No.: 16/650,846

(22) PCT Filed: Sep. 27, 2018

(86) PCT No.: PCT/CN2018/107842
§ 371 (c)(1),
(2) Date: Mar. 25, 2020

(87) PCT Pub. No.: WO2019/062795
PCT Pub. Date: Apr. 4, 2019

(65) Prior Publication Data
US 2020/0267903 A1 Aug. 27, 2020

(30) Foreign Application Priority Data

Sep. 27, 2017 (CN) .......................... 201710891448.0
Dec. 14, 2017 (CN) .......................... 201721747909.9
Apr. 9, 2018 (CN) .......................... 201810312466.3

(51) Int. Cl.
*A01D 34/00* (2006.01)
*A01D 34/81* (2006.01)
(Continued)

(52) U.S. Cl.
CPC ......... *A01D 75/187* (2013.01); *A01D 34/001* (2013.01); *A01D 34/008* (2013.01);
(Continued)

(58) Field of Classification Search
CPC .... A01D 34/001; A01D 34/008; A01D 34/81; A01D 75/187; A01D 34/78;
(Continued)

(56) References Cited

U.S. PATENT DOCUMENTS 2,675,662 A * 4/1954 Kroll ..................... F01N 13/001
56/12.2
3,112,596 A * 12/1963 Price ..................... A01D 34/82
56/320.2
(Continued)

FOREIGN PATENT DOCUMENTS

CN 101373901 A 2/2009
CN 101522017 A 9/2009
(Continued)

*Primary Examiner* — Alicia Torres
(74) *Attorney, Agent, or Firm* — Dentons US LLP

(57) ABSTRACT

An automatic working system includes a self-moving device moving and working inside a defined working area and an energy module supplying power to the self-moving device. The self-moving device includes a body, a movement module, a task execution module, and a control module. The energy module is selectively configured to supply power to the self-moving device or another electric tool different from the self-moving device. The self-moving device includes an accommodating cavity provided with an inlet and configured to accommodate the energy module and a protective cover configured to operably block the inlet. The self-moving device further includes a drainage system configured to drain water to prevent water from entering the accommodating cavity.

19 Claims, 34 Drawing Sheets

(51) Int. Cl.
  *A01D 34/78* (2006.01)
  *H05K 5/02* (2006.01)
  *A01D 75/18* (2006.01)
  *A01D 101/00* (2006.01)

(52) U.S. Cl.
  CPC .............. *A01D 34/78* (2013.01); *A01D 34/81* (2013.01); *H05K 5/0217* (2013.01); *A01D 2101/00* (2013.01); *G05D 2201/0208* (2013.01)

(58) Field of Classification Search
  CPC .. H01M 10/613; H01M 10/615; H01M 50/20; H01M 50/30; H01M 2220/20; H05K 5/0217
  See application file for complete search history.

(56) References Cited

U.S. PATENT DOCUMENTS

| | | | |
|---|---|---|---|
| 5,035,024 A | 7/1991 | Steiner et al. | |
| 5,274,988 A * | 1/1994 | Bruce | A01D 34/001 56/320.1 |
| 6,104,162 A | 8/2000 | Sainsbury et al. | |
| 7,526,833 B2 | 5/2009 | Cochran et al. | |
| 8,490,732 B2 | 7/2013 | Sugimoto et al. | |
| 8,601,640 B2 | 12/2013 | Bertram et al. | |
| 8,671,508 B2 | 3/2014 | Nagasaka et al. | |
| 8,732,896 B2 * | 5/2014 | Lucas | H02J 7/0024 15/319 |
| 8,733,072 B2 | 5/2014 | Hansen et al. | |
| 8,851,215 B2 * | 10/2014 | Goto | B62M 6/55 180/19.1 |
| 8,984,711 B2 | 3/2015 | Ota et al. | |
| 9,204,594 B2 | 12/2015 | Hwang et al. | |
| 9,237,689 B2 | 1/2016 | Choi et al. | |
| 9,282,695 B2 | 3/2016 | Goto | |
| 9,469,309 B2 | 10/2016 | Yagci et al. | |
| 9,776,296 B2 | 10/2017 | Brewster et al. | |
| 2012/0256752 A1 | 10/2012 | Musser et al. | |
| 2013/0192184 A1 | 8/2013 | Choi et al. | |
| 2013/0212994 A1 | 8/2013 | Hwang et al. | |
| 2013/0213683 A1 | 8/2013 | Brewster et al. | |
| 2017/0112344 A1 | 4/2017 | Koura et al. | |
| 2017/0332857 A1 | 11/2017 | Nam et al. | |

FOREIGN PATENT DOCUMENTS

| | | | | |
|---|---|---|---|---|
| CN | 102687625 | A | 9/2012 | |
| CN | 102799181 | A | 11/2012 | |
| CN | 103354385 | A | 10/2013 | |
| CN | 103970039 | A | 8/2014 | |
| CN | 103997082 | A | 8/2014 | |
| CN | 104641784 | A | 5/2015 | |
| CN | 204539996 | U | 8/2015 | |
| CN | 205051424 | U | 2/2016 | |
| CN | 105476556 | A | 4/2016 | |
| CN | 205458458 | U | 8/2016 | |
| CN | 106025403 | A | 10/2016 | |
| CN | 106169548 | A | 11/2016 | |
| CN | 106214070 | A | 12/2016 | |
| CN | 205944189 | U | 2/2017 | |
| CN | 103079912 | B | 3/2017 | |
| CN | 206059470 | U | 3/2017 | |
| CN | 106571436 | A | 4/2017 | |
| CN | 106654102 | A | 5/2017 | |
| CN | 107009392 | A | 8/2017 | |
| CN | 107078533 | A | 8/2017 | |
| CN | 107214731 | A | 9/2017 | |
| CN | 107225955 | A | 10/2017 | |
| DE | 202012005813 | U1 | 8/2012 | |
| EP | 0829196 | A2 | 3/1998 | |
| EP | 0920367 | A1 | 6/1999 | |
| EP | 2412219 | A1 * | 2/2012 | ........... A01D 34/008 |
| EP | 2875712 | A1 | 5/2015 | |
| EP | 3234717 | A1 | 10/2017 | |
| EP | 3236735 | A1 | 11/2017 | |
| JP | 6153320 | A | 3/1986 | |
| JP | 6-153320 | A | 5/1994 | |
| JP | 2010267434 | A | 11/2010 | |
| JP | 2015-075825 | A | 4/2015 | |
| JP | 2016-028906 | A | 3/2016 | |
| JP | 5875640 | B1 | 3/2016 | |
| JP | 2016-049048 | A | 4/2016 | |
| JP | 2016-073396 | A | 5/2016 | |
| JP | 2016-208885 | A | 12/2016 | |
| JP | 2016-220824 | A | 12/2016 | |
| JP | 2017-113078 | A | 6/2017 | |
| JP | 2017-136492 | A | 8/2017 | |
| JP | 2017-158401 | A | 9/2017 | |
| KR | 10-0619743 | B1 | 9/2006 | |
| KR | 10-2006-0134368 | A | 12/2006 | |
| KR | 10-2017-0019890 | A | 2/2017 | |
| KR | 10-2017-0021113 | A | 2/2017 | |
| WO | 97/49528 | A1 | 12/1997 | |
| WO | 2013/059917 | A1 | 5/2013 | |
| WO | WO-2016013365 | A1 * | 1/2016 | ............. A01D 34/78 |
| WO | 2016/097896 | A1 | 6/2016 | |
| WO | 2016/102145 | A1 | 6/2016 | |
| WO | 2016140236 | A1 | 9/2016 | |
| WO | 2016/155559 | A1 | 10/2016 | |

\* cited by examiner

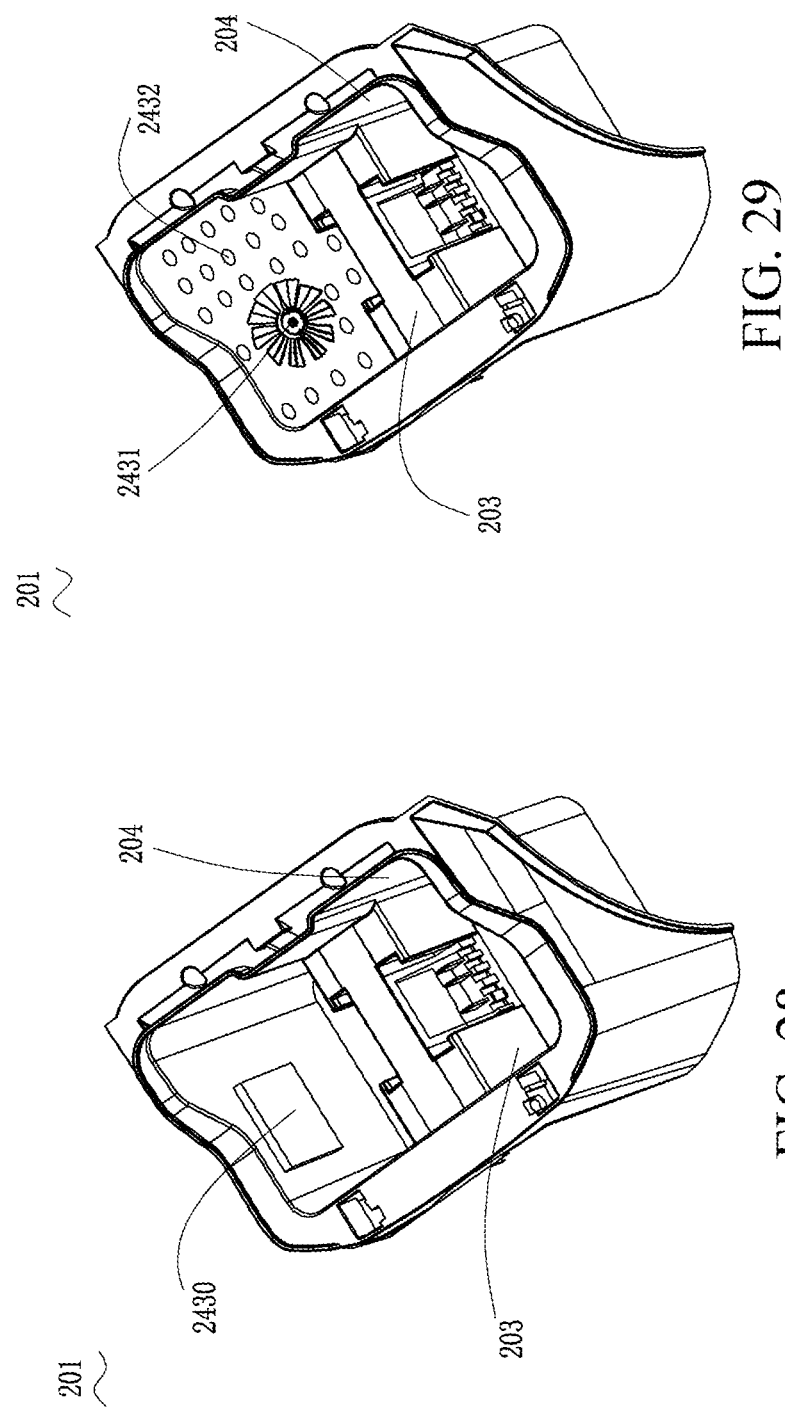

SELF-MOVING DEVICE AND AUTOMATIC WORKING SYSTEM THEREOF

This application is the National Stage filing under 35 U.S.C. 371 of International Application No. PCT/CN2018/107842, filed on Sep. 27, 2018, which claims benefit of and priority to Chinese Patent Application No. 201710891448.0, filed on Sep. 27, 2017, Chinese Patent Application No. 201721747909.9, filed on Dec. 14, 2017 and Chinese Patent Application No. 201810312466.3, filed on Apr. 9, 2018, all of which are hereby incorporated by reference in their entirety for all purposes as if fully set forth herein.

BACKGROUND

Technical Field

The present invention relates to a self-moving device and an automatic working system thereof.

Related Art

For a self-moving device and an automatic working system thereof, for example, an automatic mower and an automatic working system thereof, the automatic working system of the automatic mower includes a boundary wire, the automatic mower, a charging station, and the like. A built-in battery pack is disposed inside the automatic mower. The battery pack is fastened inside the automatic mower. The automatic mower can automatically perform a work task without manual supervision. When there is insufficient power, the automatic mower automatically returns to the charging station to supply power to an energy module to perform charging. Such a built-in battery pack is usually specially configured for a corresponding automatic mower and can be directly used after mounting.

SUMMARY

Traditionally, in one aspect, the battery pack cannot be manually detached, and it is necessary to use a tool to remove a screw or the like to mount or detach the battery pack. In another aspect, other electric tools such as a gun drill, a hammer drill, a trimmer, and a hand-propelled lawnmower are powered by a detachable battery pack. When an electric tool runs out of power, a user has to replace the battery pack with a spare battery pack. When the spare battery pack is used up, the user has to stop work, takes the battery packs home or another charging site to charge the battery packs, and waits until the battery packs are fully charged before the user can continue with the work. As a result, the time efficiency and continuity of work cannot be ensured.

To overcome the foregoing deficiencies, the following technical solution is adopted in embodiments of the present invention:

An automatic working system includes a self-moving device moving and working inside a defined working area and an energy module supplying power to the self-moving device, where the self-moving device includes:

a body;
a movement module, disposed on the body and configured to drive the self-moving device to move;
a task execution module, disposed on the body and configured to perform a work task; and
a control module, configured to: control the movement module to drive the self-moving device to move inside a defined area, and control the task execution module to perform the work task, where the energy module is selectively configured to supply power to the self-moving device or another electric tool different from the self-moving device, the self-moving device includes an accommodating cavity provided with an inlet and configured to accommodate the energy module and a protective cover configured to operably block the inlet, and the self-moving device further includes a drainage system configured to drain water to prevent water from entering the accommodating cavity.

Further, the drainage system includes a drainage groove in communication with the outside of the self-moving device to drain water outside.

Further, the body includes a bearing portion configured to bear the circumference of the protective cover, and the drainage groove is provided in the bearing portion.

Further, the self-moving device further includes a pivot portion configured to connect the protective cover and the body, and the protective cover is rotatable around the pivot portion to implement opening or closing.

Further, the body further includes a pivot groove accommodating the pivot portion, and the drainage groove includes a pivot portion drainage groove in communication with the pivot groove.

Further, the pivot portion drainage groove includes a drainage hole in communication with the outside and a connecting groove connecting the pivot groove and the drainage hole.

Further, the drainage hole is located below the connecting groove.

Further, the protective cover includes a top cover, a lateral protective wall extending toward the left and right sides from the top cover, and a rear protective wall formed extending backward from the top cover.

Further, the lateral protective wall is located on outer sides of left and right side walls of the body, the bottom of the lateral protective wall is lower than upper surfaces of the left and right side walls of the body, and the rear protective wall is located on an outer side of a rear wall of the body.

Further, the drainage system further includes a water guide groove disposed on the surface of the body and provided with a bottom, and the water guide groove includes a water guide passage formed recessing inward from the surface of the body and a water guide hole connecting the water guide passage and the outside of the self-moving device.

Further, in a horizontal direction, the bottom of the water guide groove extends from the middle of the body to the outside of the body, and in a vertical direction, the bottom of the water guide groove extends from top to bottom.

Further, a projection of the protective cover in a transverse direction is smaller than a projection of a corresponding position of the body in the transverse direction.

Further, in the transverse direction, the water guide groove is located on two sides of the accommodating cavity, and the body includes a separating wall located between the water guide groove and the accommodating cavity.

Further, the self-moving device further includes a side wall accommodating groove accommodating the lateral protective wall, and the side wall accommodating groove is in communication with the water guide groove.

Further, the drainage system further includes a water-stop wall located in front of the inlet.

Further, the inlet includes a vertical opening extending in a vertical direction and a longitudinal opening extending in a longitudinal direction.

Further, the inlet includes an upper end edge and a lower end edge, and in a travel direction of the self-moving device, the upper end edge is located in front of the lower end edge.

Further, the self-moving device further includes a thermal insulation body located between the protective cover and the accommodating cavity.

Further, a thermal insulation space is provided between the thermal insulation body and the protective cover.

Further, the thermal insulation body is a part of the body, the body includes a base and the thermal insulation body extending from the base, the thermal insulation body and the base together define the accommodating cavity, and the thermal insulation body includes a thermal insulation top wall located right above the accommodating cavity and a thermal insulation side wall connecting the thermal insulation top wall and the base.

Further, the drainage system further includes a water guide groove located on two sides of the thermal insulation side wall and provided with a bottom.

Further, in a horizontal direction, the bottom of the water guide groove extends from the middle of the body to the outside of the body, and in a vertical direction, the bottom of the water guide groove extends from top to bottom.

Further, the drainage system further includes a water-stop wall disposed in front of the inlet, and the water-stop wall is located between the protective cover and the thermal insulation body.

Further, the water-stop wall is formed protruding outward from an upper surface of the thermal insulation body, and/or is formed extending from a lower end of the protective cover.

Further, the self-moving device further includes a self-moving device power supply interface configured to be electrically connected to the energy module.

Further, the self-moving device power supply interface includes at least one of a fast-pluggable self-moving device connector and a wirelessly-rechargeable self-moving device charging interface.

Further, the automatic working system further includes an electric tool different from the self-moving device, and the electric tool includes an electric tool power supply interface the same as the self-moving device power supply interface, to enable the energy module to be selectively configured to supply power to the self-moving device or the electric tool.

The following technical solution may further be adopted in embodiments of the present invention: A self-moving device powered by an energy module is provided, the self-moving device moving and working inside a defined working area, where the self-moving device includes:
a body;
a movement module, disposed on the body and configured to drive the self-moving device to move;
a task execution module, disposed on the body and configured to perform a work task; and
a control module, configured to: control the movement module to drive the self-moving device to move inside a defined area, and control the task execution module to perform the work task; and
a self-moving device power supply interface, configured to be electrically connected to the energy module, where the self-moving device power supply interface is the same as a power supply interface of an electric tool different from the self-moving device, to enable the energy module to be selectively configured to supply power to the self-moving device or the electric tool, where
the self-moving device includes an accommodating cavity provided with an inlet and a protective cover configured to operably block the inlet, the accommodating cavity is configured to accommodate the self-moving device power supply interface and the energy module, and the self-moving device further includes a drainage system configured to drain water to prevent water from entering the accommodating cavity.

Further, the self-moving device power supply interface includes at least one of a fast-pluggable self-moving device connector and a wirelessly-rechargeable self-moving device charging interface.

Further, the drainage system includes a drainage groove in communication with the outside of the self-moving device to drain water outside.

Further, the body includes a bearing portion configured to bear the circumference of the protective cover, and the drainage groove is provided in the bearing portion.

Further, the self-moving device further includes a pivot portion configured to connect the protective cover and the body, the protective cover is rotatable around the pivot portion to implement opening or closing, the body further includes a pivot groove accommodating the pivot portion, and the drainage groove includes a pivot portion drainage groove in communication with the pivot groove.

Further, the protective cover includes a top cover, a lateral protective wall extending toward the left and right sides from the top cover, and a rear protective wall formed extending backward from the top cover, the drainage system further includes a water guide groove disposed on the surface of the body and provided with a bottom, and the water guide groove includes a water guide passage formed recessing inward from the surface of the body and a water guide hole connecting the water guide passage and the outside of the self-moving device.

Further, a projection of the protective cover in a transverse direction is smaller than a projection of a corresponding position of the body in the transverse direction, in the transverse direction, the water guide groove is located on two sides of the accommodating cavity, and the body includes a separating wall located between the water guide groove and the accommodating cavity.

Further, the drainage system further includes a water-stop wall located in front of the inlet.

The following technical solution may further be adopted in embodiments of the present invention: A self-moving device powered by an energy module is provided, the self-moving device moving and working inside a defined working area, where the self-moving device includes:
a body;
a movement module, disposed on the body and configured to drive the self-moving device to move;
a task execution module, disposed on the body and configured to perform a work task; and
a control module, configured to: control the movement module to drive the self-moving device to move inside a defined area, and control the task execution module to perform the work task, where
the self-moving device is powered by the detachable energy module, the self-moving device includes an accommodating cavity provided with an inlet and configured to accommodate the energy module and a protective cover configured to operably block the inlet, and the self-moving device further includes a drainage system configured to drain water to prevent water from entering the accommodating cavity.

Further, the self-moving device includes a self-moving device power supply interface electrically connected to the energy module, and the self-moving device power supply interface includes at least one of a fast-pluggable self-moving device connector and a wirelessly-rechargeable self-moving device charging interface.

Further, the drainage system includes a drainage groove in communication with the outside of the self-moving device to drain water outside.

Further, the body includes a bearing portion configured to bear the circumference of the protective cover, and the drainage groove is provided in the bearing portion.

Further, the self-moving device further includes a pivot portion configured to connect the protective cover and the body, the protective cover is rotatable around the pivot portion to implement opening or closing, the body further includes a pivot groove accommodating the pivot portion, and the drainage groove includes a pivot portion drainage groove in communication with the pivot groove.

Further, the protective cover includes a top cover, a lateral protective wall extending toward the left and right sides from the top cover, and a rear protective wall formed extending backward from the top cover, the drainage system further includes a water guide groove disposed on the surface of the body and provided with a bottom, and the water guide groove includes a water guide passage formed recessing inward from the surface of the body and a water guide hole connecting the water guide passage and the outside of the self-moving device.

The foregoing embodiments of the present invention have the following beneficial effects: A drainage system is added to a self-moving device to drain water to prevent water from entering an accommodating cavity, to enable the self-moving device to satisfy water-proof requirements of outdoor work.

The following technical solution may further be adopted in embodiments of the present invention: An automatic working system includes a self-moving device moving and working inside a defined working area and an energy module configured to power the self-moving device, where the self-moving device includes:

a body;
a movement module, disposed on the body and configured to drive the self-moving device to move;
a task execution module, disposed on the body and configured to perform a work task; and
a control module, configured to: control the movement module to drive the self-moving device to move, and control the task execution module to perform the work task, where
the energy module is selectively configured to supply power to the self-moving device or another electric tool different from the self-moving device, the self-moving device further includes an accommodating cavity provided with an inlet and configured to accommodate the energy module and a protective cover configured to operably block the inlet, and the self-moving device further includes a temperature protection apparatus configured to perform temperature protection on the energy module.

Further, the temperature protection apparatus includes a thermal insulation body located above the protective cover and/or located between the protective cover and the accommodating cavity.

Further, a thermal insulation space is provided between the thermal insulation body and the protective cover.

Further, the thermal insulation space includes a penetrating through hole located between the thermal insulation body and the protective cover.

Further, the through hole includes a plurality of end openings in communication with the outside and a passage connected to the plurality of end openings.

Further, the thermal insulation body and the protective cover are disposed together to form an upper cover, and the upper cover includes a pivot portion connected to the body to enable the upper cover to be rotatable around the pivot portion to implement opening or closing of the upper cover.

Further, the thermal insulation body and the protective cover are integrally formed or assembled.

Further, the thermal insulation body and the body are disposed together.

Further, the thermal insulation body is a part of the body, the body includes a base and the thermal insulation body extending from the base, the thermal insulation body and the base together define the accommodating cavity, and the thermal insulation body covers the accommodating cavity from above.

Further, the thermal insulation body includes a thermal insulation top wall located above the accommodating cavity and a thermal insulation side wall connecting the thermal insulation top wall and the base.

Further, the self-moving device further includes a drainage system configured to drain water to prevent water from entering the accommodating cavity.

Further, the drainage system includes a water guide groove located on two sides of the thermal insulation side wall and provided with a bottom.

Further, in a horizontal direction, the bottom of the water guide groove extends from the middle of the body to the outside of the body, and in a vertical direction, the bottom of the water guide groove extends from top to bottom.

Further, the protective cover includes a top cover, a lateral protective wall extending toward the left and right sides from the top cover, and a rear protective wall formed extending backward from the top cover, the body includes a side wall accommodating groove configured to accommodate the lateral protective wall, and the water guide groove and the side wall accommodating groove are in communication.

Further, the drainage system further includes a water-stop wall disposed in front of the inlet, and the water-stop wall is located between the protective cover and the thermal insulation body.

Further, the water-stop wall is formed protruding outward from an upper surface of the thermal insulation body, and/or is formed extending from a lower end of the protective cover.

Further, the drainage system includes a drainage groove in communication with the outside of the self-moving device to drain water outside.

Further, the body includes a bearing portion configured to bear the circumference of the protective cover, and the drainage groove is provided in the bearing portion.

Further, the self-moving device further includes a pivot portion configured to connect the protective cover and the body, the protective cover is rotatable around the pivot portion to implement opening or closing, the body further includes a pivot groove accommodating the pivot portion, and the drainage groove includes a pivot portion drainage groove in communication with the pivot groove.

Further, the pivot portion drainage groove includes a drainage hole in communication with the outside and a connecting groove connecting the pivot groove and the drainage hole.

Further, the drainage hole is located below the connecting groove.

Further, the thermal insulation body includes an upper thermal insulation body located above the protective cover and a lower thermal insulation body located between the protective cover and the accommodating cavity.

Further, the upper thermal insulation body and the protective cover are assembled to form an upper cover, and the lower thermal insulation body is disposed on the body and is a part of the body.

Further, the self-moving device further includes an upper thermal insulation space located between the upper thermal insulation body and the protective cover and a lower thermal insulation space located between the protective cover and the lower thermal insulation body.

Further, a height of the upper thermal insulation space in a vertical direction is less than a height of the lower thermal insulation space in the vertical direction.

Further, the upper thermal insulation space includes a through hole, and the through hole includes a plurality of end openings in communication with the outside and a passage in communication with the plurality of end openings.

Further, the lower thermal insulation space is provided with a plurality of water-stop walls configured to stop water.

Further, the temperature protection apparatus includes a temperature adjustment apparatus configured to adjust the temperature of the energy module.

Further, the temperature adjustment apparatus includes at least one of a fan, a heating material, and a cooling material.

Further, the temperature protection apparatus includes a temperature detection module configured to detect the temperature of the energy module and obtain a detection result, and the control module controls a working status of the self-moving device according to the detection result.

Further, the temperature protection apparatus further includes a temperature adjustment apparatus configured to adjust the temperature of the energy module, a temperature range is preset, and when the temperature detection module detects that the temperature of the energy module exceeds the temperature range, the control module controls the temperature adjustment apparatus to adjust the temperature of the energy module.

Further, the self-moving device includes a charging mode and a standby mode, a standby temperature threshold is preset, in the charging mode, the control module controls the self-moving device to be docked to a charging station to perform charging, and when the temperature detection module detects that the temperature of the energy module exceeds the standby temperature threshold, the control module controls the self-moving device to enter the standby mode.

Further, in the standby mode, the energy module stops supplying power to at least some components in the self-moving device to reduce a discharging speed of the energy module.

Further, the temperature adjustment apparatus includes at least one of a fan, a heating material, and a cooling material.

The following technical solution may further be adopted in embodiments of the present invention: A self-moving device powered by an energy module is provided, the self-moving device moving and working inside a defined working area, where the self-moving device includes:

a body;

a movement module, disposed on the body and configured to drive the self-moving device to move;

a task execution module, disposed on the body and configured to perform a work task;

a control module, configured to: control the movement module to drive the self-moving device to move inside a defined area, and control the task execution module to perform the work task; and a self-moving device power supply interface, configured to be electrically connected to the energy module, where the self-moving device power supply interface is the same as a power supply interface of an electric tool different from the self-moving device, to enable the energy module to be selectively configured to supply power to the self-moving device or the electric tool, where the self-moving device includes an accommodating cavity provided with an inlet and a protective cover configured to operably block the inlet, the accommodating cavity is configured to accommodate the self-moving device power supply interface and the energy module, and the self-moving device further includes a temperature protection apparatus configured to perform temperature protection on the energy module.

Further, the self-moving device power supply interface includes at least one of a fast-pluggable self-moving device connector and a wirelessly-rechargeable self-moving device charging interface.

Further, the temperature protection apparatus includes a thermal insulation body located above the protective cover and/or located between the protective cover and the accommodating cavity, and a thermal insulation space is provided between the thermal insulation body and the protective cover.

Further, the thermal insulation space includes a penetrating through hole located between the thermal insulation body and the protective cover, and the through hole includes a plurality of end openings in communication with the outside and a passage connected to the plurality of end openings.

Further, the thermal insulation body is disposed together with at least one of the protective cover and the body.

Further, the temperature protection apparatus includes a temperature adjustment apparatus configured to adjust the temperature of the energy module.

Further, the temperature protection apparatus includes a temperature detection module configured to detect the temperature of the energy module and obtain a detection result, a standby temperature threshold is preset, when the temperature detection module detects that the temperature of the energy module exceeds the standby temperature threshold, the control module controls the self-moving device to enter a standby mode, and in the standby mode, the energy module stops supplying power to at least some components in the self-moving device to reduce a discharging speed of the energy module.

The following technical solution may further be adopted in embodiments of the present invention: A self-moving device powered by an energy module is provided, the self-moving device moving and working inside a defined working area, where the self-moving device includes:

a body;

a movement module, disposed on the body and configured to drive the self-moving device to move;

a task execution module, disposed on the body and configured to perform a work task; and a control module, configured to: control the movement module to drive the self-moving device to move inside a defined area, and control the task execution module to perform the work task, where the self-moving device is powered by the detachable energy module, the self-moving device includes an accommodating cavity provided with an inlet and configured to accommodate the energy module and a protective cover configured to operably block the inlet, and the self-moving device further includes a temperature protection apparatus configured to perform temperature protection on the energy module.

Further, the self-moving device includes a self-moving device power supply interface electrically connected to the energy module, and the self-moving device power supply interface includes at least one of a fast-pluggable self-moving device connector and a wirelessly-rechargeable self-moving device charging interface.

Further, the temperature protection apparatus includes a thermal insulation body located above the protective cover and/or located between the protective cover and the accommodating cavity, and a thermal insulation space is provided between the thermal insulation body and the protective cover.

Further, the thermal insulation space includes a penetrating through hole located between the thermal insulation body and the protective cover, and the through hole includes a plurality of end openings in communication with the outside and a passage connected to the plurality of end openings.

Further, the thermal insulation body is disposed together with at least one of the protective cover and the body.

Further, the temperature protection apparatus includes a temperature adjustment apparatus configured to adjust the temperature of the energy module.

Further, the temperature protection apparatus includes a temperature detection module configured to detect the temperature of the energy module and obtain a detection result, a standby temperature threshold is preset, when the temperature detection module detects that the temperature of the energy module exceeds the standby temperature threshold, the control module controls the self-moving device to enter a standby mode, and in the standby mode, the energy module stops supplying power to at least some components in the self-moving device to reduce a discharging speed of the energy module.

The following technical solution may further be adopted in embodiments of the present invention: An automatic working system includes a self-moving device moving and working inside a defined working area and an energy module configured to power the self-moving device, where the self-moving device includes:

a body;

a movement module, disposed on the body and configured to drive the self-moving device to move;

a task execution module, disposed on the body and configured to perform a work task; and a control module, configured to: control the movement module to drive the self-moving device to move, and control the task execution module to perform the work task, where the energy module is selectively configured to supply power to the self-moving device or another electric tool different from the self-moving device, the self-moving device further includes an accommodating cavity provided with an inlet and configured to accommodate the energy module, and the self-moving device further includes a double-layer thermal insulation structure located above the accommodating cavity.

Further, the double-layer thermal insulation structure includes a protective cover and a thermal insulation body separate from each other and provided with a thermal insulation space.

Further, the protective cover and the thermal insulation body cover the inlet together to stop water from entering the accommodating cavity.

Further, the protective cover is configured to cover the inlet, and the thermal insulation body is located above the protective cover, and/or is located between the protective cover and the accommodating cavity.

The foregoing embodiments of the present invention have the following beneficial effects: A temperature protection apparatus is added to a self-moving device, so that the self-moving device can perform temperature protection when being exposed to harsh outdoor sunlight.

The following technical solution may further be adopted in embodiments of the present invention: An automatic working system includes a self-moving device moving and working inside a defined working area and an energy module supplying power to the self-moving device, where the self-moving device includes:

a body;

a movement module, disposed on the body and configured to drive the self-moving device to move;

a task execution module, disposed on the body and configured to perform a work task; and a control module, configured to: control the movement module to drive the self-moving device to move inside a defined area, and control the task execution module to perform the work task, where the energy module is selectively configured to supply power to the self-moving device or another electric tool different from the self-moving device, the self-moving device includes an accommodating cavity provided with an inlet and configured to accommodate the energy module and a protective cover configured to operably block the inlet, and the self-moving device further includes a reset structure to restore the protective cover that is open to a water-proof state.

Further, the reset structure includes an automatic reset structure to automatically restore the protective cover that is open to the water-proof state.

Further, the self-moving device further includes a pivot portion configured to connect the protective cover and the body, to enable the protective cover to be rotatable around the pivot portion to implement opening or closing of the protective cover.

Further, the automatic reset structure is disposed on the protective cover, the pivot portion includes a rotation center, the protective cover includes a protective cover gravity center, and an angle between a horizontal line and a connecting line between the protective cover gravity center and the rotation center on a side of the inlet is less than 90 degrees.

Further, the automatic reset structure further includes a limit structure configured to limit the position of the protective cover to prevent the protective cover from swinging excessively.

Further, the automatic reset structure further includes a damping apparatus configured to reduce a reset speed of the automatic reset structure.

Further, the damping apparatus is disposed on the pivot portion, and a damping torque generated by the damping apparatus is less than a gravitational torque generated from the gravity of the protective cover.

Further, the automatic reset structure is disposed on the pivot portion.

Further, the automatic reset structure is an elastic apparatus.

The following technical solution may further be adopted in embodiments of the present invention: A self-moving device powered by an energy module is provided, the self-moving device moving and working inside a defined working area, the self-moving device including:
- a body;
- a movement module, disposed on the body and configured to drive the self-moving device to move;
- a task execution module, disposed on the body and configured to perform a work task; and
- a control module, configured to: control the movement module to drive the self-moving device to move inside a defined area, and control the task execution module to perform the work task; and
- a self-moving device power supply interface, configured to be electrically connected to the energy module, and the self-moving device power supply interface is the same as a power supply interface of an electric tool different from the self-moving device, to enable the energy module to be selectively configured to supply power to the self-moving device or the electric tool, where
- the self-moving device includes an accommodating cavity provided with an inlet and a protective cover configured to operably block the inlet, the accommodating cavity is configured to accommodate the self-moving device power supply interface and the energy module, and the self-moving device further includes a reset structure to restore the protective cover that is open to a water-proof state.

Further, the self-moving device power supply interface includes at least one of a fast-pluggable self-moving device connector and a wirelessly-rechargeable self-moving device charging interface.

Further, the reset structure includes an automatic reset structure to automatically restore the protective cover that is open to the water-proof state.

Further, the self-moving device further includes a pivot portion configured to connect the protective cover and the body, to enable the protective cover to be rotatable around the pivot portion to implement opening or closing of the protective cover, the automatic reset structure is disposed on the protective cover, the pivot portion includes a rotation center, the protective cover includes a protective cover gravity center, an angle between a horizontal line and a connecting line between the protective cover gravity center and the rotation center on a side of the inlet is less than 90 degrees, and the automatic reset structure further includes a limit structure configured to limit the position of the protective cover to prevent the protective cover from swinging excessively.

Further, the automatic reset structure further includes a damping apparatus configured to reduce a reset speed of the automatic reset structure, the damping apparatus is disposed on the pivot portion, and a damping torque generated by the damping apparatus is less than a gravitational torque generated from the gravity of the protective cover.

Further, the automatic reset structure is disposed on the pivot portion, and the automatic reset structure is an elastic apparatus.

The following technical solution may further be adopted in embodiments of the present invention: A self-moving device powered by an energy module is provided, the self-moving device moving and working inside a defined working area, where the self-moving device includes:
- a body;
- a movement module, disposed on the body and configured to drive the self-moving device to move;
- a task execution module, disposed on the body and configured to perform a work task; and
- a control module, configured to: control the movement module to drive the self-moving device to move inside a defined area, and control the task execution module to perform the work task, where
- the self-moving device is powered by the detachable energy module, the self-moving device includes an accommodating cavity provided with an inlet and configured to accommodate the energy module and a protective cover configured to operably block the inlet, and the self-moving device further includes a reset structure to restore the protective cover that is open to a water-proof state.

Further, the self-moving device includes a self-moving device power supply interface electrically connected to the energy module, and the self-moving device power supply interface includes at least one of a fast-pluggable self-moving device connector and a wirelessly-rechargeable self-moving device charging interface.

Further, the reset structure includes an automatic reset structure to automatically restore the protective cover that is open to the water-proof state.

Further, the self-moving device further includes a pivot portion configured to connect the protective cover and the body, to enable the protective cover to be rotatable around the pivot portion to implement opening or closing of the protective cover, the automatic reset structure is disposed on the protective cover, the pivot portion includes a rotation center, the protective cover includes a protective cover gravity center, an angle between a horizontal line and a connecting line between the protective cover gravity center and the rotation center on a side of the inlet is less than 90 degrees, and the automatic reset structure further includes a limit structure configured to limit the position of the protective cover to prevent the protective cover from swinging excessively.

Further, the automatic reset structure further includes a damping apparatus configured to reduce a reset speed of the automatic reset structure, the damping apparatus is disposed on the pivot portion, and a damping torque generated by the damping apparatus is less than a gravitational torque generated from the gravity of the protective cover.

Further, the automatic reset structure is disposed on the pivot portion, and the automatic reset structure is an elastic apparatus.

The foregoing embodiments of the present invention have the following beneficial effects: A reset structure is added to a self-moving device, so that a protective cover is automatically restored to a water-proof position, to satisfy water-proof requirements of outdoor work.

BRIEF DESCRIPTION OF THE DRAWINGS

FIG. 28 is a schematic diagram of a temperature adjustment apparatus being disposed in a battery interface according to an embodiment of the present invention.

FIG. 29 is a schematic diagram of a fan and a heat dissipation hole being provided in a battery interface according to an embodiment of the present invention.

DETAILED DESCRIPTION

To make the objectives, technical solutions, and advantages of embodiments of the present invention more comprehensible, the present invention is further described in detail below with reference to the accompanying drawings and the embodiments. It should be understood that the described specific embodiments are only used to explain embodiments of the present invention rather than to limit embodiments of the present invention. "Exposure" in embodiments of the present invention includes "partial exposure". "A plurality of" in embodiments of the present invention includes "one or more".

Figure 1:
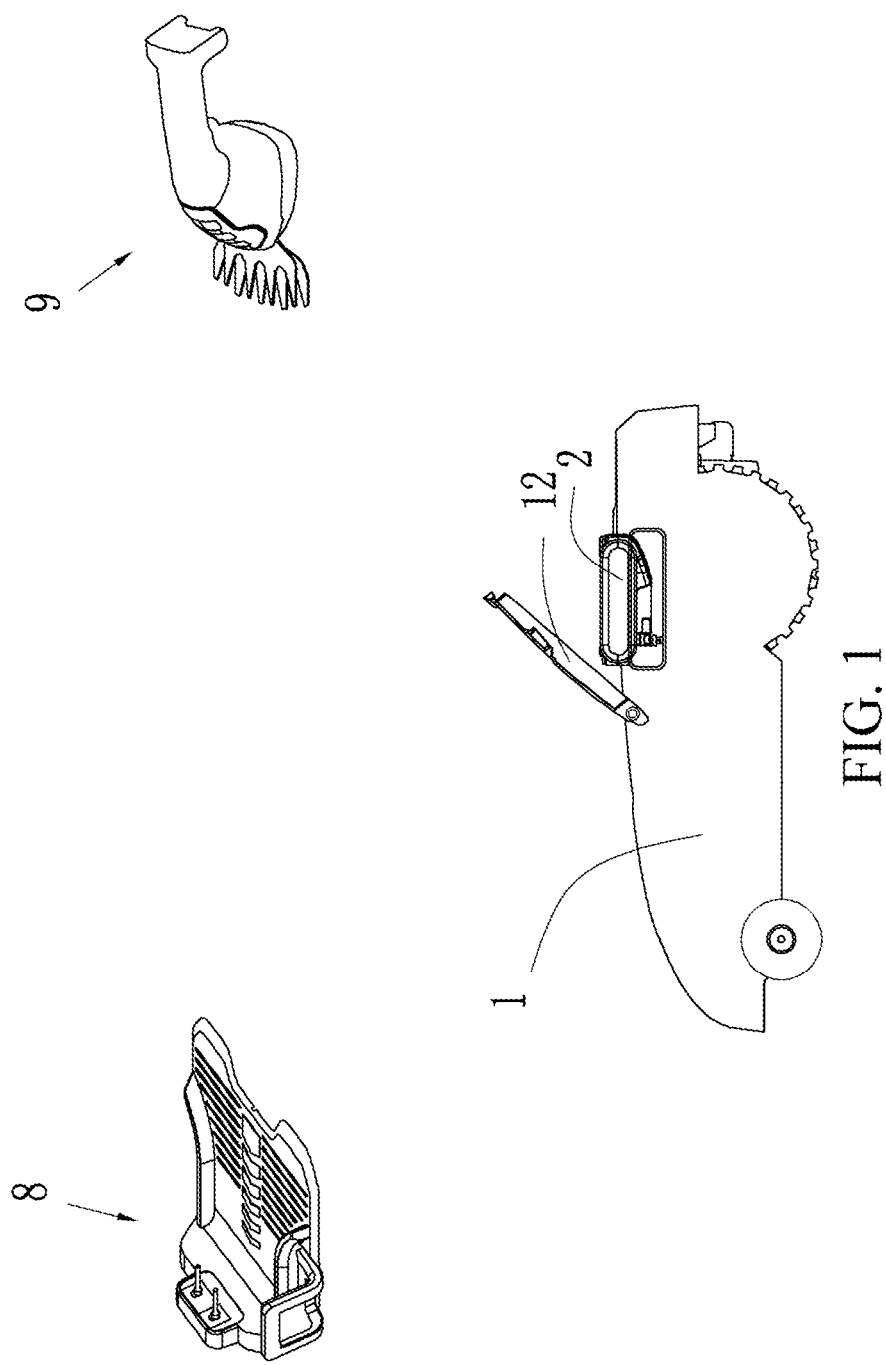
FIG. 1 is a schematic diagram of an automatic working system according to an embodiment of the present invention.

As shown in FIG. 1, embodiments of the present invention provides an automatic working system 100. The automatic working system 100 includes a self-moving device 1, a charging station 8, an electric tool 9, and at least one energy module 2. The energy module 2 is selectively configured to supply power to the self-moving device 1 or the electric tool 9. In other words, a user may selectively use the energy module 2 in the self-moving device 1 or the electric tool 9 to supply power to the corresponding self-moving device 1 or the electric tool 9. Further, the self-moving device 1 includes a charging system. The charging system is configured to store external electrical energy in the energy module 2. The energy module 2 may store the external electrical energy in the energy module 2 by using the self-moving device 1. A source of the external electrical energy may be conventional utility power or may be electrical energy converted from solar energy or may be electrical energy converted from wind energy or the like. In this embodiment, the self-moving device 1 is an automatic mower. In other embodiments, the self-moving device may be an automatic leaf blower, an automatic water sprinkler, a multifunctional machine, a robot cleaner or the like. The electric tool 9 is an electric tool other than the self-moving device 1, and is, for example, a gun drill, a hammer drill, a trimmer or a hand-propelled lawnmower that is powered by a detachable battery pack. In another embodiment, the energy module 2 may further be selectively configured to supply power to another electric device, for example, a home appliance. The electric device is an electric device other than the self-moving device 1. The electric tool 9, the home appliance, and the like may be generally referred to as an electric device.

In an embodiment, the automatic working system 100 further includes a guide wire. The self-moving device 1 further includes a guide wire detection module (not shown). The guide wire detection module includes at least one guide wire detection sensor, configured to detect a position relationship between the self-moving device and the guide wire. The position relationship between the self-moving device and the guide wire includes the self-moving device being located on either side of the guide wire, a distance between the self-moving device and the guide wire or the like. In this embodiment, the guide wire includes a boundary wire defining a working area of the self-moving device. In other embodiments, the guide wire may be a lead wire arranged in the working area, is guided out from the position of a stop, and is configured to guide the self-moving device to move toward the stop. Certainly, the guide wire may be a physical boundary formed by a fence or the like, a physical boundary formed between a lawn and a non-lawn or the like. Correspondingly, the guide wire detection sensor may be a camera, a capacitance sensor or the like. In other embodiments, there may be no guide wire, and correspondingly, the working area of the self-moving device is directly controlled by using a capacitance sensor, Global Positioning System (GPS) positioning or the like. In the foregoing embodiment, when the guide wire is a boundary wire, the boundary wire usually needs to be powered. In an embodiment, the boundary wire is connected to the charging station and is charged by using alternating current (AC) power. In another embodiment, the automatic working system may be directly powered by the energy module 2 instead of being powered by AC power.

As shown in FIG. 1 to FIG. 8, the self-moving device 1 includes a body 10. The energy module 2 is detachably assembled on the body 10. "Detachably means that the energy module 2 can be directly detached without needing to remove a fastener such as a screw, a nut or a pin. For example, the energy module 2 and the self-moving device 1 are docked by a connector, a wireless charging interface or the like, so that the energy module 2 and the self-moving device 1 can be conveniently undocked, to implement fast insertion of the energy module 2. Certainly, in other embodiments, a protective cover or the like fastened to the body 10 may be disposed outside the energy module 2, or even the protective cover and the body are fastened by a fastener such as a screw, a nut or a pin. The energy module 2 is "detachable" provided that fast insertion of the energy module 2 in the self-moving device 1 can be implemented. The self-moving device 1 includes a housing 3, a movement module 4 configured to drive the self-moving device 1 to move, a task execution module configured to perform a work task, a power module configured to supply power to the movement module 4 and the task execution module, and a control module 7 configured to: control the movement module 4 to drive the self-moving device 1 to move inside the defined working area, and control the task execution module to perform the work task, and the like. The movement module 4, the task execution module, the control module 7, and the like are all disposed on the housing 3 to form the body 10. In this embodiment, the self-moving device 1 is an automatic mower. The task execution module is a cutting module 5 performing a mowing task. The power module includes a cutting motor configured to drive the cutting module 5 and a walking motor configured to drive the movement module. In other embodiments, the task execution module may be a task execution module performing another work task. For example, when the self-moving device is an automatic snowplow, the task execution module of the self-moving device is a snow removal module. In this embodiment, the control module 7 is electrically connected to the movement module 4, the cutting module 5, the energy module 2, and the like, to control the movement module 4 to drive the self-moving device 1 to move, and control the cutting module 5 to perform a mowing task.

Figure 8:
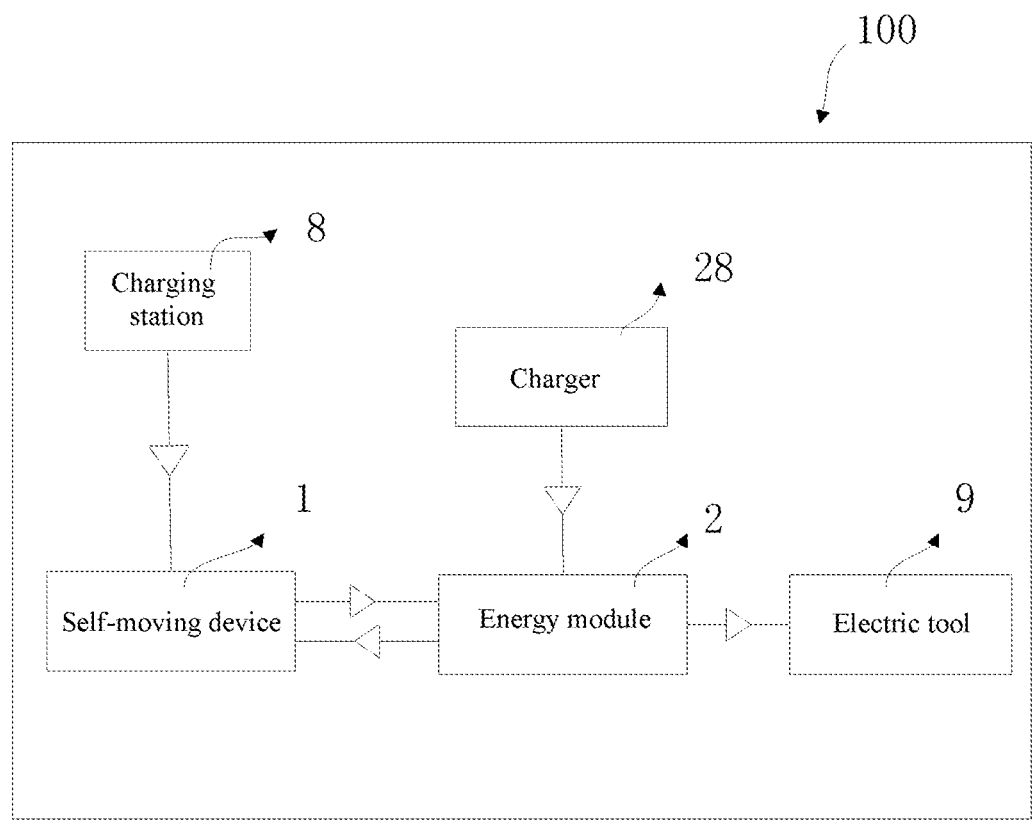
FIG. 8 is a system schematic diagram of an automatic working system according to an embodiment of the present invention.
Figure 9:
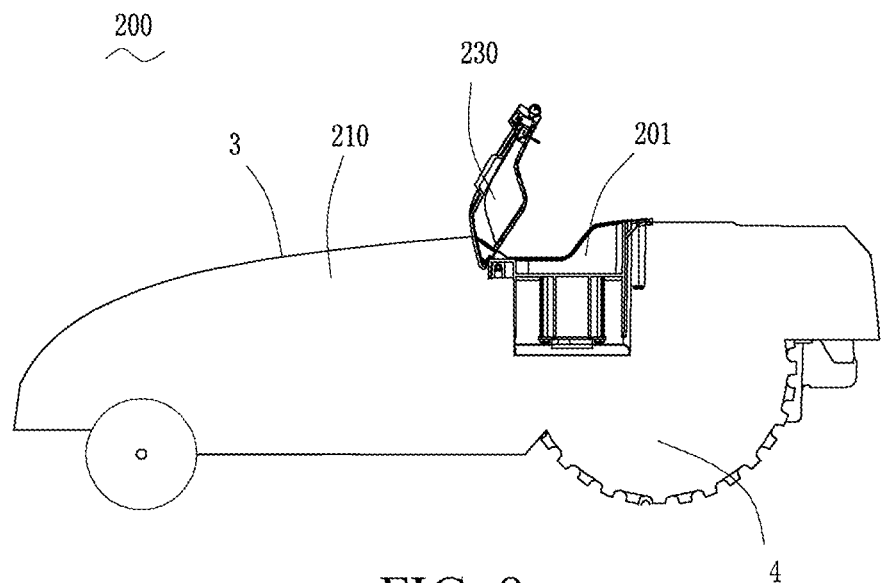
FIG. 9 is a front view of a self-moving device in which an energy module is not mounted according to an embodiment of the present invention.
Figure 10:
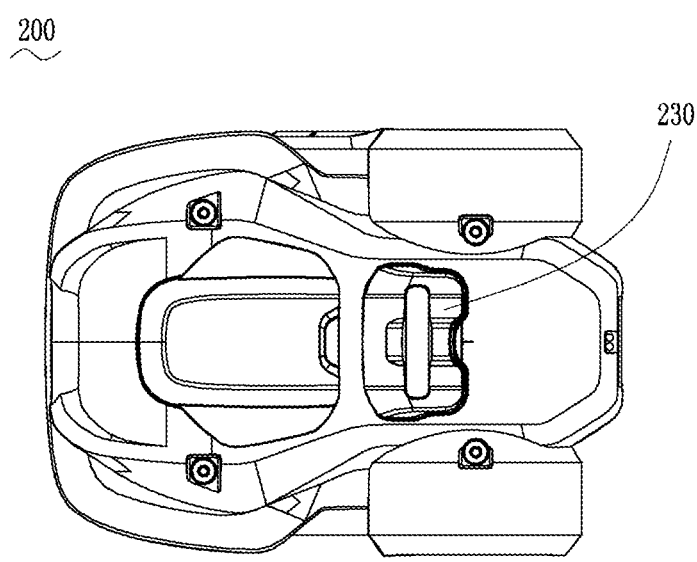
FIG. 10 is a top view of a self-moving device when an accommodating cavity is disposed above the self-moving device according to an embodiment of the present invention.

As shown in FIG. 8, the energy module 2 can supply energy for the self-moving device 1 to move and work, whereas the self-moving device 1 can be used as a charger for charging the energy module 2. The energy module 2 may be directly detached and separately taken back to the charging station to perform charging or another charging site such as a user's home to perform charging.

Specifically, in an embodiment, a threshold is preset. When the electrical energy in the energy module 2 is less than a threshold, the control module 7 controls the self-moving device 1 to move to the stop along the boundary wire, to implement that the self-moving device 1 returns to the charging station 8 to charge the energy module 2. As the control module 7 controls the self-moving device 1 to move to the stop along the boundary wire, the self-moving device 1 is controlled to change the distance between the self-moving device 1 and the boundary wire, the self-moving device 1 is then controlled to move by at least one first preset distance in a movement direction parallel to the boundary wire, and the foregoing steps are repeated, to implement that the control module 7 controls the self-moving device 1 to return to the charging station. In other embodiments, the self-moving device 1 may return to the charging station in other manners. In other embodiments, the self-moving device 1 may preset time or another parameter. When the specified time or the specified another parameter is reached, the control module 7 controls the self-moving device 1 to automatically return to the charging station 8 to perform charging.

In another embodiment, when the electrical energy in the energy module 2 is less than an electrical energy threshold, the self-moving device reminds a user in a human-computer interaction manner such as light or sound. The user replaces the energy module 2 with another spare energy module and takes away the current energy module to perform charging. In other embodiments, the current energy module 2 is directly taken away to perform charging instead of being replaced. After being fully charged, the energy module 2 is then mounted on the self-moving device.

In an embodiment of the present invention, the energy module 2 on the self-moving device 1 may be used as an energy module 2 that belongs to the self-moving device 1 to supply power to the self-moving device 1. The energy module 2 may also be used as a movable energy platform that supplies power to an electric tool such as a gun drill, a hammer drill, a trimmer or a hand-propelled lawnmower. Specifically, the energy module 2 may be directly completely or partially detached and used on the electric tool as the energy module of the electric tool to supply electrical energy to the electric tool.

In an embodiment, in the self-moving device 1, after being fully charged, the energy module 2 can be directly detached and used as the energy module 2 of the electric tool 9 to supply power to the electric tool 9. In another embodiment, the self-moving device 1 includes a plurality of energy modules 2. As the self-moving device 1 performs a mowing task, one energy module 2 supplies power to the self-moving device 1 to keep normal working of the self-moving device 1, and another energy module 2 supplies power to the electric tool 9. In another embodiment, the energy module 2 may separately supply power to only the self-moving device 1. Specifically, the automatic working system includes at least one energy module 2. Each energy module 2 includes at least one battery pack 21. Each battery pack includes at least one battery group. A plurality of battery groups are adapted through series and parallel connection to adjust a battery voltage to a required voltage. In FIG. 3 to FIG. 6, for example, one energy module 2 includes one battery pack 21. Each energy module 2 may separately supply power to the self-moving device 1 or may be separately configured to supply power to the electric tool. In other embodiments, each energy module 2 may include a plurality of battery packs. The plurality of battery packs are combined to supply power to the self-moving device 1, or the plurality of battery packs are combined to supply power to the electric tool.

As shown in FIG. 3 to FIG. 6, the automatic working system 100 includes a plurality of energy modules 2. Each energy module 2 includes one battery pack. In an optimal embodiment, each battery pack has a voltage value of 20 V. That is, the automatic working system 100 includes a plurality of battery packs having a voltage value of 20 V. A voltage value such as 20 V discussed in this embodiment means that a full voltage is approximately 20 V (including a value of 20 V and a value of approximately 20 V). Different models of batteries, batteries with different specifications, differently aged batteries, and the like all have different full voltages. Therefore, in the industry, a full voltage of approximately 20 V is generally referred to as a voltage value of 20 V. For example, the full voltage of a ternary lithium battery used in an electric tool is usually 4.2 V. Generally, the ternary lithium battery usually has a nominal voltage of 3.6 V. A voltage value of such a ternary lithium battery is generally referred to as a voltage value of 4 V. The full voltage is a charging cut-off voltage in standard charge. For a cell, a nominal voltage is a nominal voltage in a cell specification. Specifically, the battery packs having a voltage value of 20 V may be formed in different manners. For example, the battery packs that are formed in different manners such as xS1P, xS2P, and xSnP are referred to as different types of battery packs. xS1P means that x (a plurality of) batteries are connected in series. For example, a 5S1P battery pack having a voltage value of 20 V includes five 4-V batteries connected in series. xS2P means that x battery assemblies are connected in series and each battery assembly includes two batteries connected in parallel. For example, a 5S2P battery pack having a voltage value of 20 V has ten batteries, where two batteries are connected in parallel to form one battery assembly and five battery assemblies are connected in series. xSnP means that x battery assemblies are connected in series and each battery assembly includes n (where n is not less than 3) batteries connected in parallel. For example, a 5SnP battery pack having a voltage value of 20 V has 5*n batteries, where n batteries are connected in parallel to form one battery assembly and five battery assemblies are connected in series. A battery in the battery pack usually contains lithium ions, magnesium ions, aluminum ions or a similar chemical substance. Specifically, the 4-V battery may be a lithium ion battery with a specification model of 18650, 21700 or the like. In a specific embodiment, any of the xS1P 20-V battery pack, the xS2P 20-V battery pack, and the xSnP 20-V battery pack may be separately configured to supply power to the self-moving device 1 or the electric tool 9. Specifically, one battery pack of one type may be separately configured to supply power, or a plurality of battery packs of one same type may be configured together to supply power. In other embodiments, a plurality of 20-V battery packs of more than two types (including two types) may be configured together to supply power to the self-moving device 1 or the electric tool 9. The more than two types of 20-V battery packs are any two or more types of the xS1P 20-V battery pack, the xS2P 20-V battery pack, and the xSnP 20-V battery pack. Correspondingly, each of the self-moving device 1 and the electric tool 9 is separately provided with a plurality of battery accommodating portions accommodating corresponding 20-V battery packs. The battery accommodating portion includes an accommodating cavity 101 accommodating the energy module 2 and a wall portion surrounding the accommodating cavity 101.

In the foregoing embodiment, the automatic working system 100 includes a plurality of battery packs having a voltage value of 20 V. Correspondingly, each of the self-moving device 1 and the electric tool 9 includes a plurality of (including one) accommodating cavities 101 accommodating the battery packs. Any of the xS1P 20-V battery pack, the xS2P 20-V battery pack, and the xSnP 20-V battery pack that is inserted in one accommodating cavity 101 of the self-moving device 1 or the electric tool 9 can supply power to the corresponding self-moving device 1 or the electric tool 9. A plurality of battery packs of different types that are inserted in the self-moving device 1 or the electric tool 9 can also supply power to the corresponding self-moving device 1 or the electric tool 9. Correspondingly, any 20-V battery pack that is detached from the self-moving device 1 and is inserted in any accommodating cavity of the electric tool 9 can supply power to the electric tool 9. A plurality of 20-V battery packs of the same type or different types that are detached together and inserted in the plurality of accommodating cavities of the electric tool 9 can also supply power to the electric tool 9.

Specifically, in an embodiment, the automatic working system 100 includes a plurality of battery packs having a voltage value of 20 V. The plurality of battery packs having a voltage value of 20 V may be connected in parallel to still implement a total output voltage of 20 V. In an embodiment, the automatic working system 100 includes two battery packs having a voltage value of 20 V. The two battery packs having a voltage value of 20 V are connected in parallel to still implement a total output voltage of 20 V.

Figure 5:
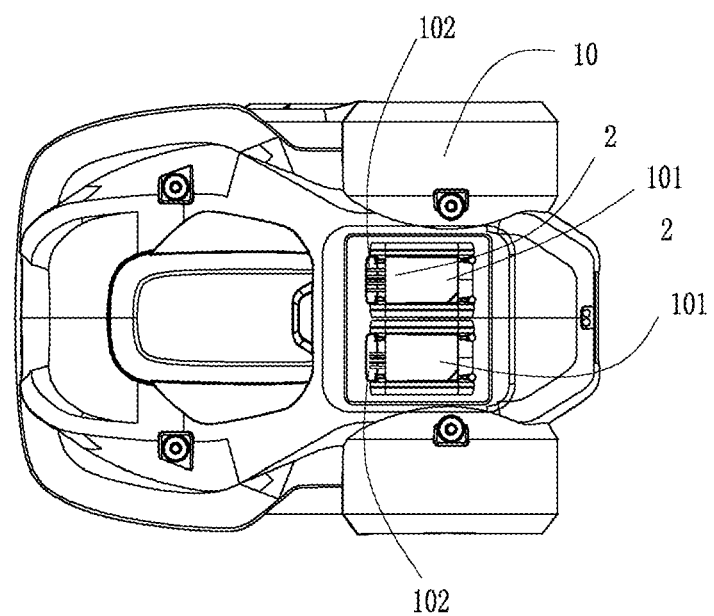
FIG. 5 is a top view of a self-moving device assembled with two energy modules according to an embodiment of the present invention.
Figure 6:
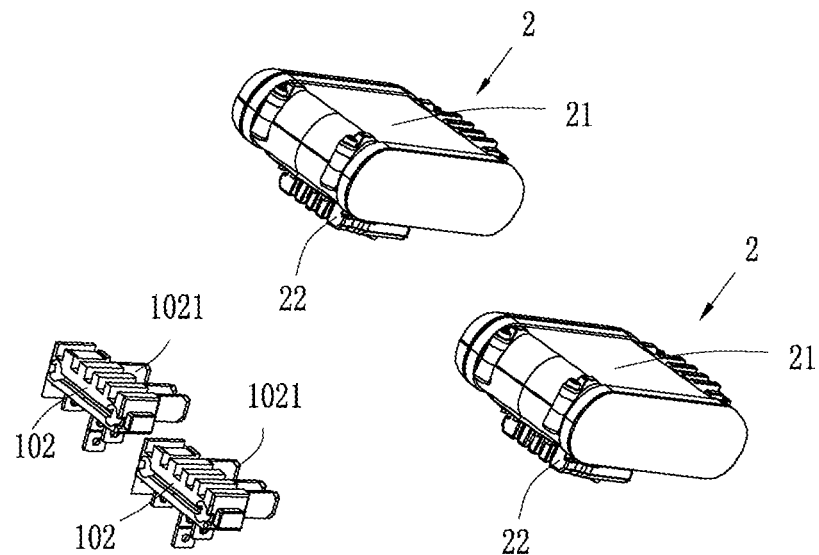
FIG. 6 is a three-dimensional view before a self-moving device connector and the energy modules in the self-moving device shown in FIG. 5 are assembled.

As shown in FIG. 3 to FIG. 6, the self-moving device 1 includes a battery accommodating portion that accommodates the energy module 2 and is provided with the accommodating cavity 101. The accommodating cavity 101 is in communication with an external space. The external space is a space outside the body. The energy module 2 is exposed from the body 10. Specifically, the body 10 is provided with at least one accommodating cavity 101 and a self-moving device connector 102 accommodated inside the accommodating cavity 101. Each energy module 2 includes at least one battery pack 21 and an energy module connector 22 docked to the self-moving device connector 102. The self-moving device connector 102 and the energy module connector 22 are fast-pluggable connectors, to implement fast insertion of the energy module 2. Specifically, when the self-moving device 1 has a plurality of energy modules 2, as shown in FIG. 5, the energy modules 2 may be accumulated and inserted in one same accommodating cavity 101. When the plurality of energy modules 2 are inserted in one same accommodating cavity 101, the structure of the accommodating cavity 101 may be adapted according to the structure of the energy module 2. For example, when each energy module 2 is one battery pack and each battery pack is provided with one energy module connector 22, a corresponding quantity of self-moving device connectors 102 is provided inside the accommodating cavity 101 to fit the energy module connector 22 of each battery pack. Specifically, the self-moving device connector 102 may be, as shown in FIG. 5 and FIG. 6, transversely disposed on a side of the accommodating cavity 101 or disposed in another position according to an actual case. As shown in FIG. 11, FIG. 13, FIG. 14, and FIG. 17, the self-moving device connector 102 is vertically disposed in the middle of the accommodating cavity 101. When there are a plurality of battery packs, a plurality of self-moving device connectors 102 are correspondingly disposed. The self-moving device connector 102 may be disposed as movable or detachable. For example, three movable self-moving device connectors 102 are disposed in the accommodating cavity 101 in advance. If three battery packs with different sizes need to be inserted in the accommodating cavity 101, the positions of corresponding self-moving device connectors 102 may be changed according to the sizes of the battery packs to enable each battery pack to be docked to each corresponding self-moving device connector 102. If only two battery packs need to be inserted in the accommodating cavity 101, one of the self-moving device connectors 102 may be detached or left vacant, and the positions of the two remaining self-moving device connectors 102 are changed for docking to corresponding battery packs. In this embodiment, the self-moving device connector 102 may be directly docked to the energy module connector 22. The electric tool 9 also includes an electric tool docking connector configured for docking to the energy module 2. The electric tool docking connector is also a fast-pluggable connector. The self-moving device connector 102 is the same as an electric tool connector, to enable the energy module 2 to be directly selectively configured to supply power to the self-moving device 1 or the electric tool 9.

In other embodiments, the energy modules 2 may be separately arranged. The energy modules 2 are arranged in different positions of the body 10 of the self-moving device 1. The body 10 is provided with a plurality of accommodating cavities 101 corresponding to the energy modules 2. Each energy module 2 is accommodated inside a corresponding accommodating cavity 101. Specifically, when one energy module 2 has a plurality of battery packs, in an embodiment, the plurality of battery packs 21 are directly accommodated inside one same accommodating cavity 101 and are used as one entire energy module. In this case, the energy module connector 22 is disposed on the battery packs 21. In another embodiment, the energy module 2 may be provided with one carrier. The carrier is provided with a plurality of inner interfaces accommodating the battery packs and an outer interface for docking to the accommodating cavity. The plurality of battery packs are assembled in the inner interfaces of the carrier. The carrier assembled with the plurality of battery packs is used as the entire energy module and is accommodated inside the accommodating cavity. In this case, the outer interface is provided with the energy module connector for docking to the self-moving device connector. In the foregoing embodiment, a conventional wired charging technology is used to perform charging between the self-moving device 1 and the energy module 2. In other embodiments, a wireless charging technology may be used to perform charging between the self-moving device 1 and the energy module 2.

In the foregoing embodiment, the self-moving device connector in the wired charging technical solution and the charging interface corresponding to the self-moving device in the wireless charging technical solution may be generally referred to as a self-moving device power supply interface. The energy module connector in the wired charging technical solution and the charging interface corresponding to the energy module in the wireless charging technology may be generally referred to as an energy module interface. In an embodiment, the self-moving device connector and the energy module connector in the wired charging technical solution are both fast-pluggable connectors, to implement fast insertion of the energy module 2 into and fast detachment of the energy module 2 from the self-moving device 1. In the foregoing embodiment, the self-moving device power supply interface and the energy module interface are docked in the form of a connector to complete energy transmission, or fit in the form of wireless charging to complete energy transmission, or fit in another manner to complete energy transmission. These manners can be generally referred to as that the self-moving device power supply interface is electrically connected to the energy module interface. Correspondingly, the electric tool is also provided with an electric tool power supply interface. The energy module interface and the electric tool power supply interface fit in the foregoing manners to complete energy transmission. These manners are also referred to as that the energy module interface is electrically connected to the electric tool power supply interface. The energy module interface may be electrically connected to the electric tool power supply interface to supply power to the electric tool. In a specific embodiment, the energy module interface may be electrically connected to the electric tool power supply interface by a connector. For example, the energy module interface is the energy module connector shown in FIG. 3 to FIG. 6. In an embodiment, the electric tool power supply interface is an electric tool connector that fits and is docked to the energy module connector. In other embodiments, the electric tool connector and the energy module connector may be joined by a conversion member.

In an embodiment, the self-moving device 1 includes a self-moving device power supply interface that is directly docked to the energy module 2. The electric tool 9 includes an electric tool power supply interface that is directly docked to the energy module 2. The self-moving device power supply interface is the same as the electric tool power supply interface, so that the energy module 2 can be directly docked to the electric tool 9 or directly docked to the self-moving device 1 without using any conversion member, to implement that the energy module 2 can be directly selectively configured to supply power to the self-moving device 1 or the electric tool 9. As shown in FIG. 3 to FIG. 6, the self-moving device connector 102 includes a plurality of first terminals 1021 disposed inside the accommodating cavity 101. The energy module connector 22 includes a plurality of second terminals (not shown) assembled on the battery pack 21. In the embodiments shown in FIG. 3 and FIG. 6, the self-moving device connector 102 and the energy module connector 22 are docking connectors of each other and fit each other for docking. The first terminals 1021 are docked to the second terminals to complete an electrical connection.

Figure 7:
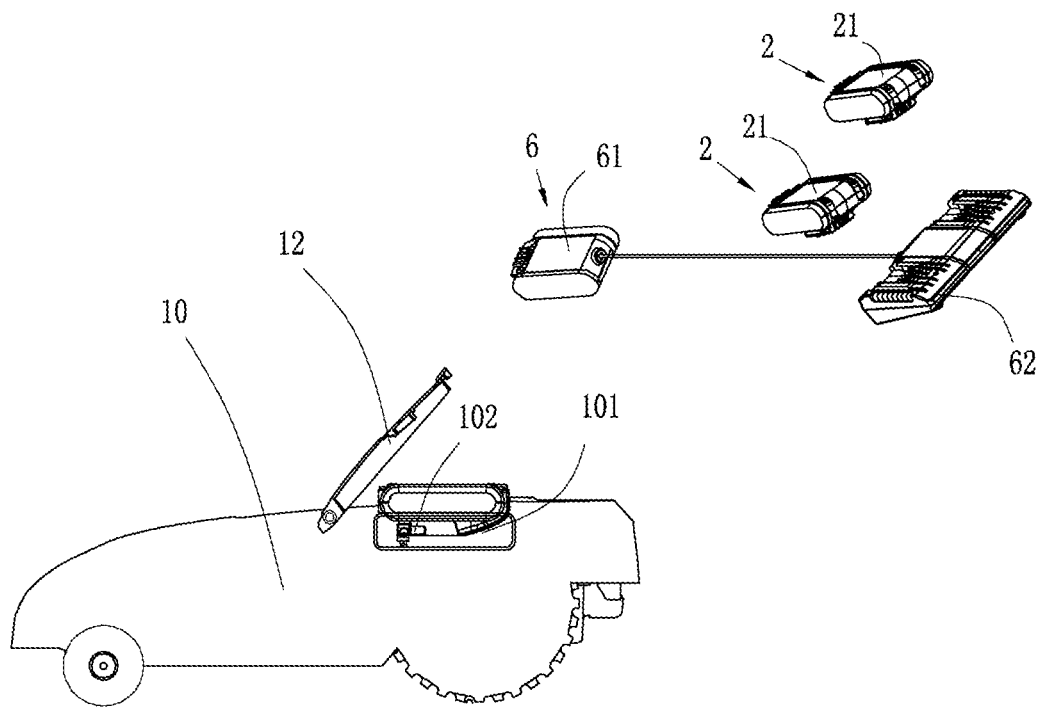
FIG. 7 is a three-dimensional view when a self-moving device, an interface adapter, and an energy module are not assembled according to an embodiment of the present invention.

Certainly, in other embodiments, the self-moving device power supply interface may be different from the electric tool power supply interface, but instead a conversion member is used for conversion, to implement that the energy module is selectively configured to supply power to the self-moving device or the electric tool. For example, as shown in FIG. 7, the self-moving device connector 102 may be electrically connected to the energy module connector 22 by an interface adapter 6. Specifically, the automatic working system further includes at least one interface adapter 6. The interface adapter 6 includes at least two groups of conversion interfaces. A group of conversion interfaces 61 are docked to at least one self-moving device connector 102, and another group of conversion interfaces 62 are docked to at least one energy module connector 22. The conversion interface 62 docked to the energy module connector 22 is the same as the electric tool power supply interface, to implement that the energy module can be selectively configured to supply power to the self-moving device 1 or the electric tool 9 by means of the conversion of a conversion interface. The interface adapter is not limited to the interface adapter with a cable shown in FIG. 7, and may be another type of interface adapter. The interface adapter may have no cable, provided that two groups of conversion interfaces are provided. The interface adapter may be a converter for various types of battery packs, and different batteries can be plugged when different converters are mounted. In the embodiment shown in FIG. 7, the interface adapter 6 and the energy module 2 may be generally referred to as a new energy module. The conversion interface 61, electrically connected to the self-moving device connector 102, of the interface adapter 6 may be referred to as a new energy module connector.

Figure 2:
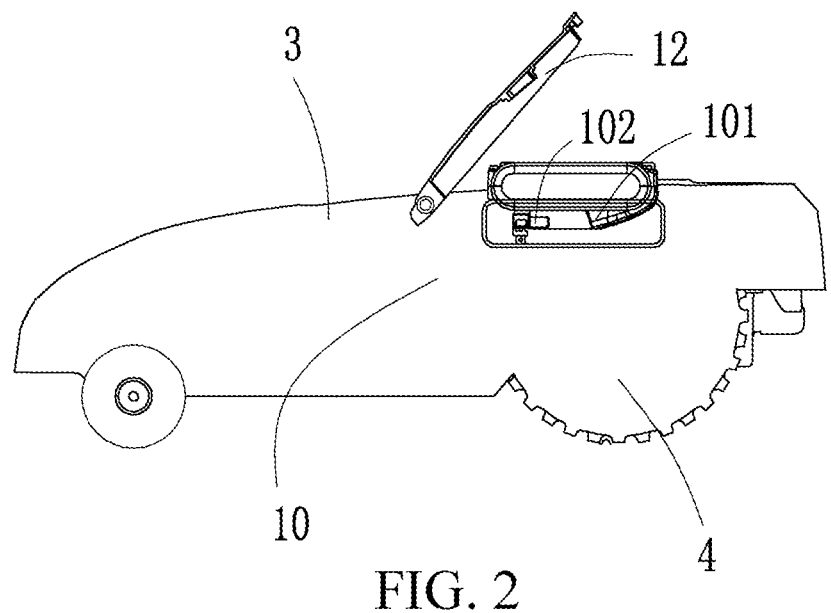
FIG. 2 is a front view of a self-moving device having an accommodating cavity according to an embodiment of the present invention.
Figure 3:
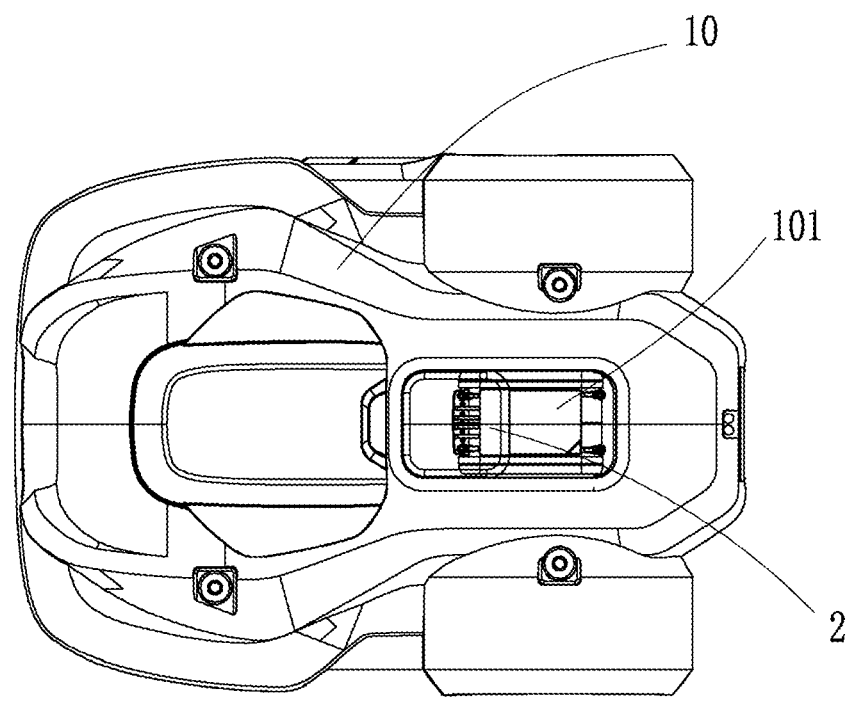
FIG. 3 is a top view when the self-moving device shown in FIG. 2 is assembled with an energy module.
Figure 4:
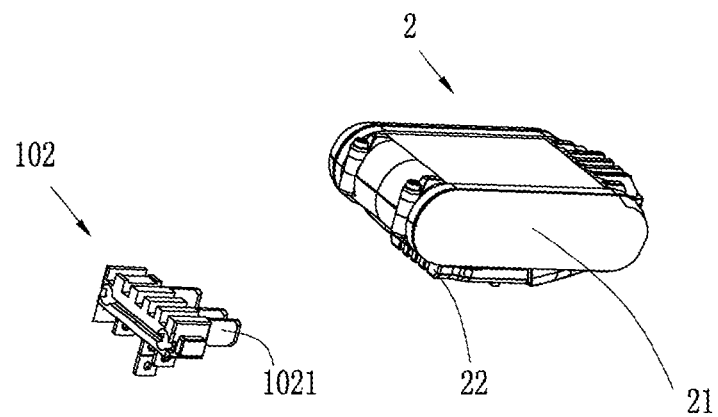
FIG. 4 is a three-dimensional view before a self-moving device connector and the energy module in the self-moving device shown in FIG. 3 are assembled.

In an embodiment, as shown in FIG. 1, FIG. 2, and FIG. 7, the self-moving device 1 further includes a protection apparatus 12 disposed on the body 10 and wrapping the energy module 2. The protection apparatus 12 is mainly configured for a water-proof purpose, a moist-proof purpose, a sun-proof purpose, and the like. In other embodiments, alternatively, the protection apparatus 12 may be configured for only one or more of the water-proof purpose, the moist-proof purpose, the sun-proof purpose, and the like. For example, the protection apparatus 12 may be only a rain-proof cover to prevent rainwater from reaching the energy module 2, the self-moving device connector 102 on the accommodating cavity 101 or other circuits to cause circuit damage.

Specifically, in an embodiment, the protection apparatus 12 may be assembled on the body 10. Only one end of the protection apparatus 12 may be fastened to the body 10, and the other end is not fastened. In another embodiment, both ends of the protection apparatus 12 may be fastened. For fastening manners, one end of the protection apparatus 12 is nondetachably fastened, and the other end of the protection apparatus 12 is detachably fastened, or both ends of the protection apparatus 12 are detachably fastened. "Detachable fastening" means that the protection apparatus 12 can be detached from the body 10 without a damaging act and without needing to detach a fastener such as a screw, and after being detached, the protection apparatus 12 can be fastened to the body 10 again. For example, a buckle is used. In contrast, "nondetachable fastening" means that the protection apparatus 12 can be detached from the body 10 only by using a damaging act or detaching a fastener such as a screw. For example, a nondetachable rotating shaft is used for fastening. In another embodiment, both ends of the protection apparatus 12 may be fastened, and both ends of the protection apparatus 12 are nondetachably fastened to the body 10. Specifically, the protection apparatus 12 and the body 10 define one accommodating cavity. The energy module 2 is completely accommodated inside the accommodating cavity to implement protection. One inlet for the energy module 2 to pass through may be kept nearby the accommodating cavity to pull out or mount the energy module 2. Certainly, in other embodiments, both ends of the protection apparatus 12 may be disposed on the body 10 in an unfastened manner, provided that the protection apparatus 12 can protect the accommodating cavity 101 and electrical components therein and the energy module 2.

In the foregoing embodiment, the energy module 2 and the protection apparatus 12 wrapping the energy module 2 may be disposed in different positions of the body 10 according to actual cases. For example, the energy module 2 and the protection apparatus 12 are disposed below the body 10 to reduce environmental impact from rain, sunlight, and the like, or are disposed above the body 10 to make it convenient to mount and remove the energy module, or are disposed behind, in front of or on a side of the body 10 to reduce exposure to rain and sunlight and facilitate mounting and removal. Certainly, the effects corresponding to different positions of the energy module 2 and the protection apparatus 12 are analyzed according to specific scenarios and cases. Only examples are provided in the foregoing.

In this embodiment, because the self-moving device 1 is in an outdoor working environment and is often exposed to severe weather such as rain, the energy module 2 is usually watertightly disposed below the self-moving device 1 to prevent rainwater from entering the accommodating cavity 101, so as not to damage the energy module 2 and other electrical structures in the accommodating cavity 101. However, in this embodiment, the energy module 2 is selectively configured to supply power to another electric tool 9. If the energy module 2 is watertightly disposed below the self-moving device 1, it is not convenient for a user to rapidly fetch and mount the energy module 2, resulting in poor user experience. Therefore, it is necessary to design a self-moving device that facilitates rapid fetching and mounting of the energy module 2 by the user and has a desirable water-proof effect.

Figure 11:
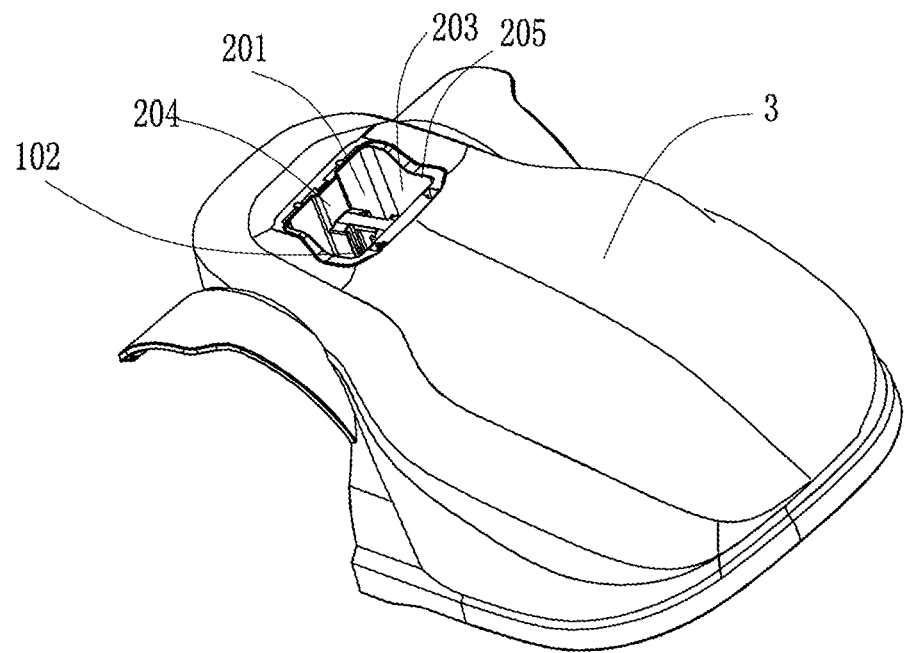
FIG. 11 is a schematic diagram of a housing of the self-moving device shown in FIG. 9.
Figure 12:
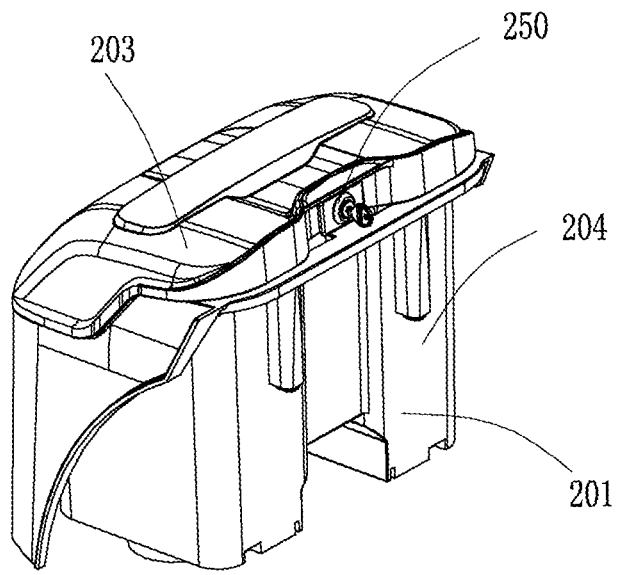
FIG. 12 is a three-dimensional view of an accommodating cavity and a protective cover according to an embodiment of the present invention.
Figure 13:
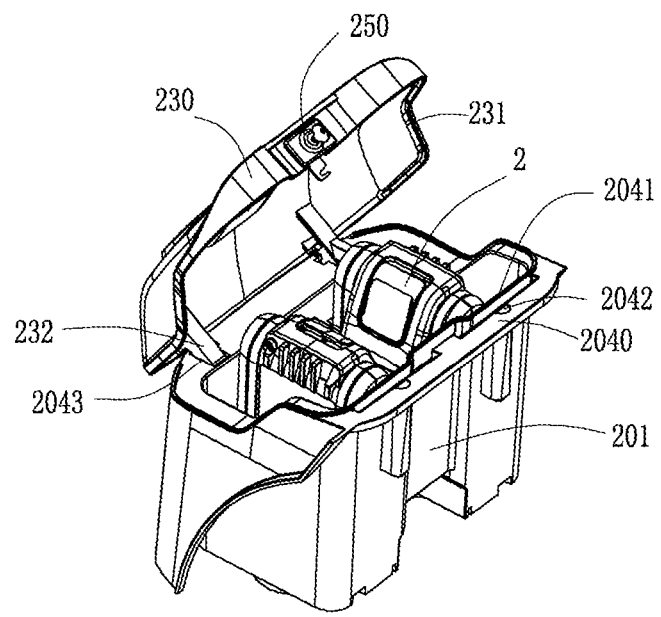
FIG. 13 is a three-dimensional view when the protective cover shown in FIG. 12 is open.
Figure 14:
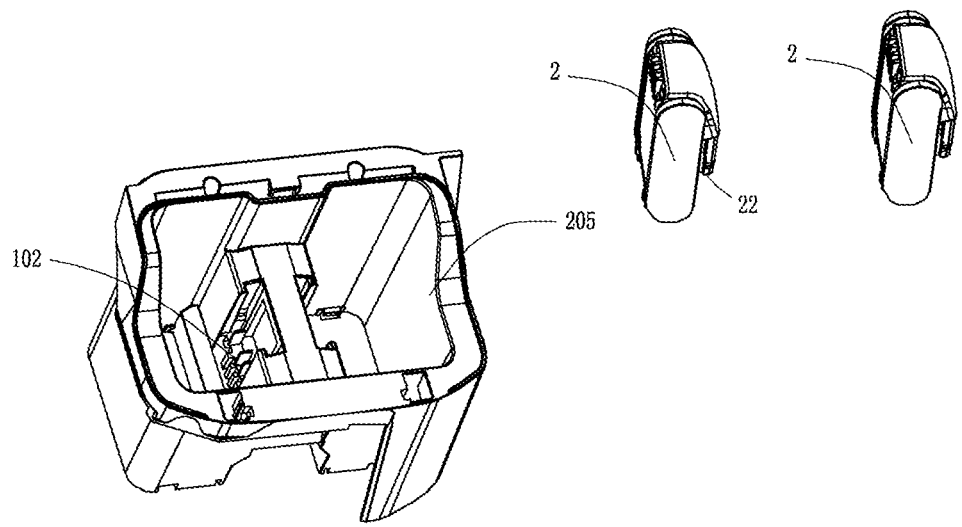
FIG. 14 is a three-dimensional view when the accommodating cavity shown in FIG. 13 and an energy module are not assembled.

To achieve an adequate water-proof effect, the positions and specific structures of the battery accommodating portion of the self-moving device 1 and the protection apparatus thereof may be configured according to a specific case. For example, in a specific embodiment, as shown in FIG. 9 to FIG. 14, a self-moving device 200 further includes a protection apparatus blocking a battery accommodating portion 201. In this embodiment, the protection apparatus is a protective cover 230 assembled on a body 210. In other embodiments, the protection apparatus may be a part of the body 210. Specifically, the protection apparatus may be a part of the housing 3. The protection apparatus is directly formed extending outward from a part of the housing 3. The protection apparatus blocks the battery accommodating portion 201, to prevent rainwater from entering the battery accommodating portion 201 or sunlight from scorching the battery accommodating portion 201. As shown in FIG. 9 to FIG. 14, in this embodiment, the battery accommodating portion 201 includes an accommodating cavity 203 accommodating the energy module 2, a wall portion 204 surrounding the accommodating cavity 203, and the self-moving device connector 102 accommodated inside the accommodating cavity 203 and docked to the energy module 2. The energy module 2 is provided with the energy module connector 22 docked to the self-moving device connector 102. The accommodating cavity 203 includes an inlet 205 in communication with the outside. The protective cover 230 operably blocks the inlet 205. Specifically, the "operably" means that the protective cover 230 may be operated to block the inlet 205. For example, the protective cover 230 may be assembled open on the body 210. When the protective cover 230 is not open (closed), the protective cover 230 blocks the inlet 205, to prevent rain water or sunlight from damaging a circuit inside the accommodating cavity 203 or the energy module 2. In this embodiment, the protective cover 230 completely covers the inlet. In an optimal embodiment, a seal ring may be added at the position in which the protective cover 230 is docked to the wall portion 204 to enhance sealing and improve water-proof performance. As shown in FIG. 13, in this embodiment, an upper end surface 2040 of the wall portion 204 partially protrudes upward to form a water-proof boss 2041. The upper end surface 2040 of the wall portion 204 partially recesses downward to form a drainage groove 2042. An upper end and a lower end of the drainage groove 2042 are separately in communication with the outside. A seal ring 231 is provided in a position in which the protective cover 230 is docked to the water-proof boss 2041. The seal ring 231 and the water-proof boss 2041 fit to implement sealing at the position of docking. When the upper end and the lower end of the drainage groove 2042 are separately in communication with the outside, it means that two ends of the drainage groove 2042 are both in communication with the outside of the self-moving device to guide out water. The two ends of the drainage groove 2042 may be in direct communication with the outside or in indirect communication with the outside. The indirect communication with the outside means that the drainage groove 2042 is not in direct communication with the outside, but is in communication with the outside via a third member to guide water out of the self-moving device 200. For example, the drainage groove 2042 is in communication with a drainage structure (not shown) of the self-moving device 200. Water in the drainage groove 2042 is guided into the drainage structure. The drainage structure then guides the water out of the self-moving device 200. When water drops on the upper end surface 2040 of the wall portion 204, in one aspect, the water-proof boss 2041 stops the water to prevent the water from flowing into the accommodating cavity 203. In another aspect, the water flows out of the drainage groove 2042, so that the water is guided out in time to prevent the water from accumulating on the upper end surface 2040 of the wall portion 204. As shown in FIG. 11, in this embodiment, the wall portion 204 is a part of the body 210. Specifically, the wall portion 204 is a part of the housing 3. The housing 3 partially recesses inward to form the wall portion 204. The protective cover 230 is assembled on the housing 3. In other embodiments, the wall portion 204 may be separately formed and then assembled into the body. The protective cover 230 is assembled on the body having the wall portion 204. Alternatively, the protective cover 230 and the wall portion 204 may be first assembled to form a battery box with a cover, and the battery box is then mounted in the body. FIG. 12 is an enlarged three-dimensional view of the battery accommodating portion 201 assembled with the protective cover 230 in the self-moving device 200. In this embodiment, the protective cover 230 includes a positioning portion 232 assembled with the wall portion 204. The wall portion 204 is provided with a positioning hole 2043, where the positioning hole 2043 and the positioning portion 232 limit each other. The positioning portion 232 is accommodated inside the positioning hole 2043, and is rotatable inside the positioning hole 2043 to enable the protective cover 230 to open or close. Specifically, in this embodiment, left and right end surfaces of the positioning portion 232 protrude outward to form a rotating shaft. The rotating shaft is inserted in the positioning hole 2043 to rotate to implement opening or closing of the protective cover 230. In other embodiments, specific structures of the positioning portion 232 and the positioning hole 2043 are not limited to the foregoing manner, and may be determined according to an actual case.

Figure 15:
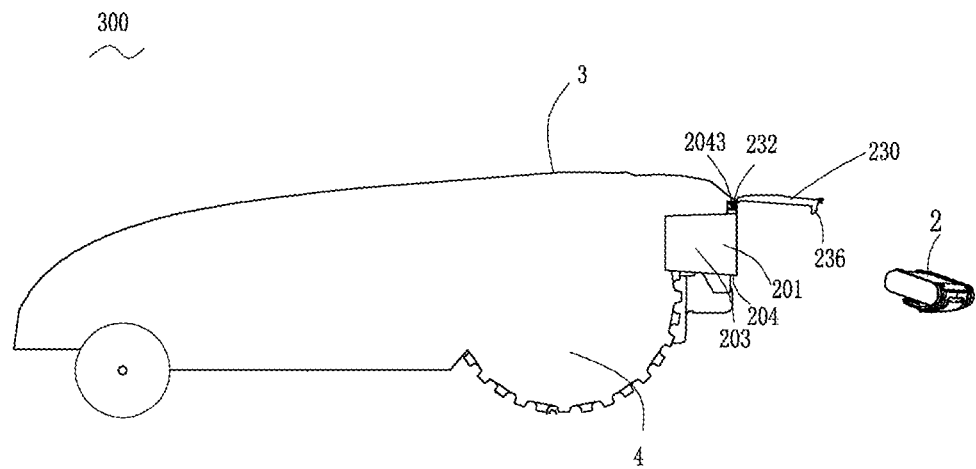
FIG. 15 is a front view of a self-moving device when an accommodating cavity is disposed behind the self-moving device according to an embodiment of the present invention.
Figure 16:
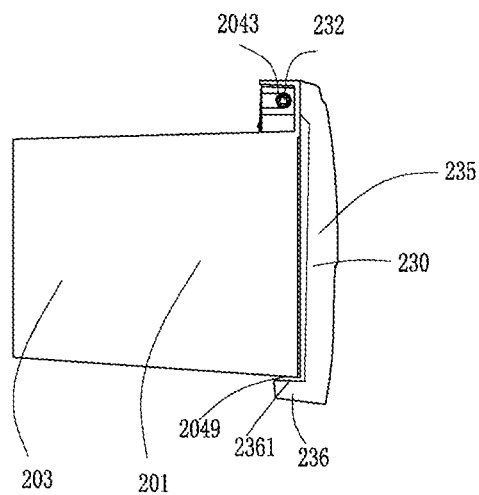
FIG. 16 is a front view of the accommodating cavity in FIG. 15 and a protective cover.
Figure 17:
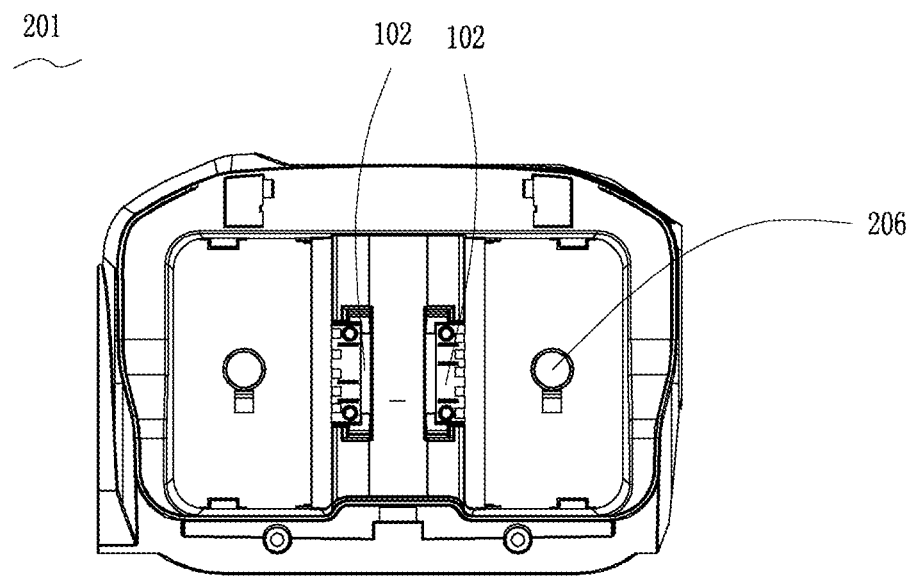
FIG. 17 is a top view of an accommodating cavity according to an embodiment of the present invention.
Figure 18:
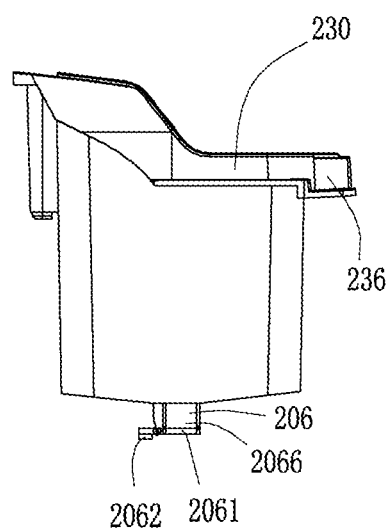
FIG. 18 is a front view of an accommodating cavity assembled with a protective cover according to an embodiment of the present invention.

In this embodiment, the self-moving device 200 further includes a locking apparatus 250. The locking apparatus 250 is configured to lock the energy module 2 in the self-moving device 200. In this embodiment, the locking apparatus 250 locks the protective cover 230 and the body 210 to prevent the protective cover 230 from being opened, thereby preventing the energy module 2 from being stolen. In other embodiments, the locking apparatus 250 may directly lock the energy module 2 and the self-moving device 200 or lock the energy module 2 in the self-moving device 200 in another manner. The locking apparatus 250 may be a mechanical lock or an electrical lock. The electrical lock includes a password lock, a smart lock using image recognition, fingerprint recognition, voice recognition or iris recognition or the like. In this embodiment, the protective cover 230 is locked at the wall portion 204. The locking apparatus 250 is disposed at an end opposite the positioning portion 232. In other embodiments, the protective cover 230 may be locked in another position of the body 210. In this embodiment, the battery accommodating portion 201 is disposed above the body 210. The energy module 2 is inserted in the battery accommodating portion 201 in a vertical direction. In another embodiment, as shown in FIG. 15 and FIG. 16, a battery accommodating portion 201 of a self-moving device 300 is disposed behind the body 210. The energy module 2 is inserted in the battery accommodating portion 201 from rear to front. The protective cover 230 is assembled behind the body 210 and covers the inlet 205 of the battery accommodating portion 201. In another embodiment, the battery accommodating portion 201 may be disposed in another position of the body 210, for example, disposed below or in front of the body 210.

In the embodiments shown in FIG. 15 and FIG. 16, the battery accommodating portion 201 of the self-moving device 300 is disposed behind the body 210. The energy module 2 is inserted in the battery accommodating portion 201 from rear to front. The protective cover 230 is assembled behind the body 210 and covers the inlet 205 of the battery accommodating portion 201. As shown in FIG. 16, the protective cover 230 includes a main cover board 235 that seals the inlet 205, a positioning portion 232 located on one side of the main cover board 235 and fastened to the body 210, and a stop wall 236 located on the other side of the main cover board 235 and formed extending from an edge of the main cover board 235. The body 210 is provided with a positioning hole 2043 accommodating the positioning portion 232. The positioning portion 232 is accommodated inside the positioning hole 2043 to rotate to implement opening or closing of the protective cover 230. An edge of the stop wall 236 protrudes from an edge of the wall portion 204, to prevent water from flowing into a battery groove. In an optimal embodiment, as shown in FIG. 16, the stop wall 236 extends inward (in a direction from the protective cover 203 to the inlet 205) from an edge of the main cover board 235. An inner wall 2361 of the stop wall 236 is located outside an outer wall 2049 of the wall portion 204. In one of embodiments, the inner wall 2361 of the stop wall 236 wraps the outer wall 2049 of the wall portion 204 to seal the inlet 205, thereby preventing water from flowing into the accommodating cavity 203. In other embodiments, the protective cover 230 may be designed into another structure to block the inlet of the battery accommodating portion 201 or wrap the energy module 2 to implement a water-proof purpose, a moist-proof purpose, a sun-proof purpose or the like of the energy module 2 and a corresponding circuit.

Figure 21:
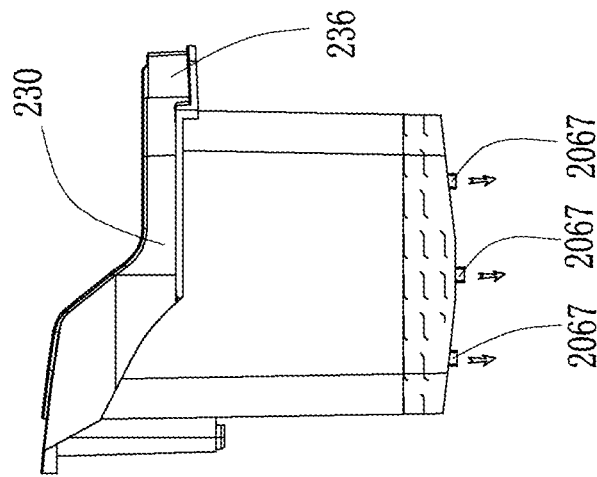
FIG. 21 is a schematic diagram of a drainage hole being provided in the bottom of a battery groove according to an embodiment of the present invention.
Figure 20:
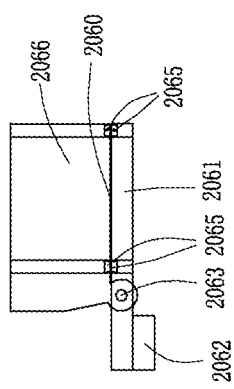
FIG. 20 is an enlarged view of a water drainage apparatus in the accommodating cavity shown in FIG. 18.
Figure 19:
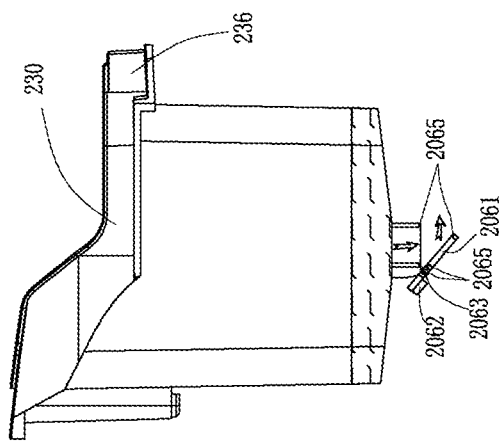
FIG. 19 is a schematic diagram of water accumulation in the accommodating cavity shown in FIG. 18.

As shown in FIG. 17 to FIG. 20, in an embodiment, the battery accommodating portion 201 is further provided with a water drainage apparatus 206 in communication with the accommodating cavity 203. The water drainage apparatus 206 includes a water accumulation groove 2066, a water leakage hole 2060, a cover board 2061 stopping the water leakage hole 2060, a rotating shaft 2063 for fastening the cover board 2061, and a bearing block 2062 fastened inside an end of the cover board 2061. One end of the cover board 2061 stops the water leakage hole 2060, and a bearing block 2062 is fastened at the other end of the cover board 2061. A rotating shaft is disposed between the two ends to fasten the cover board 2061 inside the body 210. When the accommodating cavity 203 has no accumulated water, one end of the bearing block 2062 of the cover board 2061 is heavier than the end that seals a drainage hole. The cover board 2061 that seals the water leakage hole 2060 to prevent external moist or water from entering the accommodating cavity 203. In an optimal embodiment, a plurality of magnetic components 2065 that attract each other are disposed in positions corresponding to the cover board 2061 around the water leakage hole 2060, so that as the self-moving device 200 moves, the cover board 2061 can stably seal the drainage hole, to prevent the cover board 2061 from being opened from shaking. When water accumulates in the accommodating cavity 203, the accumulated water is stored in the water accumulation groove 2066 by gravity. When the weight of the accumulated water is greater than that of the bearing block 2062, the cover board 2061 rotates clockwise, the cover board 2061 that seals the water leakage hole 2060 is opened, and the accumulated water flows out through the water leakage hole 2060, to prevent the water from accumulating in the accommodating cavity 203, so as not to damage the energy module 2 or related circuits. After the accumulated water is fully discharged, the cover board 2061 is driven by the bearing block 2062 to rotate counterclockwise to seal the water leakage hole 2060. In other embodiments, as shown in FIG. 21, a plurality of water leakage holes 2067 located in the bottom of the battery accommodating portion 201 may be directly provided. The water leakage holes 2067 enable the accommodating cavity 203 to be in communication with the outside. If water is accumulated in the accommodating cavity 203, the water is directly guided outside through the water leakage holes 2067.

Figure 23:
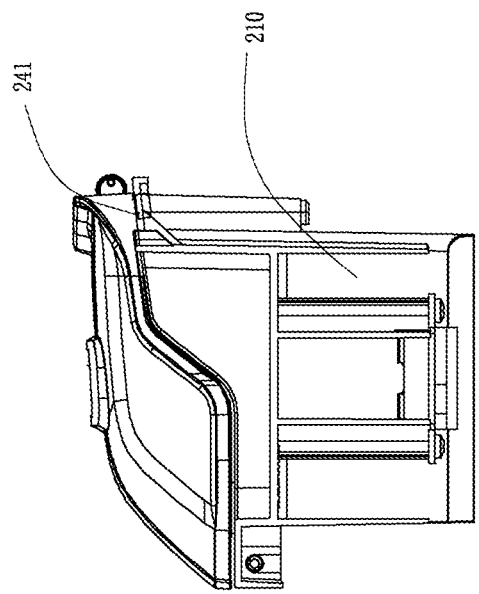
FIG. 23 is a front view of the accommodating cavity when the protective cover shown in FIG. 22 is closed.
Figure 22:
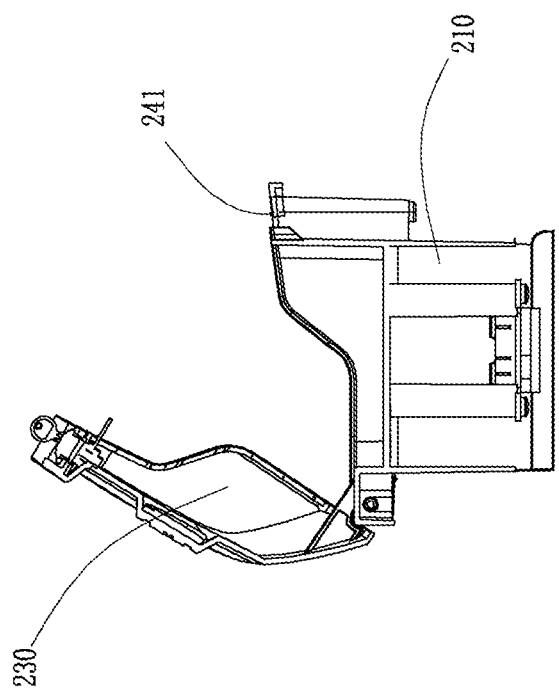
FIG. 22 is a front view of an accommodating cavity when a protective cover is open according to an embodiment of the present invention.
Figure 24:
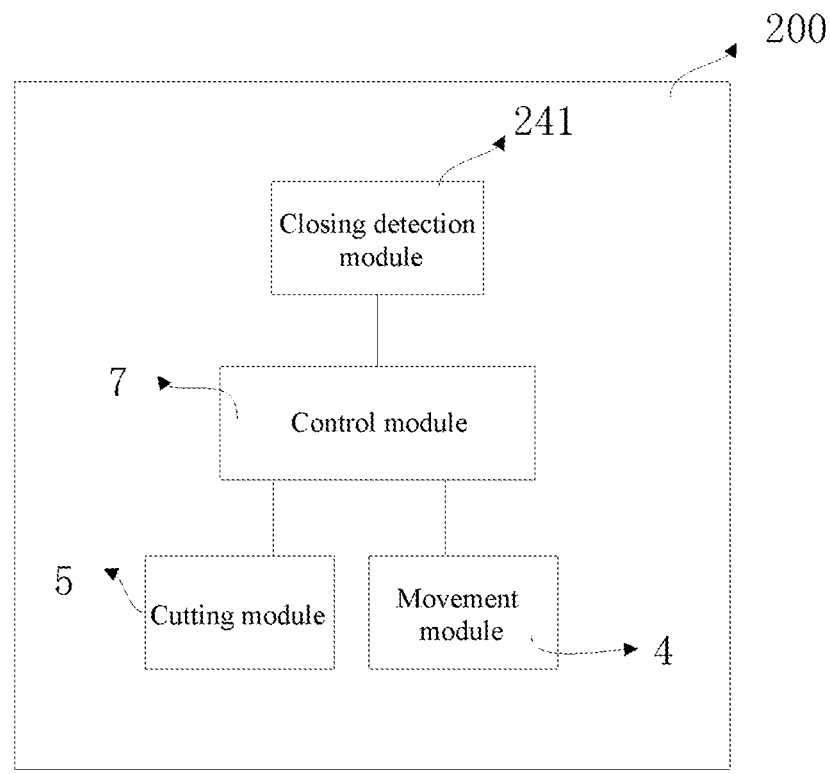
FIG. 24 is a schematic modular diagram of a self-moving device according to an embodiment of the present invention.
Figure 25:
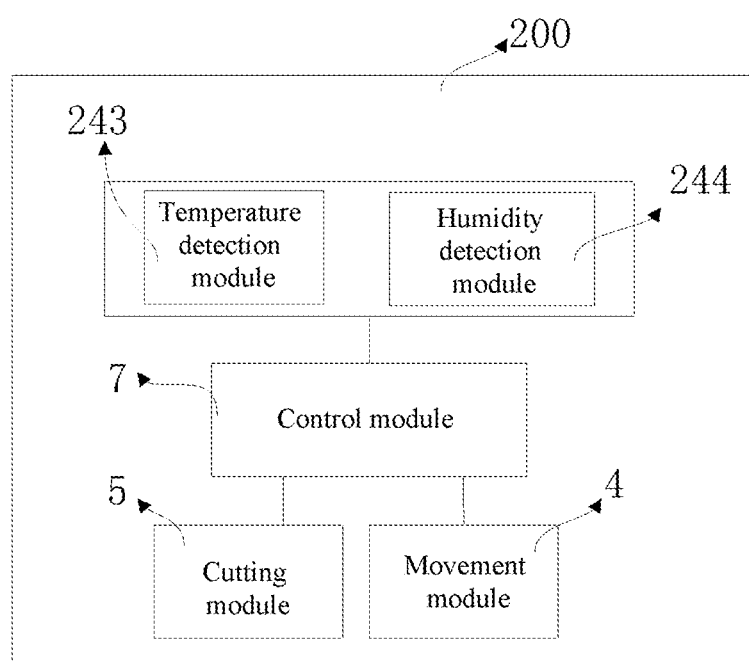
FIG. 25 is a schematic modular diagram when a self-moving device has both a temperature detection module and a humidity detection module according to an embodiment of the present invention.

As shown in FIG. 22 to FIG. 24, in an embodiment, the self-moving device 200 in this embodiment further includes a closing detection module 241 and a corresponding control structure. In this embodiment, the self-moving device 200 includes a movement module 4, a cutting module 5, a closing detection module 241, and a control module 7. The closing detection module 241 is configured to detect whether the protective cover 230 and the body 210 are successfully closed to obtain a detection result. The control module 7 controls a working status of the self-moving device 200 according to the detection result of the closing detection module 241. Specifically, if the detection result of the closing detection module 241 is that the protective cover 230 and the body 210 are successfully closed, the self-moving device 200 is controlled to be electrified. If the detection result of the closing detection module 241 is that the protective cover 230 and the body 210 are successfully closed, the self-moving device 200 is controlled to be not electrified. In a specific embodiment, the closing detection module 241 may be disposed in a position in which the protective cover 230 is docked to the body 210. When the protective cover 230 is closed, the closing detection module 241 uses a mechanical touch manner, a sensor detection manner, a capacitor detection manner or the like to detect whether the protective cover 230 is successfully closed. The closing detection module 241 is only an implementation of embodiments of the present invention, in other embodiments, according to an actual case, the closing detection module 241 may be disposed in another position or a different detection manner may be used for the closing detection module 241.

Figure 31:
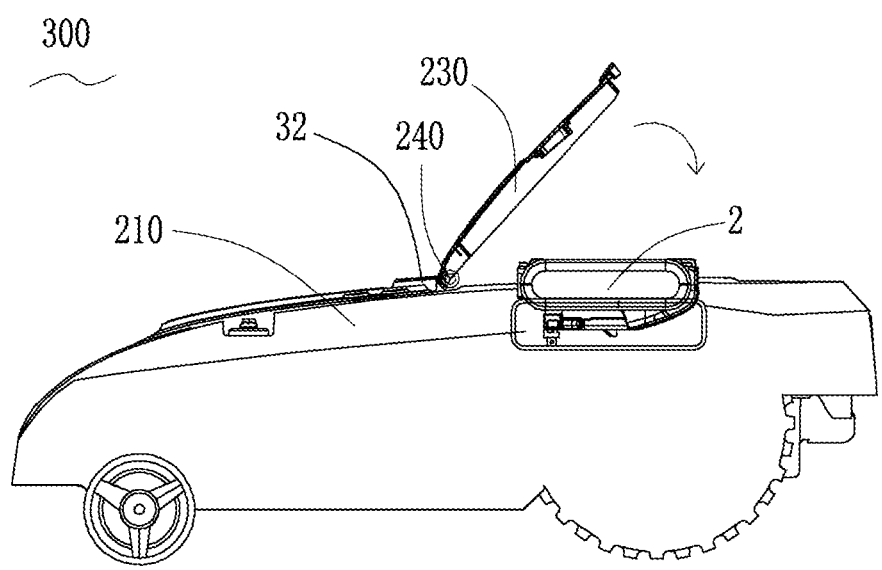
FIG. 31 is a three-dimensional view of a self-moving device having a reset structure according to an embodiment of the present invention.
Figure 32:
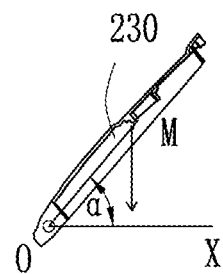
FIG. 32 is a schematic diagram of a horizontal line and a connecting line between a protective cover gravity center and a rotation center in FIG. 31.
Figure 33:
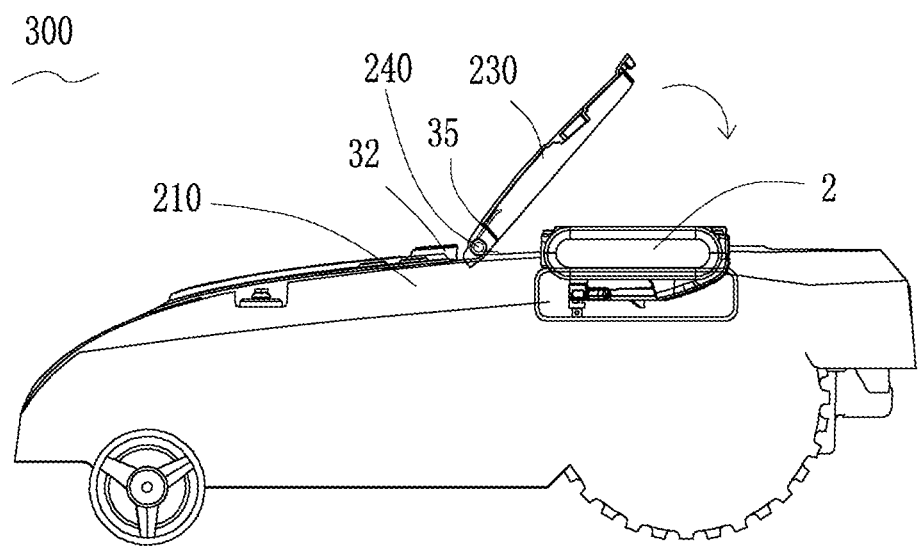
FIG. 33 is a three-dimensional view of a self-moving device having an elastic apparatus according to an embodiment of the present invention.

As shown in FIG. 31 to FIG. 33, in a specific embodiment, the self-moving device 300 further includes a reset structure, so that when the protective cover 230 is open, the protective cover 230 can be restored to a water-proof state. The water-proof state is a state in which the self-moving device 300 is water-proof. For example, the protective cover 230 in a second embodiment is in a closed state. Certainly, in the water-proof state, it is not necessarily required that the protective cover 230 should be closed. For example, in other embodiments, water-proof requirements can still be satisfied when the protective cover 230 reaches an unclosed state. In this case, the foregoing unclosed state is also referred to as the water-proof state. The self-moving device 300 may use an automatic reset structure to automatically restore the self-moving device 300 to the water-proof state. Alternatively, a non-automatic reset structure may be used to remind a user to restore the self-moving device 300 to the water-proof state.

Specifically, as shown in FIG. 31 and FIG. 32, in an embodiment, the self-moving device 200 includes a pivot portion 240 configured to connect the protective cover 230 and the body 210, to enable the protective cover 230 to be rotatable around the pivot portion 240 to implement opening or closing of the protective cover 230. The body 210 is provided with a limit structure 32 limiting the protective cover 230, to prevent the protective cover 230 from swinging backward excessively, thereby ensuring that an angle α between a horizontal line OX and a connecting line between the gravity center M of the protective cover 230 and the rotation center O on a side of the inlet 205 is less than 90 degrees. In this case, when the protective cover 230 is open, the protective cover 230 tends to close by gravity. A hand, another part or an auxiliary apparatus is required to help support the protective cover 230. Once the hand, the another part or the auxiliary apparatus leaves the protective cover 230, and the protective cover 230 automatically closes by gravity. In this embodiment, the limit structure 32 is disposed at a connection between the protective cover 230 and the body 210. The limit structure 32 is a protrusion structure or another stop block structure. In another embodiment, as shown in FIG. 33, the automatic reset structure may be disposed on the pivot portion, and includes an elastic apparatus 35 disposed on the pivot portion 240. The elastic apparatus 35 may be a compression spring, an extension spring, a leaf spring or another elastic apparatus. When the protective cover 230 is open, the elastic apparatus 35 is compressed, and it is necessary to use a hand, another part or the auxiliary apparatus to help support the protective cover 230. Once the hand, the another part or the auxiliary apparatus leaves the protective cover 230, the elastic apparatus 35 applies a force in the opposite direction on the protective cover 230 to drive the protective cover 230 to close. In other embodiments, both the limit structure 32 and the elastic apparatus 35 in the two embodiments may be provided. In the foregoing embodiment, the limit structure 32 and the elastic apparatus 35 are generally referred to as the automatic reset structure. In the foregoing embodiment, a damping apparatus may further be added to reduce a reset speed of the automatic reset structure. Specifically, the self-moving device 200 further includes a damping apparatus configured to reduce a reset speed of the automatic reset structure. The damping apparatus is disposed on the pivot portion 240. When the protective cover 230 is automatically reset by gravity, a damping torque generated by the damping apparatus of the protective cover 230 is less than a gravitational torque generated from the gravity of the protective cover 230. When the protective cover 230 is automatically reset by the elastic apparatus 35, the damping torque generated by the damping apparatus is less than an elastic torque generated when the elastic apparatus 35 is compressed.

Figure 34:
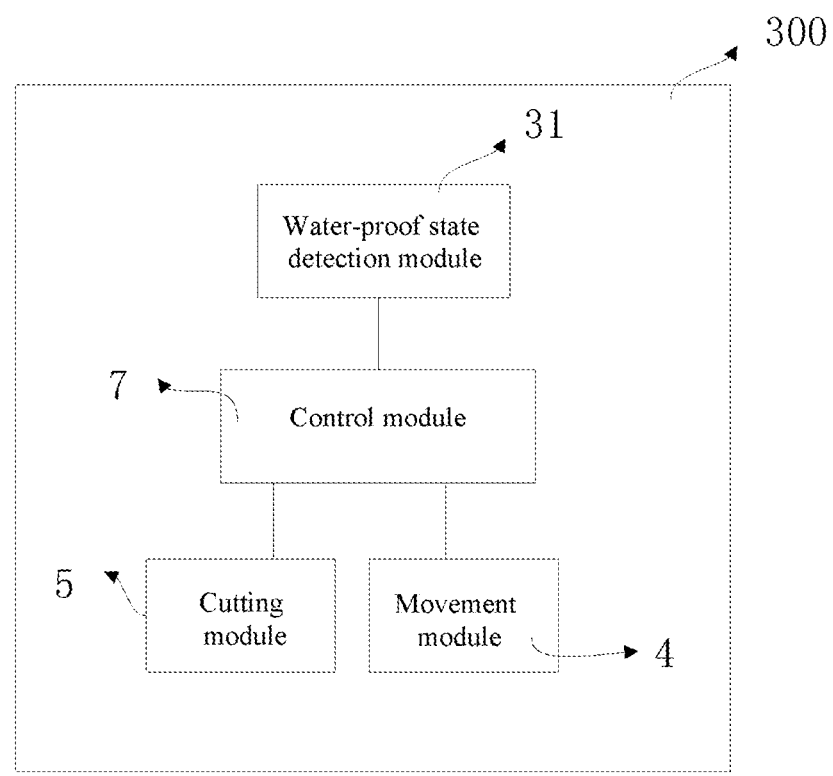
FIG. 34 is a modular diagram of a self-moving device having a water-proof state detection module according to an embodiment of the present invention.

In another embodiment, as shown in FIG. 34, the self-moving device 300 further includes a water-proof state detection module 31. The water-proof state detection module 31 is configured to detect whether the protective cover 230 and the body 210 are in the water-proof state and obtain a detection result. The self-moving device 300 is controlled according to the detection result to restore the water-proof state. Specifically, the self-moving device 300 is controlled according to the detection result to restore the water-proof state in two manners. One manner is automatic control. That is, the self-moving device 1 is automatically controlled to restore the water-proof state. The other manner is non-automatic control. For example, a user is reminded that the self-moving device 1 is not in the water-proof state. The user manually controls the self-moving device 1 to restore the water-proof state. In this embodiment, for example, the water-proof state is that the protective cover 230 is in a closed state. The water-proof state detection module 31 is configured to detect whether the protective cover 230 is closed. In other embodiments, the water-proof state may be that the protective cover 230 is in an unclosed state. A specific state is determined according to an actual case. In this embodiment, the water-proof state detection module 31 is configured to detect whether the protective cover 230 is closed. The self-moving device 300 is controlled according to the detection result to restore the protective cover 230 to a closed state. There are specifically two restoration manners. In one manner, the protective cover 230 is automatically controlled according to the detection result to close. For example, the protective cover 230 is automatically controlled in an electric manner or another manner to close. In the other manner, the user is reminded according to the detection result that the protective cover 230 is not closed. In this manner, the water-proof state detection module is provided with an indicator lamp or another display structure or a sound alarm or another alarm structure, configured to display a closed case of the protective cover 230. For example, when the protective cover 230 is not closed, the indicator lamp flashes to send alarm information or a sound alarm is raised to remind the user to close the protective cover 230, to restore the protective cover 230 to the water-proof state. Specifically, the water-proof state detection module 31 may be disposed in a position in which the protective cover 230 is docked to the body 210. The water-proof state detection module 31 uses a mechanical touch manner, a sensor detection manner, a capacitor detection manner or the like to detect whether the protective cover 230 is successfully closed. The water-proof state detection module 31 is only an implementation of embodiments of the present invention. In other embodiments, according to an actual case, the water-proof state detection module 31 may be disposed in another position or a different detection manner may be used for the water-proof state detection module 31. The water-proof state detection module 31 may be referred to as a non-automatic reset structure.

In an embodiment, the self-moving device 300 includes a control module 7. The control module 7 controls a working status of the self-moving device 300 according to the detection result of the water-proof state detection module 31. Specifically, if the detection result of the water-proof state detection module 31 is that the protective cover 230 and the body 210 are successfully closed, the self-moving device 300 is controlled to be electrified. If the detection result of the water-proof state detection module 31 is that the protective cover 230 and the body 210 are successfully closed, the self-moving device 300 is controlled to be not electrified.

The automatic reset structure and the non-automatic reset structure in the foregoing embodiment both directly restore the self-moving device 300 to the water-proof state or indirectly provide a reminder to make the user restore the self-moving device 300 to the water-proof state. Both structures are used to restore the self-moving device 300 to the water-proof state, and may be generally referred to as a reset structure. In the foregoing embodiment, the limit structure 32, the elastic apparatus 35, and the water-proof state detection module 31 may be generally referred to as a reset structure. In other embodiments, a structure with either automatic or non-automatic implementation can be generally referred to as a reset structure provided that the self-moving device 300 is restored to the water-proof state.

As shown in FIG. 35 to FIG. 43, in a specific embodiment, a self-moving device 400 further includes a drainage system configured to drain water to prevent water from entering an accommodating cavity 420. Compared with the foregoing embodiments, only a drainage system configured to drain water to prevent water from entering the accommodating cavity 420 is added to the self-moving device 400 in this embodiment. The remaining structures are all the same as those in the foregoing embodiments or can be combined with the foregoing embodiments. Details are not described one by one again herein.

In this embodiment, the self-moving device 400 includes a body 410, a movement module 4 configured to drive the self-moving device 400 to move, a task execution module configured to perform a work task, and a control module 7 configured to control the self-moving device 400 to move and walk inside a defined working area. The movement module 4 and the control module 7 are disposed on the body 410. The control module 7 controls the movement module 4 to drive the self-moving device 400 to move inside the defined working area, and at the same time controls the task execution module to perform the work task inside the defined working area. In this embodiment, the self-moving device 400 is an automatic mower. The task execution module of the self-moving device 400 is a cutting module 5. In other embodiments, the self-moving device 400 may be an automatic leaf blower, an automatic water sprinkler, a multifunctional machine, an automatic snowplow, a robot cleaner or the like. The task execution module of the self-moving device 400 is a task execution module that performs a corresponding work task. For example, when the self-moving device 400 is an automatic snowplow, the task execution module of the self-moving device 400 is a snow removal module.

The automatic working system 100 further includes an energy module 2 configured to supply power to the self-moving device 400. The energy module 2 may selectively supply power to the self-moving device 400 or supply power to another electric device. The another electric device is an electric device other than the self-moving device 400, for example, an electric tool or a home appliance. In this embodiment, the energy module 2 may selectively supply power to the self-moving device 400 or another electric tool. The another electric tool is an electric tool other than the self-moving device 400, and is, for example, a gun drill, a hammer drill, a trimmer or a hand-propelled lawnmower. In this embodiment, the self-moving device 400 is powered by the detachable energy module 2. Specifically, the detachable energy module is a detachable battery pack that supplies power to an electric tool such as a gun drill, a hammer drill, a trimmer or a hand-propelled lawnmower. The detachable energy module means that the energy module 2 is detachably assembled on the body 410. "Detachably" means that the energy module 2 can be directly detached without needing to remove a fastener such as a screw, a nut or a pin. For example, the energy module 2 is docked to the self-moving device 400 by a connector, a wireless charging interface or the like, so that the energy module 2 and the self-moving device 400 are conveniently undocked, to implement fast insertion. Certainly, in other embodiments, a protective cover or the like fastened to the body 410 may be disposed outside the energy module 2, or even the protective cover and the body are fastened by a fastener such as a screw, a nut or a pin. The energy module 2 is "detachable" provided that fast insertion of the energy module 2 in the self-moving device 400 can be implemented.

The self-moving device 400 includes an accommodating cavity 401 configured to accommodate the energy module 2. The accommodating cavity 401 is provided with an inlet 405 to enable the energy module 2 to be inserted or pulled out. The self-moving device 400 further includes a protective cover 430 configured to operably block the inlet 405 to prevent water from entering the accommodating cavity 401 and a drainage system 420 configured to drain water to prevent water from entering the accommodating cavity 401.

Figure 37:
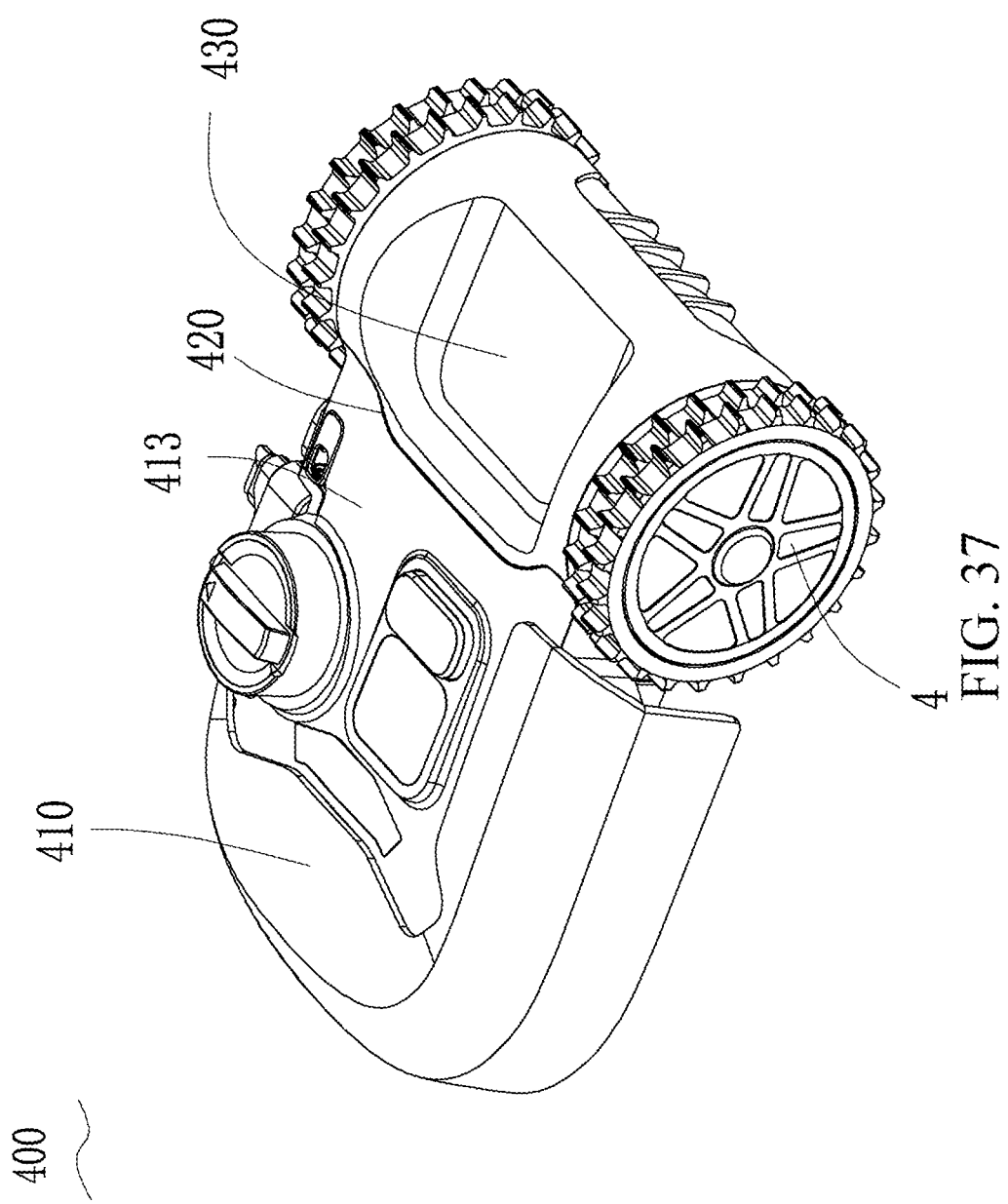
FIG. 37 is a three-dimensional view of the self-moving device when the protective cover of the self-moving device shown in FIG. 35 is in a closed state.

The drainage system 420 includes a drainage groove 421 in communication with the outside of the self-moving device 400 to drain water outside. The body 410 includes a bearing portion 411 configured to bear the circumference of the protective cover 430. The drainage groove 421 is provided in the bearing portion 411 to prevent water from flowing into the accommodating cavity 401 through a joint between the protective cover 430 and the body 410. The bearing portion 411 includes a joint area, joined to the protective cover 430, on the body 410, and an area located near the joint area. In this embodiment, the self-moving device 400 further includes a pivot portion 440 configured to connect the protective cover 430 and the body 410. The protective cover 430 is movable around the pivot portion 440 to implement opening or closing of the protective cover 430. Specifically, the protective cover 430 is rotatable around the pivot portion 440 to implement opening or closing of the protective cover 430. The body 410 includes a pivot groove 450 accommodating the pivot portion 440. In this embodiment, the pivot portion 440 includes a protective cover connecting end 441 connected to the protective cover 430 and a body connecting end 442 connected to the body 410. The body connecting end 442 is accommodated inside the pivot groove 450. When the protective cover 430 is open, the pivot portion 440 rotates outward around the body connecting end 442, and a part such as the protective cover connecting end 441 of the pivot portion 440 is exposed from the pivot groove 450 along with the rotation. When the protective cover 430 is closed, the pivot portion 440 around the body connecting end 442 rotates inward, and the part such as the protective cover connecting end 441 of the pivot portion 440 exposed from the pivot groove 450 is accommodated inside the pivot groove 450 along with the rotation, to ensure a smooth transition at a connection between the protective cover 430 and the body 410 in a travel direction of the self-moving device 400. As shown in FIG. 37, there is only a slit at the connection between the body 410 and the protective cover 430. The connection between the body 410 and the protective cover 430 has a smooth transition, so that the self-moving device 400 has desirable overall appearance. Certainly, in other embodiments, a specific structure of the pivot portion 440 may be set according to an actual case. Details are not listed one by one herein.

As shown in FIG. 35 to FIG. 39, in this embodiment, the drainage groove 421 includes a pivot portion drainage groove 422 in communication with the pivot groove 450. The pivot portion drainage groove 422 includes a drainage hole 4221 in communication with the outside and a connecting groove 4222 connecting the pivot groove 450 and the drainage hole 4221. The drainage hole 4221 is located below the connecting groove 4222, to enable water to flow into the drainage hole 4221 from top to bottom from the connecting groove 4222 to flow out of the drainage hole 4221. In a travel direction, that is, a longitudinal direction, of the self-moving device 400, the drainage groove 421 divides the body 410 into a front portion and a rear portion.

Figure 38:
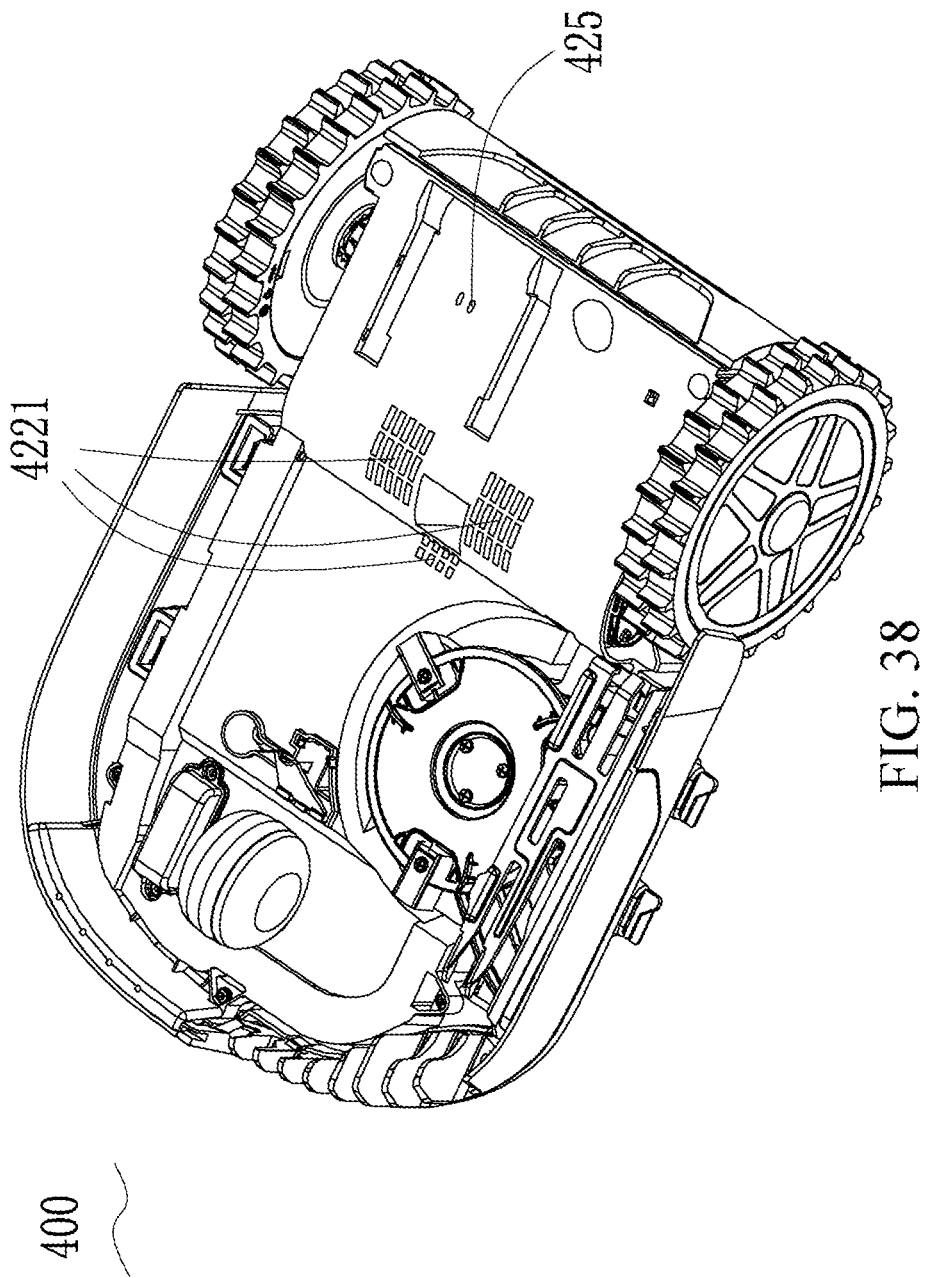
FIG. 38 is a three-dimensional view of the self-moving device shown in FIG. 35 from another angle.

The body 410 includes a front body portion 413 located in front of the drainage groove 421 and a rear body portion 414 located behind the drainage groove 421. As shown in FIG. 38, the drainage groove 421 further includes a water leakage hole 425 disposed at the bottom of the accommodating cavity 401 and configured to enable the accommodating cavity 401 to be in communication with the outside of the self-moving device 400. When water accumulates and permeates into the accommodating cavity 401, the water can flow out of the self-moving device 400 through the water leakage hole 425. A water-stop dust-proof apparatus such as a sponge may be disposed on the water leakage hole 425, so that water inside the self-moving device 400 can flow out, and external dust and water can be stopped from entering the self-moving device 400.

As shown in FIG. 35 to FIG. 39, in this embodiment, left and right ends of the drainage groove 421 are respectively in communication with left and right side walls 4141 of the body 410. That is, the left and right ends of the drainage groove 421 are in communication with the outside of the self-moving device 400, to enable water in the drainage groove 421 to flow out through the drainage hole 4221 and flow out from the left and right ends of the drainage groove 421. In this embodiment, the drainage groove 421 is defined by a front inner wall 4134 located at the front body portion 413, a rear inner wall 4144 located at the rear body portion 414, and a bottom inner wall 4145 connecting the front inner wall 4134 and the rear inner wall 4144. The bottom inner wall 4145 is lower than the front inner wall 4134 and the rear inner wall 4144. An upper surface of the rear inner wall 4144 is higher than the highest position of the inlet 405, to prevent water in the drainage groove 421 from flowing into the inlet 405.

The protective cover 430 covers an upper surface of the rear body portion 414. A projection of the protective cover 430 in a horizontal direction is larger than a projection of a corresponding position of the body 410 in the horizontal direction. Specifically, in this embodiment, a projection of the protective cover 430 in a transverse direction is larger than a projection of an upper surface of the corresponding position of the body 410 in the transverse direction. The transverse direction is the transverse direction of the protective cover 430 or the transverse direction of the body 410. The protective cover 430 includes a top cover 4304, a lateral protective wall 4301 extending from the top cover 4304 toward the left and right sides, and a rear protective wall 4303 formed extending backward from the top cover 4304. In this embodiment, the lateral protective wall 4301 is located on an outer side of the left and right side walls 4141 of the rear body portion 414. The rear protective wall 4303 is located on an outer side of a rear wall 4143 of the rear body portion 414. The bottom of the lateral protective wall 4301 is lower than an upper surface 4142 of the left and right side walls 4141 of the rear body portion 414, to guide out water from the lateral protective wall 4301 of the protective cover 430, thereby preventing water from flowing into the accommodating cavity 401 from the left and right sides of the protective cover 430. In this embodiment, the circumference of the rear body portion 414 fits the protective cover 430. The circumference of the rear body portion 414 may be considered as the bearing portion 411 located on the body 410 and configured to bear the circumference of the protective cover 430. In this embodiment, the inlet 405 of the accommodating cavity 401 is formed recessing inward from the rear wall 4143 of the rear body portion 414, to make it convenient for the user to fetch or mount the energy module 2 in a longitudinal direction. The rear protective wall 4303 covers the outer side of the inlet 405. The bottom of the rear protective wall 4303 is lower than the lowest end of the inlet 405, to prevent water from entering the accommodating cavity 401 through the inlet 405.

Figure 35:
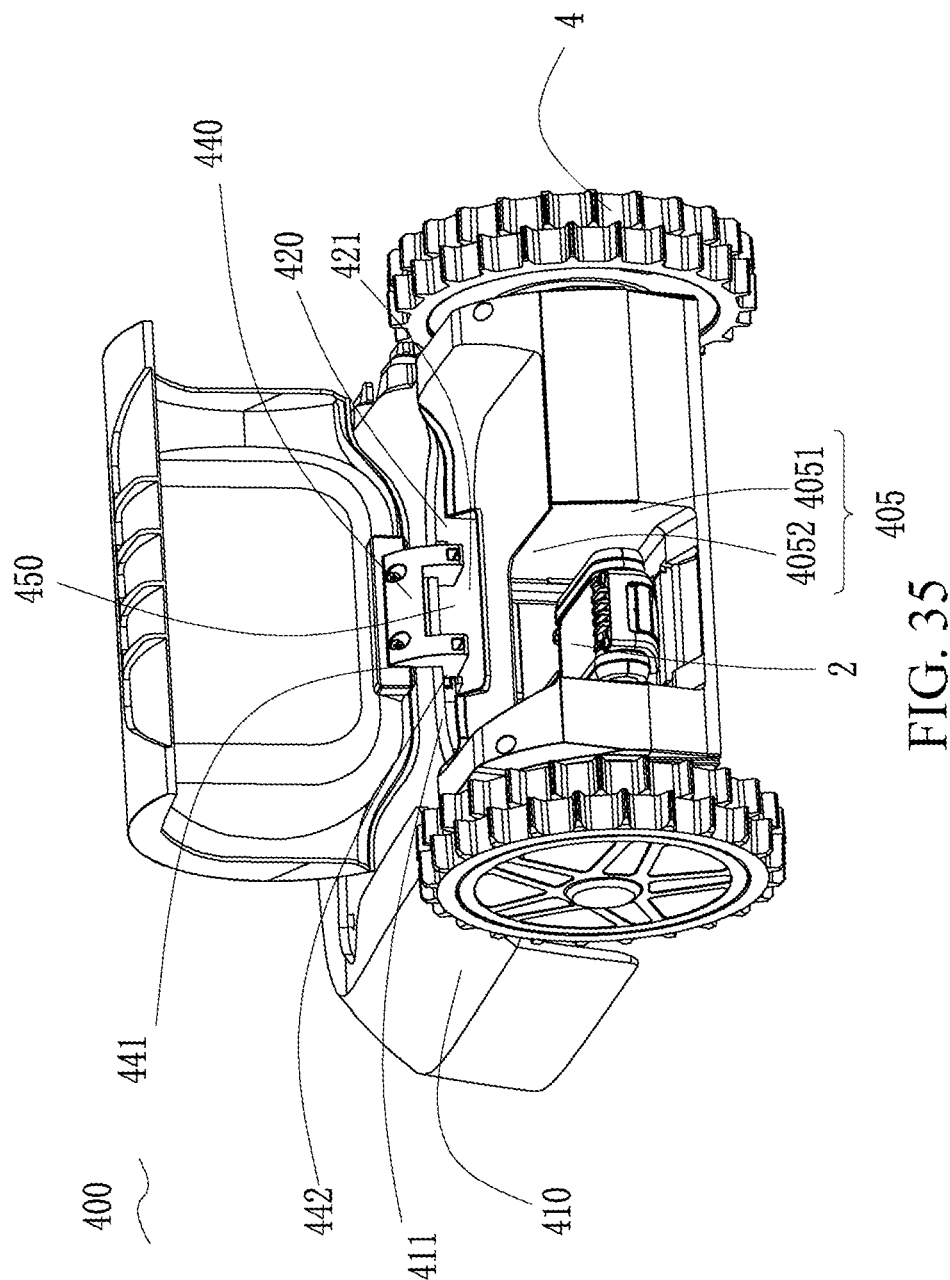
FIG. 35 is a three-dimensional view of a self-moving device when a protective cover is completely open according to an embodiment of the present invention.
Figure 36:
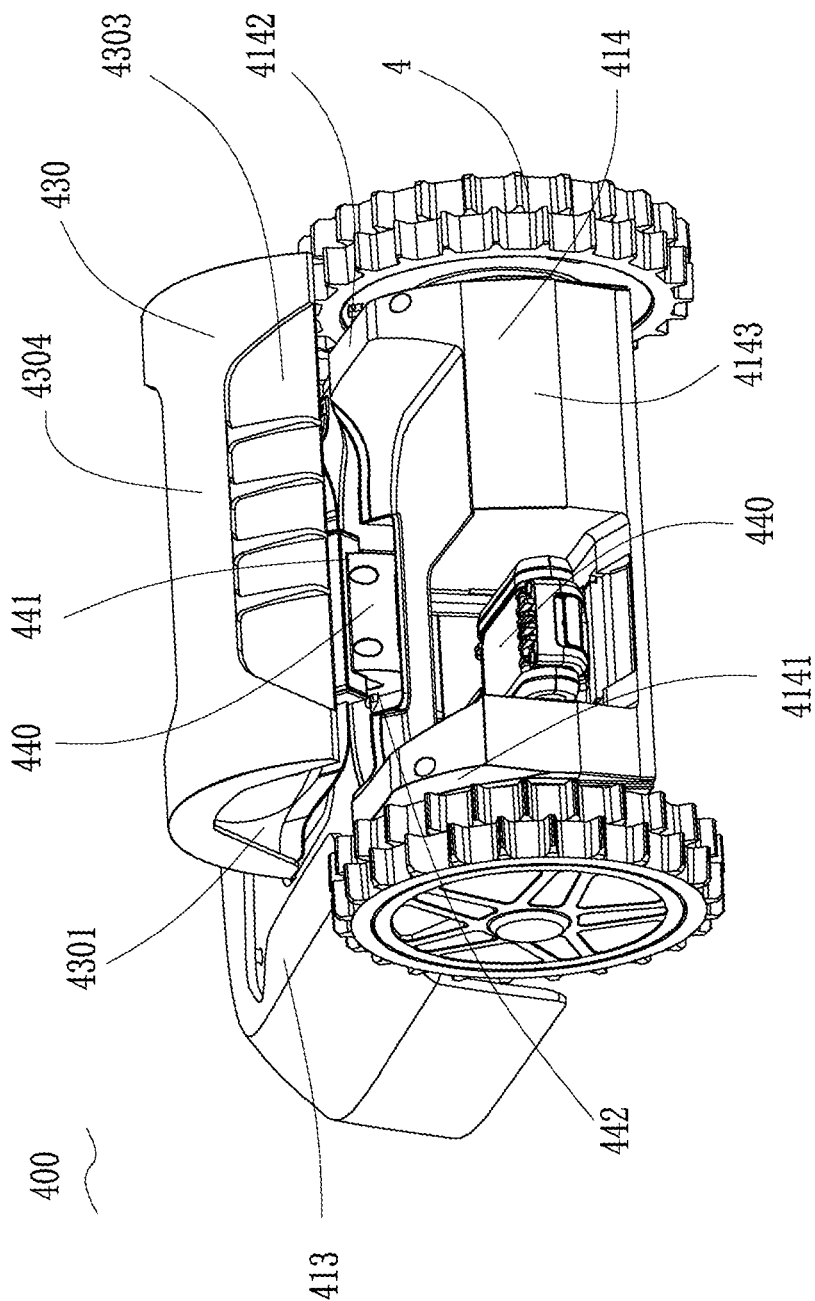
FIG. 36 is a three-dimensional view of the self-moving device when the protective cover of the self-moving device shown in FIG. 35 is in a half-open state.
Figure 41:
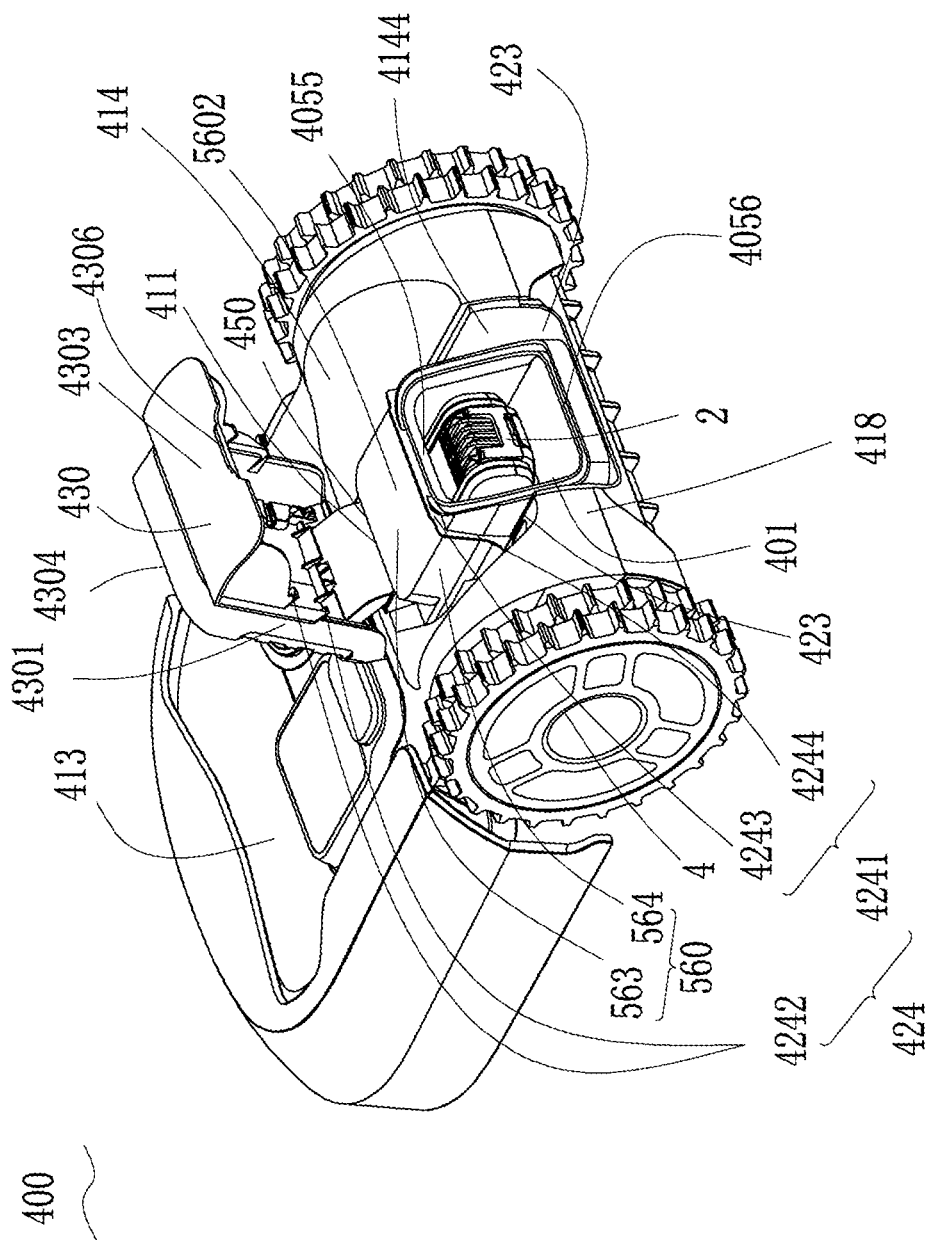
FIG. 41 is a three-dimensional view when the protective cover of the self-moving device shown in FIG. 40 is in an open state.
Figure 42:
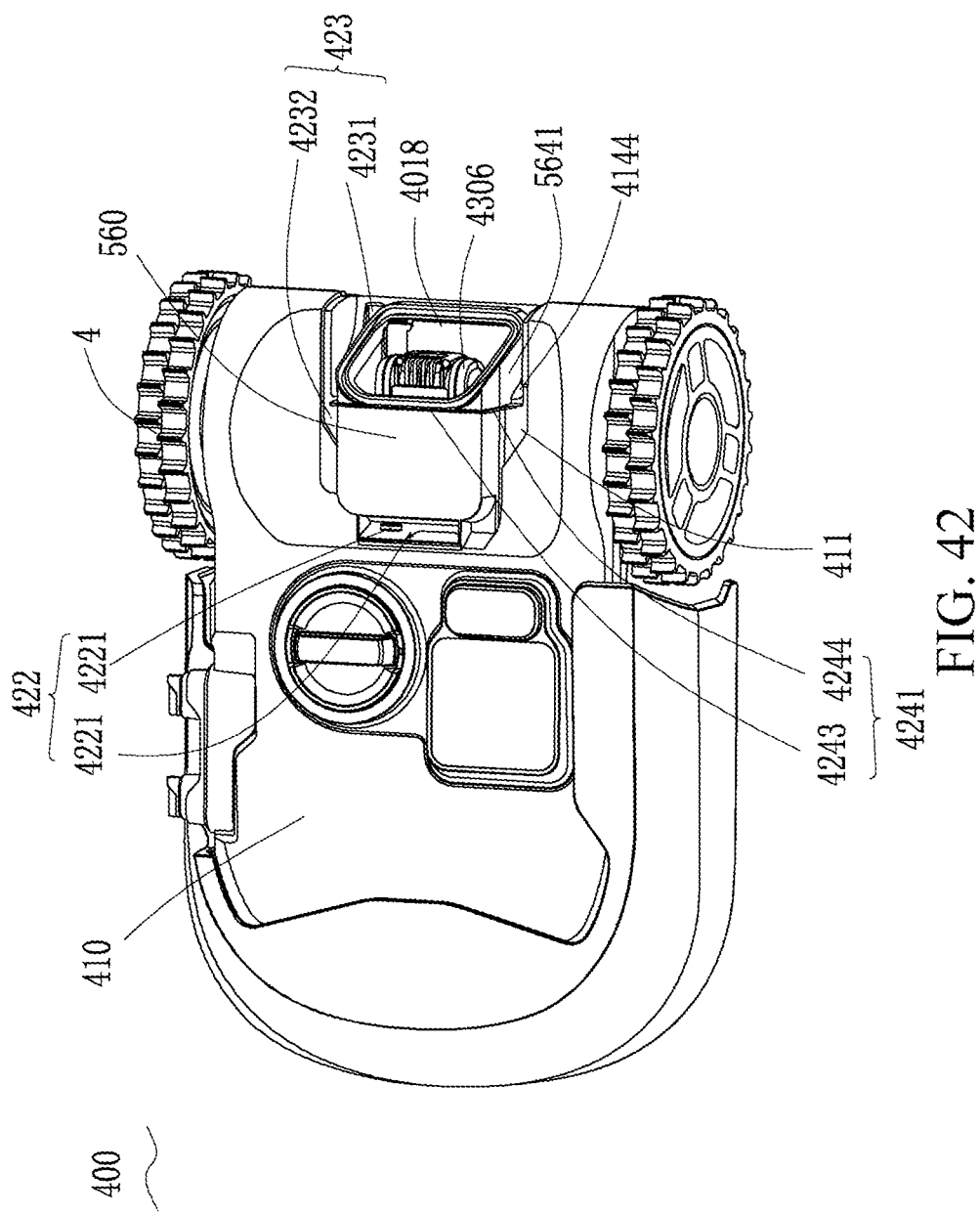
FIG. 42 is a three-dimensional view when the protective cover of the self-moving device shown in FIG. 40 is removed.

In this embodiment, the inlet 405 includes a vertical opening 4051 extending in a vertical direction and a longitudinal opening 4052 extending in a longitudinal direction. When the inlet 405 includes the vertical opening 4051 extending in the vertical direction and the longitudinal opening 4052 extending in the longitudinal direction, as shown in FIG. 35 and FIG. 36, the inlet 405 directly includes the vertical opening 4051 extending in the vertical direction and the longitudinal opening 4052 extending in the longitudinal direction that are in communication with each other. In addition, as shown in FIG. 41, the inlet 405 is oblique, and the inlet 405 includes an upper end edge 4055 and a lower end edge 4056. In a travel direction of the self-moving device, the upper end edge 4055 is located in front of the lower end edge 4056. The inlet 405 includes a component extending in the vertical direction and a component extending in the longitudinal direction. The component extending in the vertical direction of the inlet 405 is the vertical opening 4051 extending in the vertical direction, and the component extending in the longitudinal direction is the longitudinal opening 4052 extending in the longitudinal direction. In this embodiment, the inlet 405 includes the vertical opening 4051 extending in the vertical direction to enable the user to remove or mount the energy module 2 in the longitudinal direction. The longitudinal opening 4052 extending in the longitudinal direction provides a larger movement space during operation of the user, in particular, provides the user with a movement space in the longitudinal direction during operation, so that the user can insert the energy module 2 more conveniently. The rear protective wall 4303 includes an operation portion 4306. The user applies a force to the operation portion 4306 to open and close the protective cover 430. In an embodiment, the rear protective wall 4303 tilts outward and extends downward. The operation portion 4306 is disposed on the rear protective wall 4303 that tilts outward and extends downward, so that in one aspect, water flows out of the protective cover 430 along an oblique surface, and in another aspect, the rear protective wall 4303 that tilts outward makes it easier for the user to apply a force to the operation portion 4306, thereby further facilitating the operations when the user opens the protective cover 430.

Figure 43:
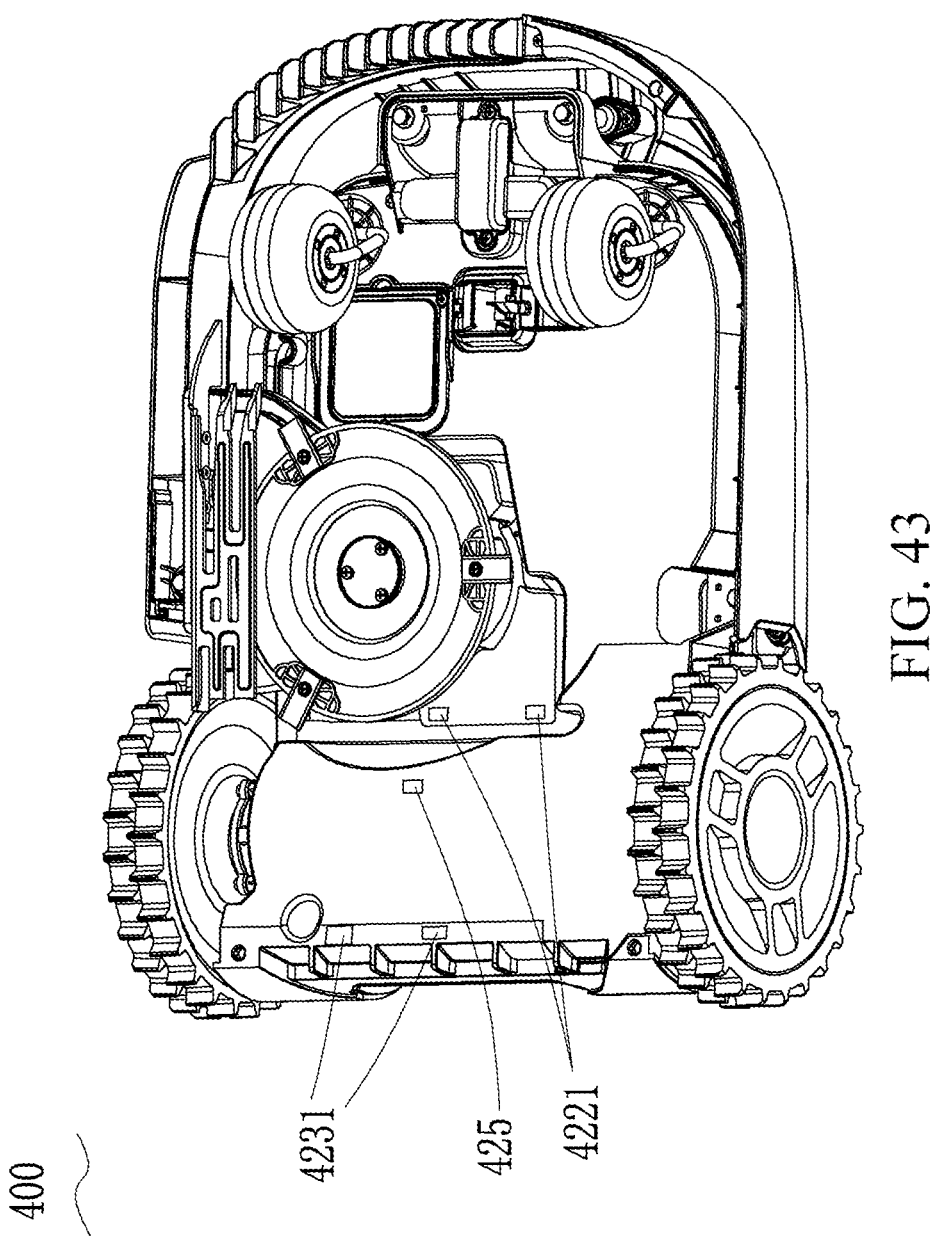
FIG. 43 is a view of the self-moving device shown in FIG. 40 from another angle.
Figure 44:
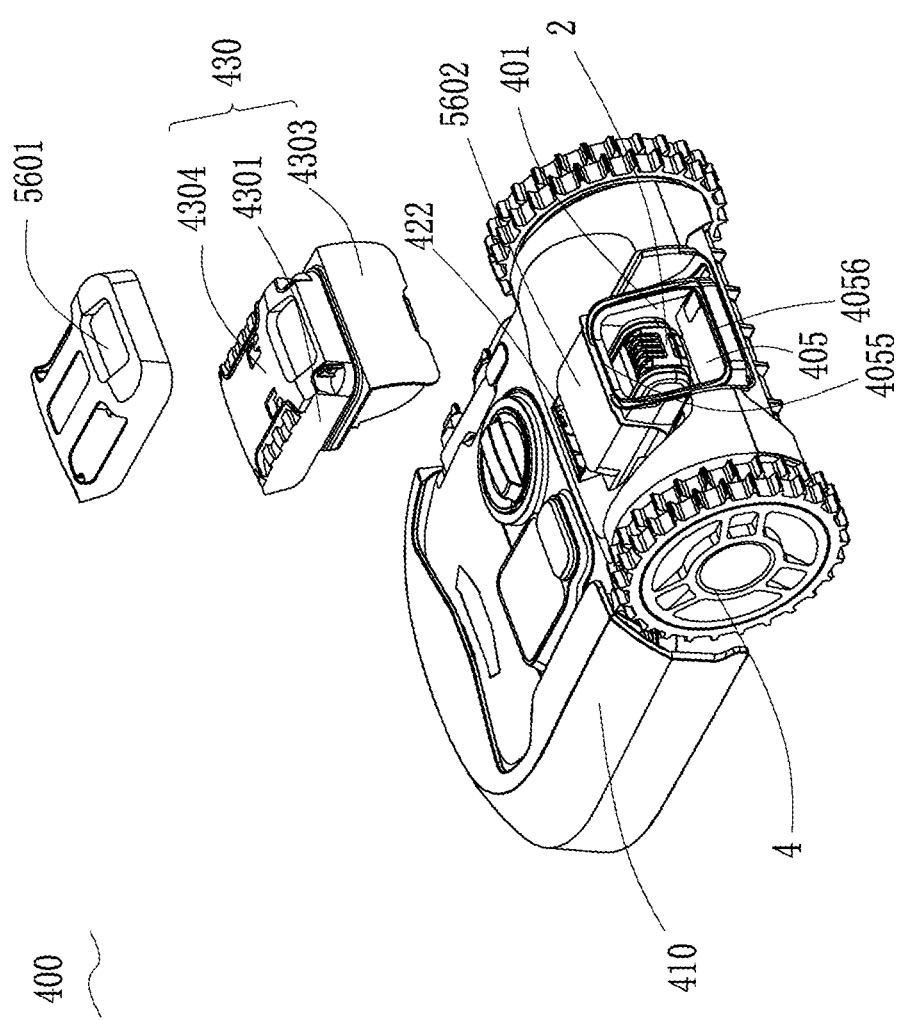
FIG. 44 is a partial exploded view of the self-moving device shown in FIG. 40.

As shown in FIG. 40 to FIG. 43, in another embodiment, the protective cover 430 only covers a part of the rear body portion 414. A projection of the protective cover 430 in a horizontal direction is smaller than a projection of a corresponding position of the body 410 in the horizontal direction. Specifically, in this embodiment, a projection of the protective cover 430 in a transverse direction is smaller than a projection of an upper surface of the corresponding position of the body 410 in the transverse direction. In this embodiment, the self-moving device 400 includes a pivot portion 440 configured to connect the protective cover 430 and the body 410. The protective cover 430 is movable around the pivot portion 440 to implement opening or closing of the protective cover 430. Specifically, the protective cover 430 is rotatable around the pivot portion 440 to implement opening or closing of the protective cover 430. The body 410 includes a pivot groove 450 accommodating the pivot portion 440. The drainage system 420 includes a drainage groove 421 in communication with the outside of the self-moving device 400 to drain water outside. The body 410 includes a bearing portion 411 configured to bear the circumference of the protective cover 430. The drainage groove 421 is provided in the bearing portion 411, to prevent water from entering the accommodating cavity 401 through a joint area in which the protective cover 430 is joined to the body 410. The drainage groove 421 includes a pivot portion drainage groove 422 in communication with the pivot groove 450. The pivot portion drainage groove 422 includes a drainage hole 4221 in communication with the outside and a connecting groove 4222 connecting the pivot groove 450 and the drainage hole 4221. The drainage hole 4221 is located below the connecting groove 4222, to enable water to flow into the drainage hole 4221 from top to bottom from the connecting groove 4222 to flow out of the drainage hole 4221. In a travel direction, that is, a longitudinal direction, of the self-moving device 400, the drainage groove 421 divides the body 410 into a front portion and a rear portion. The body 410 includes a front body portion 413 located in front of the drainage groove 421 and a rear body portion 414 located behind the drainage groove 421. In this embodiment, the structure of the pivot portion drainage groove 422 is basically the same as the structure shown in embodiments in FIG. 35 to FIG. 39. A difference only lies in that the left and right ends of the pivot portion drainage groove 422 are not in communication with the rear body portion 414. In other words, the length of the pivot portion drainage groove 422 in the transverse direction is less than the length of the corresponding position of the body 410 in the transverse direction. The transverse direction is a width direction of the self-moving device 400, that is, a direction perpendicular to the travel direction of the self-moving device 400. As shown in FIG. 43, the drainage groove 421 further includes a water leakage hole 425 disposed at the bottom of the accommodating cavity 401 and configured to enable the accommodating cavity 401 to be in communication with the outside of the self-moving device 400. When water accumulates and permeates into the accommodating cavity 401, the water can flow out of the self-moving device 400 through the water leakage hole 425. A water-stop dust-proof apparatus such as a sponge may be disposed on the water leakage hole 425, so that water inside the self-moving device 400 can flow out, and external dust and water can be stopped from entering the self-moving device 400.

In this embodiment, the drainage system 420 further includes a water guide groove 423 disposed on the surface of the body 410 and provided with a bottom. The water guide groove 423 is formed recessing inward from a part of the rear body portion 414. Specifically, the water guide groove 423 is provided in the bearing portion 411, to guide water at a joint between the protective cover 430 and the body 410 out of the body 410. In a transverse direction, the water guide groove 423 is located on two sides of the accommodating cavity 401. The body 410 includes a separating wall 5641 disposed between the water guide groove 423 and the accommodating cavity 401. The separating wall 5641 separates the water guide groove 423 from the accommodating cavity 401, to prevent water in the water guide groove 423 from flowing into the accommodating cavity 401. The water guide groove 423 includes a water guide passage 4232 formed recessing inward from the surface of the body and a water guide hole 4231 that enables the water guide passage 4232 to be in communication with the outside of the self-moving device 400. When water passes through the surface of the self-moving device 400, the water may flow into the water guide hole 4231 along the water guide passage 4232 to flow out of the self-moving device 400. Specifically, the protective cover 430 includes a top cover 4304, a lateral protective wall 4301 extending from the top cover 4304 toward the left and right sides, and a rear protective wall 4303 formed extending backward from the top cover 4304. In this embodiment, the rear body portion 414 includes a side wall accommodating groove 4144 accommodating the lateral protective wall 4301. The water guide groove 423 is in communication with the side wall accommodating groove 4144, to enable water flowing down along the lateral protective wall 4301 to flow into the water guide groove 423, so that the water is further guided out of the self-moving device 400 by the water guide groove 423. In this embodiment, in a horizontal direction, the bottom of the water guide groove 423 extends to the outside of the body 410 from the middle of the body 410. In a vertical direction, the bottom of the water guide groove 423 extends from top to bottom, so that the water guide groove 423 automatically guides out water from inside.

Figure 39:
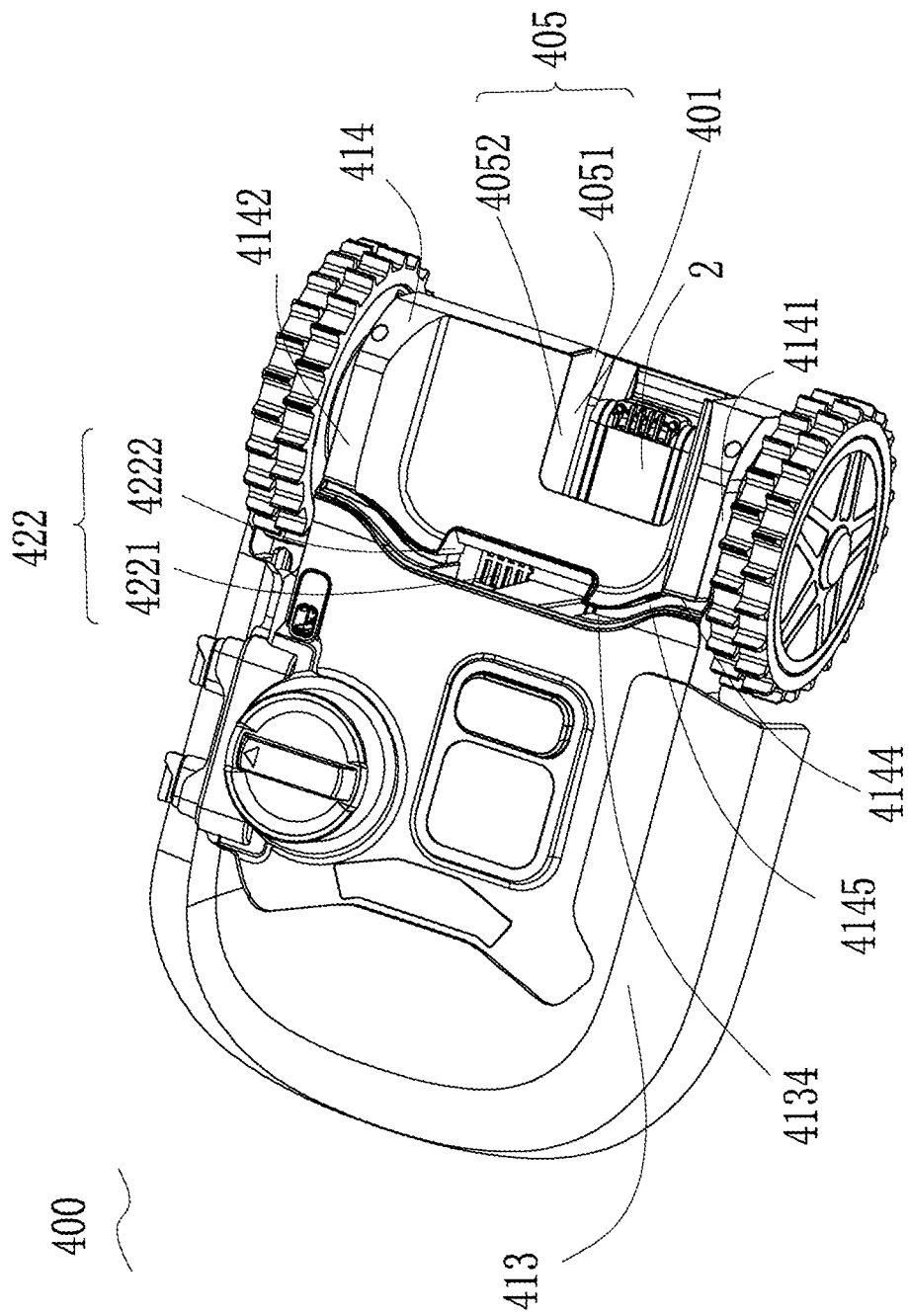
FIG. 39 is a three-dimensional view when the protective cover of the self-moving device shown in FIG. 35 is removed.

In this embodiment, the drainage system 420 further includes a water-stop wall 424 located in front of the inlet 405 to stop water from entering the inlet 405. Specifically, the water-stop wall 424 is disposed between a lower thermal insulation body 5602 and the protective cover 430. As shown in FIG. 41, the water-stop wall 424 includes a plurality of lower water-stop walls 4241 formed protruding outward from an upper surface of the lower thermal insulation body 5602 and a plurality of upper water-stop walls 4242 extending from a lower end of the protective cover 430. The water-stop wall 424 extends in a transverse direction. The transverse direction is a width direction of the self-moving device 400, that is, a travel direction perpendicular to the self-moving device 400. The water-stop wall 424 extending in the transverse direction includes the water-stop wall 424 extending in parallel to a width direction, that is, the water-stop wall 424 completely extends in the transverse direction, and also includes the water-stop wall 424 having a component extending in the transverse direction. In the self-moving device 400, the water-stop wall 424 extending in the transverse direction is disposed, and an outer edge of the water-stop wall 424 protrudes outward from a corresponding position of the inlet 405, so that when water flows from the middle of the body to the outside of the body, that is, when water flows from front to rear in the travel direction of the self-moving device 400, the water is blocked by a plurality of water-stop walls 424. Every water-stop wall 424 somewhat reduces a flow speed and a flow amount of water. When more water-stop walls 424 are disposed, the flow speed and flow amount of water become smaller. In an embodiment, as shown in FIG. 41, a water-stop wall at an inlet may be disposed near the inlet 405. For example, the water-stop wall is formed protruding upward from a preset distance in front of the inlet 405. Alternatively, the water-stop wall 424 is directly formed protruding upward from the circumference of the inlet 405, and a plurality of front water-stop walls are disposed in front of the water-stop wall at an inlet to reduce a water flow. Alternatively, as shown in FIG. 39, the water-stop wall 424 may be disposed on a side, near the inlet 405, of the pivot portion drainage groove 422. Certainly, in other embodiments, the water-stop wall 424 may be disposed in another position between the inlet 405 and the pivot portion drainage groove 422 according to an actual case, provided that a barrier can be established in front of the inlet 405 to stop water to prevent water from flowing into the inlet 405.

In the foregoing embodiment, the protective cover 430 configured to operably block the inlet 405 to prevent water from entering the accommodating cavity 401 and the drainage system 420 configured to drain water to prevent water from entering the accommodating cavity 401 are added, to prevent water from entering the accommodating cavity 401. In this embodiment, by means of a drainage structure design, water can be discharged to prevent water from entering the accommodating cavity. In the foregoing embodiment, the seal ring may further be added at a position where the protective cover 430 fits the inlet 405, to further enhance water-proof and dust-proof effects by using a seal. In this embodiment, the drainage system 420 is added to discharge water from the drainage system 420 in advance, to effectively prevent a large amount of water from accumulating around the inlet 405, thereby preventing water from permeating into the accommodating cavity 401, so as not to damage the energy module 2 and other electrical components in the accommodating cavity 401.

In a specific embodiment, the self-moving device 200 further includes a detection module and a corresponding control structure. As shown in FIG. 25 to FIG. 29, the self-moving device 200 further includes a detection module configured to detect one or two of the temperature or humidity of the energy module 2 and a control module. The detection module detects one or two of the temperature or humidity of the energy module 2, to obtain a detection result. The control module controls a working status of the self-moving device according to the detection result. The detecting the temperature or humidity of the energy module includes directly detecting or indirectly detecting the temperature or humidity of the energy module 2. The indirectly detecting the temperature or humidity of the energy module 2 is detecting a parameter related to the humidity or temperature of the energy module 2, for example, detecting the temperature or humidity of an environment in which the energy module 2 is located, or detecting the temperature or humidity in the accommodating cavity 203 accommodating the energy module 2, to obtain the temperature or humidity of a working environment of the energy module 2, or detecting the temperature or humidity of a structure or in a specific position near the energy module 2 or the like.

Figure 27:
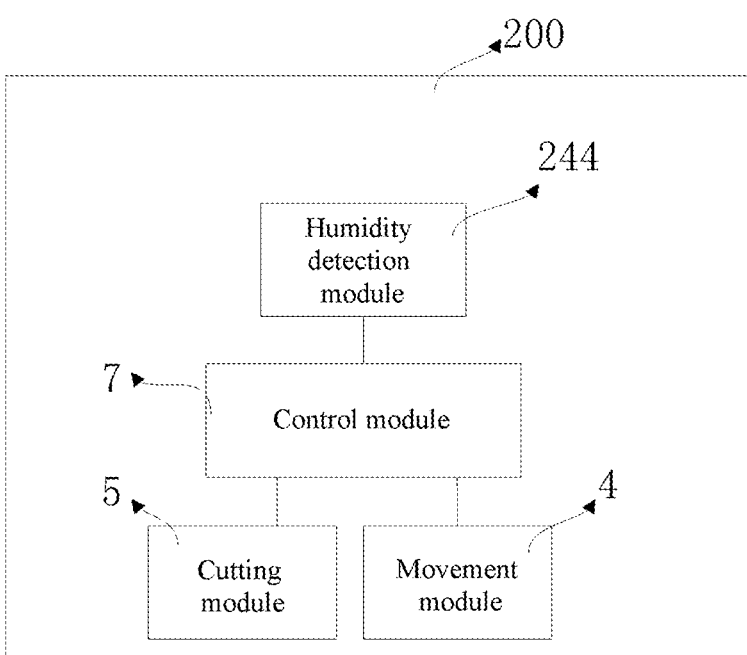
FIG. 27 is a schematic modular diagram when a self-moving device has a humidity detection module according to an embodiment of the present invention.

As shown in FIG. 27, in another embodiment, the detection module is a humidity detection module 244. The self-moving device 200 presets a humidity threshold. If the humidity detected by the humidity detection module 244 exceeds the humidity threshold, the control module 7 controls the energy module not to supply power. If the humidity detected by the humidity detection module 244 does not exceed the humidity threshold, the control module 7 controls the energy module to supply power. In this embodiment, the humidity detection module 244 may be a polymer resistive sensor. In other embodiments, the humidity detection module 244 may be another sensor or another structure. In a specific embodiment, the self-moving device 200 further includes a drying apparatus. When the humidity detected by the humidity detection module exceeds the humidity threshold, the drying apparatus dries the energy module 2 and the environment in which the energy module 2 is located to reduce humidity. In this embodiment, when the humidity detection module 244 and the corresponding control structure thereof are added, in one aspect, it may be automatically detected whether water enters the energy module 2 and the environment in which the energy module 2 is located to make the humidity exceed the humidity threshold, and in another aspect, when it is detected that the humidity exceeds the humidity threshold, the drying apparatus may further be used to dry the energy module 2 and the environment in which the energy module 2 is located, to reduce the humidity, thereby further enhancing a water-proof effect.

As shown in FIG. 25 to FIG. 29 and FIG. 44 to FIG. 51, in a specific embodiment, the self-moving device 200 further includes a temperature protection apparatus 245 configured to perform temperature protection on the energy module in the self-moving device 200 and the environment in which the energy module is located. Because the self-moving device 200 is in an outdoor working environment, the temperature of the energy module 2 may rapidly increase under sunlight. If the temperature is excessively high, the energy module 2 or the self-moving device 200 may be damaged. Therefore, the energy module 2 is usually sealed at the bottom of the self-moving device 200 to reduce the impact of sunlight on the energy module 2, thereby preventing the temperature of the energy module 2 from rapidly increasing. Next, in this embodiment, the energy module 2 is selectively configured to supply power to another electric tool. If the energy module 2 is sealed at the bottom of the self-moving device 200, it is not convenient for a user to rapidly fetch or mount the energy module, resulting in poor user experience. Therefore, it is necessary to design the self-moving device 200 that enables the user to conveniently and rapidly fetch and mount the energy module 2 and is not susceptible to outdoor sunlight. In this embodiment, the temperature protection apparatus that performs temperature protection on the energy module 2 and the environment in which the energy module 2 is located is added, thereby reducing the impact of outdoor sunlight on the energy module 2, to avoid cases such as that the energy module 2 does not work at a high temperature or even the energy module 2 or the self-moving device 200 is damaged at a high temperature. Specifically, the temperature protection may be active protection. For example, a thermal insulation structure is added to directly reduce the impact of the sun on the energy module 2. Alternatively, the temperature protection may be passive protection. For example, the temperature of the energy module 2 and the temperature in the environment in which the energy module 2 is located are adjusted, or a discharging speed of the energy module 2 is adjusted, or the status of the energy module 2 is directly controlled or the status of the self-moving device 200 is controlled. Certainly, specific manners of active protection and passive protection are not limited to the foregoing manners. The foregoing manners are only examples. In other embodiments, other manners may be used to perform temperature protection.

Specifically, the self-moving device 200 may implement passive temperature protection by using the following specific implementation. In an embodiment, the temperature protection apparatus 245 may use a mechanical structure to adjust the temperature of the energy module 2 to perform temperature protection. Specifically, as shown in FIG. 28 and FIG. 29, the temperature protection apparatus 245 includes a temperature adjustment apparatus 2430 configured to adjust the temperature of the energy module 2 or the environment in which the energy module 2 is located. Specifically, the temperature adjustment apparatus 2430 is disposed in the accommodating cavity 203, to adjust the temperature in the accommodating cavity 203 to adjust the temperature of the energy module 2 and the temperature in the environment in which the energy module 2 is located. Specifically, in an embodiment, as shown in FIG. 29, the temperature adjustment apparatus is a fan 2431. The self-moving device 200 further includes the fan 2431 disposed in the accommodating cavity 203. The fan may be used to cool the accommodating cavity 203 to reduce the temperature of the energy module 2 and the temperature in the environment in which the energy module 2 is located. The temperature adjustment apparatus 2430 may further include a heat dissipation hole 2432 added in the wall portion 204 to accelerate heat dissipation. In this embodiment, the fan 2431 is used to implement forced convection of air, and the heat dissipation hole is used to implement convection between air inside the accommodating cavity 203 and ambient air, to implement heat dissipation. A passage for the convention between the air inside the accommodating cavity 203 and the ambient air may also be referred to as an air duct. The heat dissipation hole may also be referred to as an air duct opening. Specifically, in this embodiment, the fan is disposed in any position near the air duct, for example, disposed near the air duct opening. A projection of a working area that is formed through the rotation of blades of the fan on the energy module 2 covers the energy module 2. Specifically, the fan may blow air right toward the energy module 2 to accelerate heat dissipation of the energy module 2. A wind guide passage configured to guide wind is provided between the fan and the energy module 2. Specifically, the wind guide passage is formed by a plurality of wind guide boards that are disposed in the accommodating cavity 203. The self-moving device 200 further includes a heat dissipation motor configured to drive the fan. The heat dissipation motor is controlled by the control module 7 to work. Certainly, the fan may be driven by the walking motor or the cutting motor to work instead of separately arranging the heat dissipation motor.

In another embodiment, as shown in FIG. 28, the temperature adjustment apparatus may be another cooling material such as a phase change material or a semiconductor cooling sheet. The cooling material is used to cool the accommodating cavity 203, to reduce the temperature of the energy module 2 and the temperature in the environment in which the energy module 2 is located. In another embodiment, the temperature adjustment apparatus 2430 may be another heating material such as a heating sheet. The heating sheet is heated to rapidly increase the temperature of the energy module 2 and the temperature in the environment in which the energy module 2 is located.

Figure 26:
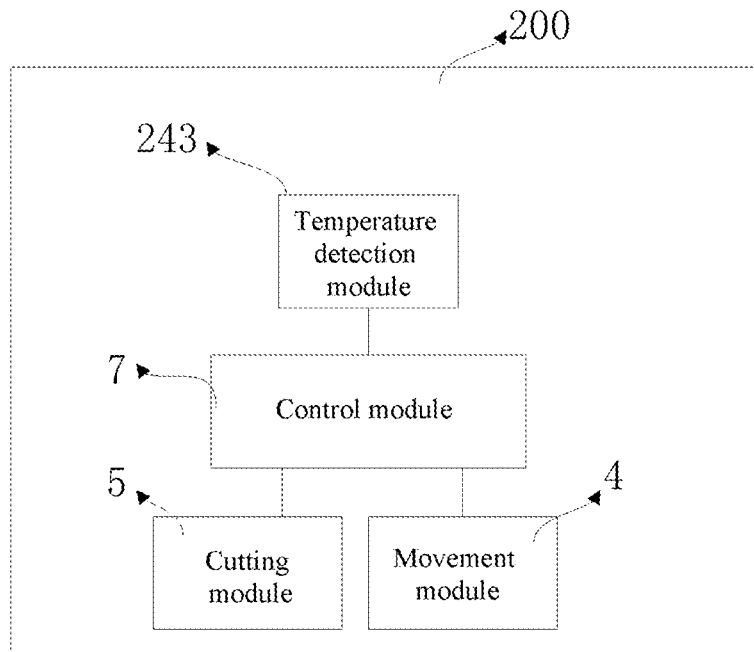
FIG. 26 is a schematic modular diagram when a self-moving device has a temperature detection module according to an embodiment of the present invention.

In another embodiment, the temperature protection apparatus 245 may further use an automatic control manner to implement temperature protection. For example, the automatic control manner is used to adjust the temperature of the energy module 2 and the temperature in the environment in which the energy module 2 is located, or the status of the self-moving device 200 is automatically controlled to protect the energy module 2 or the self-moving device 200 from damage due to a high temperature to implement temperature protection. A manner of using automatic control to implement temperature protection includes completely using automatic control to implement temperature protection, combining automatic control and a mechanical structure manner to implement temperature protection, and the like. Specifically, as shown in FIG. 26, FIG. 28, and FIG. 29, the temperature protection apparatus 245 further includes a temperature detection module and a corresponding control structure. As shown in FIG. 26, the self-moving device 200 further includes a temperature detection module configured to detect the temperature of the energy module 2 and a control module. The temperature detection module detects the temperature of the energy module 2 to obtain a detection result. The control module controls a working status of the self-moving device according to the detection result. The detecting the temperature of the energy module includes directly detecting or indirect detecting the temperature of the energy module 2. The indirect detecting the temperature of the energy module 2 is detecting a parameter related to the temperature of the energy module 2, for example, detecting the temperature in the environment in which the energy module 2 is located, or detecting the temperature in the accommodating cavity 203 accommodating the energy module 2, to obtain the temperature in the working environment of the energy module 2, or detecting the temperature of a structure or in a specific position near the energy module 2. The working status of the self-moving device includes whether the self-moving device is turned on, a status of the self-moving device after being turned on, whether the self-moving device is working, the working status of the self-moving device, and the like.

Specifically, automatic control is used to perform temperature protection in various manners. For example, in an embodiment, automatic control may be used to increase or reduce the temperature of the energy module 2, to implement temperature protection. As shown in FIG. 28, the temperature protection apparatus 245 further includes a temperature adjustment apparatus 2430. The control module controls the temperature adjustment apparatus 2430 according to a temperature detected by the temperature detection module to adjust the temperature of the energy module. The temperature adjustment apparatus 2430 adjusting the temperature of the energy module 2 includes directly adjusting the temperature of the energy module 2 and indirectly adjusting the temperature of the energy module 2. The indirectly adjusting the temperature of the energy module 2 includes adjusting the temperature in the environment in which the energy module 2 is located to indirectly adjust the temperature of the energy module 2. Specifically, a temperature range is preset, and when a temperature detection module 243 detects that the temperature exceeds the temperature range, the temperature adjustment apparatus 2430 is started. The temperature range includes a cooling threshold and a heating threshold. The cooling threshold is greater than the heating threshold. When the temperature detected by the temperature detection module 243 is greater than the cooling threshold, the control module 7 controls the temperature adjustment apparatus 2430 to reduce the energy module 2 or the temperature in the environment in which the energy module 2 is located. When the temperature detected by the temperature detection module 243 is less than the heating threshold, the control module 7 controls the temperature adjustment apparatus 2430 to increase the energy module 2 or the temperature in the environment in which the energy module 2 is located. Specifically, as shown in FIG. 29, the temperature adjustment apparatus is a fan 2431. The self-moving device presets the cooling threshold. When the temperature detected by the temperature detection module 243 is greater than the cooling threshold, the control module controls the fan to be started to cool the energy module 2 and the environment in which the energy module 2 is located. Moreover, the heat dissipation hole 2432 may be added to the wall portion 204 to accelerate heat dissipation. In another embodiment, the temperature adjustment apparatus 2430 may be another cooling material such as a phase change material or a semiconductor cooling sheet. When the temperature detected by the temperature detection module 243 is greater than the cooling threshold, the control module controls the cooling material to perform cooling to reduce the temperature of the energy module 2 and the temperature in the environment in which the energy module 2 is located. In another embodiment, the temperature adjustment apparatus 2430 may be another heating material such as a heating sheet. When the temperature detected by the temperature detection module 243 is less than the heating threshold, the control module controls the self-moving device to heat the heating sheet, to rapidly increase the temperature of the energy module 2 and the temperature in the environment in which the energy module 2 is located.

In another embodiment, the status of the self-moving device 200 may be automatically controlled to avoid damage to the energy module 2 or the self-moving device 200 due to a high temperature. Specifically, the self-moving device 200 includes a charging mode and a standby mode. In the charging mode, the self-moving device 200 is docked to the charging station to perform charging. In this embodiment, the charging mode includes an automatic-return charging mode and a non-automatic-return charging mode. In the automatic-return charging mode, the self-moving device 200 automatically returns to the charging station and is docked to the charging station to perform charging. Specifically, an electric power threshold may be preset. When it is detected that the electric power in the energy module 2 is less than the electric power threshold, the self-moving device 200 automatically returns to perform charging. In the non-automatic-return charging mode, the self-moving device 200 non-automatically returns to the charging station and is docked to the charging station to perform charging. Specifically, for example, a user uses a button or a remote control to control the self-moving device 200 to return to perform charging or takes the self-moving device 200 back to the charging station to dock the self-moving device 200 to the charging station to perform charging. As shown in FIG. 26, the self-moving device 200 presets a standby temperature threshold. When the temperature detected by the temperature detection module 243 exceeds the standby temperature threshold, the control module 7 controls the self-moving device 200 to enter the standby mode. In the standby mode, the self-moving device 200 stops charging, and the control module 7 turns off some components in the self-moving device 200. In other words, the energy module 2 does not supply power to some components in the self-moving device 200. For example, the energy module 2 may supply power to only the smallest micro control unit but stops supplying power to various sensors and the like. In this embodiment, when the self-moving device 200 normally works, the discharging current of the energy module 2 is 100 mA. When the energy module 2 is in a standby state, the energy module 2 stops supplying power to structures other than the smallest micro control unit, so that the discharging current of the energy module 2 is 10 mA. In one aspect, in the standby mode, the energy module 2 keeps supplying power to the smallest micro control unit, so that the self-moving device 200 still keeps some functions to perform some tasks. For example, when the temperature of the energy module 2 drops within the preset temperature range, the self-moving device 200 may be automatically woken up to restart the normal working mode. In another aspect, a discharging speed of the energy module 2 is reduced when the energy module 2 is not charged, thereby reducing the risk of damage to the energy module 2 due to excessive discharge.

The foregoing two technical solutions of using automatic control to perform temperature protection, that is, the solution in which the self-moving device 200 is controlled to enter the standby mode when the temperature of the energy module 2 exceeds the standby temperature threshold and the technical solution in which the self-moving device 200 is controlled to start the temperature adjustment apparatus when the temperature of the energy module 2 exceeds the temperature range may be combined with each other or may be separately implemented. If the foregoing two solutions are combined, when the self-moving device 200 enters a standby state, the temperature adjustment apparatus may be used to cool the energy module 2 and the environment in which the energy module 2 is located, to reduce the temperature below the standby threshold, and the self-moving device 200 is then woken up, so that the self-moving device 200 continues to work in a normal working mode. Certainly, only examples are provided in the foregoing. A specific combination manner may be set according to an actual case.

Figure 30:
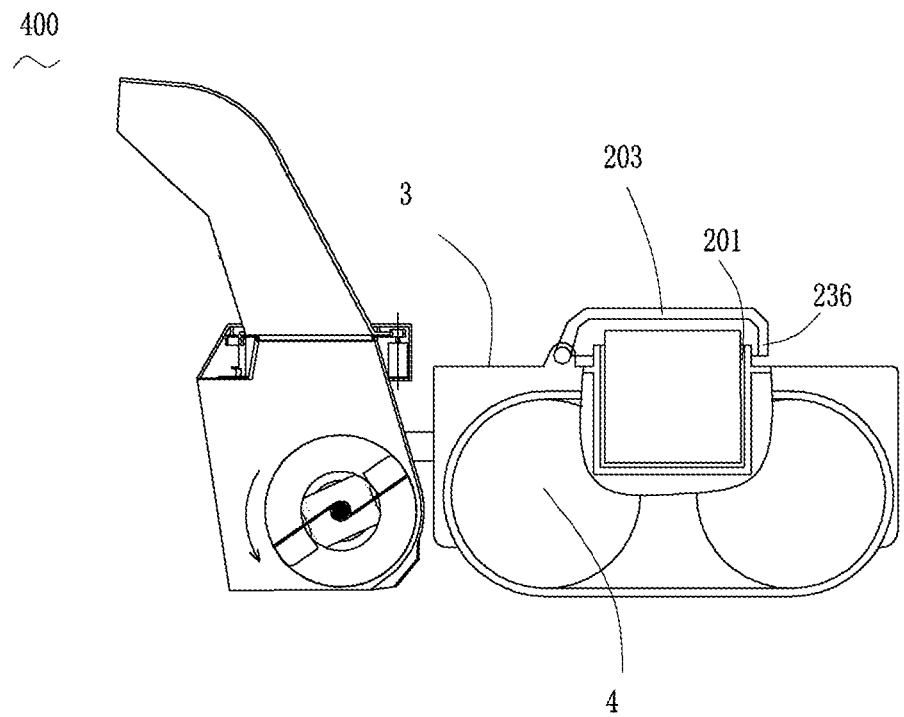
FIG. 30 is a front view of a self-moving device according to an embodiment of the present invention.

In the foregoing embodiment, for example, the self-moving device is a robotic lawnmower. In other embodiments, the self-moving device may be an automatic leaf blower, an automatic water sprinkler, a multifunctional machine, an automatic snowplow, a robot cleaner or the like. For example, as shown in FIG. 30, in an embodiment, the self-moving device 400 is an automatic snowplow. The self-moving device 400 includes a housing 3, a movement module 4, a snow removal module, a control module 7, and the like. In this embodiment, for all the structures of the automatic snowplow, reference may be made to a robotic lawnmower design. Because the automatic snowplow works in a low-temperature working environment, the temperature adjustment apparatus 2430 may be disposed as a heating material according to an actual case. The temperature adjustment apparatus 2430 is automatically heated until the temperature of the energy module 2 is increased to enter the preset temperature range. The control module controls the energy module 2 to supply power, and the automatic snowplow starts to perform work.

In another embodiment, in addition to the foregoing passive protection manner to implement temperature protection, the self-moving device may use an active manner to implement temperature protection. As shown in FIG. 40 to FIG. 51, a self-moving device 500 includes a temperature protection apparatus 245. The temperature protection apparatus 245 includes a thermal insulation body 560 located above a protective cover 530 and/or located between the protective cover 530 and an accommodating cavity 501. A difference between this embodiment and the foregoing embodiment lies in that the thermal insulation body 560 is added. Other structures are the same as those in the foregoing embodiments. Details are not described one by one again herein.

In this embodiment, the self-moving device 500 includes a body 510, a movement module 4 configured to drive the self-moving device 500 to move, a task execution module configured to perform a work task, and a control module 7 configured to control the self-moving device 500 to move and walk inside a defined working area. The movement module 4 and the control module 7 are disposed on the body 510. The control module 7 controls the movement module 4 to drive the self-moving device 500 to move inside the defined working area, and at the same time controls the task execution module to perform the work task inside the defined working area. In this embodiment, the self-moving device 500 is an automatic mower. The task execution module of the automatic mower is a cutting module 5. In other embodiments, the self-moving device 500 may be an automatic leaf blower, an automatic water sprinkler, a multifunctional machine, an automatic snowplow, a robot cleaner or the like. The task execution module of the self-moving device 500 is a task execution module that performs a corresponding work task. For example, when the self-moving device 500 is an automatic snowplow, the task execution module of the self-moving device 500 is a snow removal module.

The automatic working system 100 further includes an energy module 2 configured to supply power to the self-moving device 500. The energy module 2 may selectively supply power to the self-moving device 500 or supply power to another electric device. The another electric device is an electric device other than the self-moving device 500, and is, for example, an electric tool, a home appliance or the like. In this embodiment, the energy module 2 may selectively supply power to the self-moving device 500 or another electric tool. The another electric tool is an electric tool other than the self-moving device 500, and is, for example, a gun drill, a hammer drill, a trimmer or a hand-propelled lawnmower. In this embodiment, the self-moving device 500 is powered by the detachable energy module 2. Specifically, the detachable energy module is a detachable battery pack that supplies power to an electric tool such as a gun drill, a hammer drill, a trimmer or a hand-propelled lawnmower. The detachable energy module means that the energy module 2 is detachably assembled on the body 510. "Detachably" means that the energy module 2 can be directly detached without needing to remove a fastener such as a screw, a nut or a pin. For example, the energy module 2 is docked to the self-moving device 500 by a connector, a wireless charging interface or the like, so that the energy module 2 and the self-moving device 500 are conveniently undocked, to implement fast insertion. Certainly, in other embodiments, a protective cover or the like fastened to the body 510 may be disposed outside the energy module 2, or even the protective cover and the body are fastened by a fastener such as a screw, a nut or a pin. The energy module 2 is "detachable" provided that fast insertion of the energy module 2 in the self-moving device 500 can be implemented. The self-moving device 500 includes an accommodating cavity 501 configured to accommodate the energy module 2. The accommodating cavity 501 is provided with an inlet 505 to make it convenient to insert or pull out the energy module 2.

The thermal insulation body 560 is disposed above the protective cover 530 and/or is disposed between the protective cover 530 and the accommodating cavity 501. A thermal insulation space 561 is provided between the thermal insulation body 560 and the protective cover 530, to improve a thermal insulation effect. The thermal insulation space 561 is a space located between the thermal insulation body 560 and the protective cover 530. The thermal insulation space 561 is added between the thermal insulation body 560 and the protective cover 530, so that the accommodating cavity 501 is provided with two layers of a thermal insulation substance, that is, the thermal insulation body 560 and the protective cover 530, disposed at an interval. For example, when the thermal insulation body 560 is located between the protective cover 530 and the accommodating cavity 501, in one aspect, the thermal insulation space 561 is used to increase the height of the protective cover 530, so that the distance between the protective cover 530 that is directly exposed to the sun and the accommodating cavity 501 is increased, thereby reducing the impact of sunlight on the accommodating cavity 501. In another aspect, after the protective cover 530 and the accommodating cavity 501 are separated by the thermal insulation space 561, the thermal insulation body 560 is added. The protective cover 530 is used to block sunlight, to enable the thermal insulation body 560 to perform secondary thermal transfer, to prevent the direct impact of the sun on the thermal insulation body 560 closest to the accommodating cavity 501, thereby greatly improving a thermal insulation effect. It is similar when the thermal insulation body 560 is disposed above the protective cover 530. In one aspect, the thermal insulation space 561 is used to increase the height of the thermal insulation body 560, so that the distance between the thermal insulation body 560 that is directly exposed to the sun and the accommodating cavity 501 is increased, thereby reducing the impact of sunlight on the accommodating cavity 501. In another aspect, the thermal insulation body 560 is used to block sunlight, to enable the protective cover 530 to perform the secondary thermal transfer, to prevent the direct impact of the sun on the protective cover 530 closest to the accommodating cavity 501, thereby greatly improving a thermal insulation effect. Moreover, this embodiment also has advantages of saving materials, reducing manufacturing costs, reducing the weight of the entire device, and the like.

Figure 46:
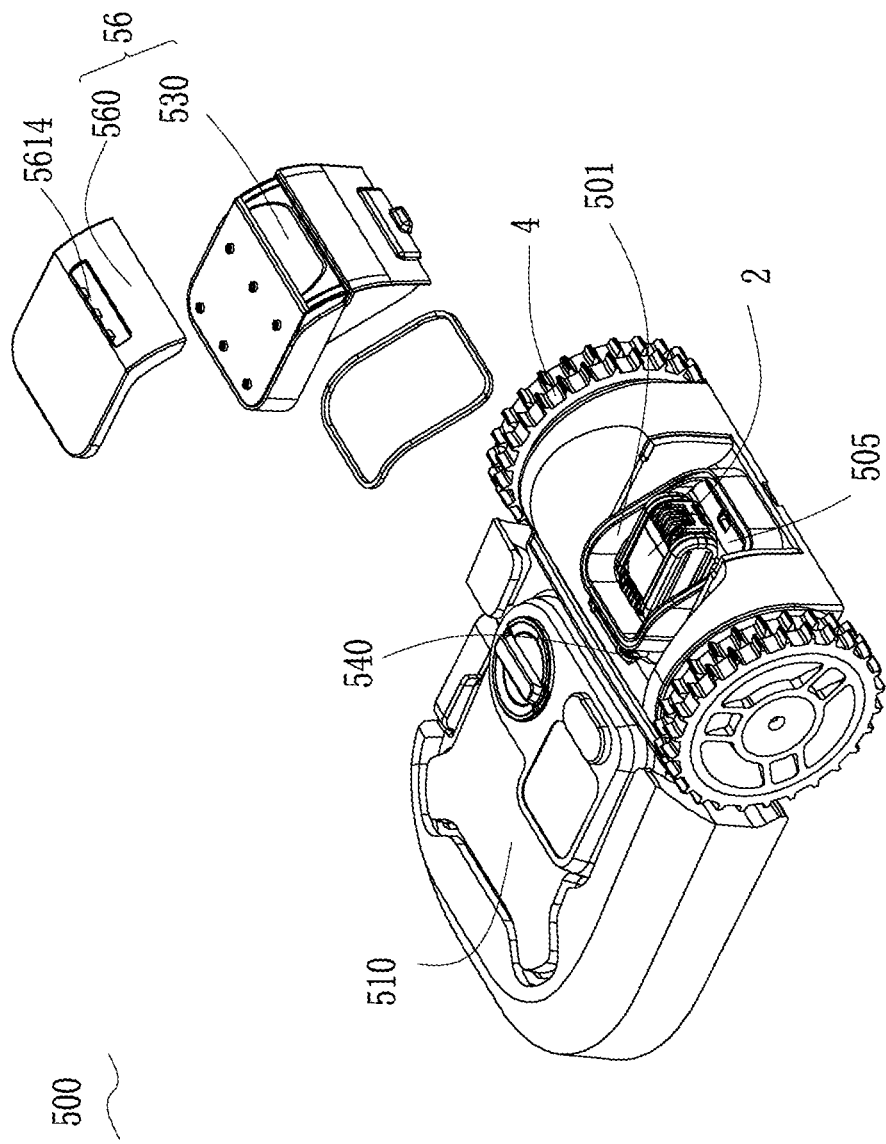
FIG. 46 is a partial exploded view of a self-moving device according to an embodiment of the present invention.
Figure 47:
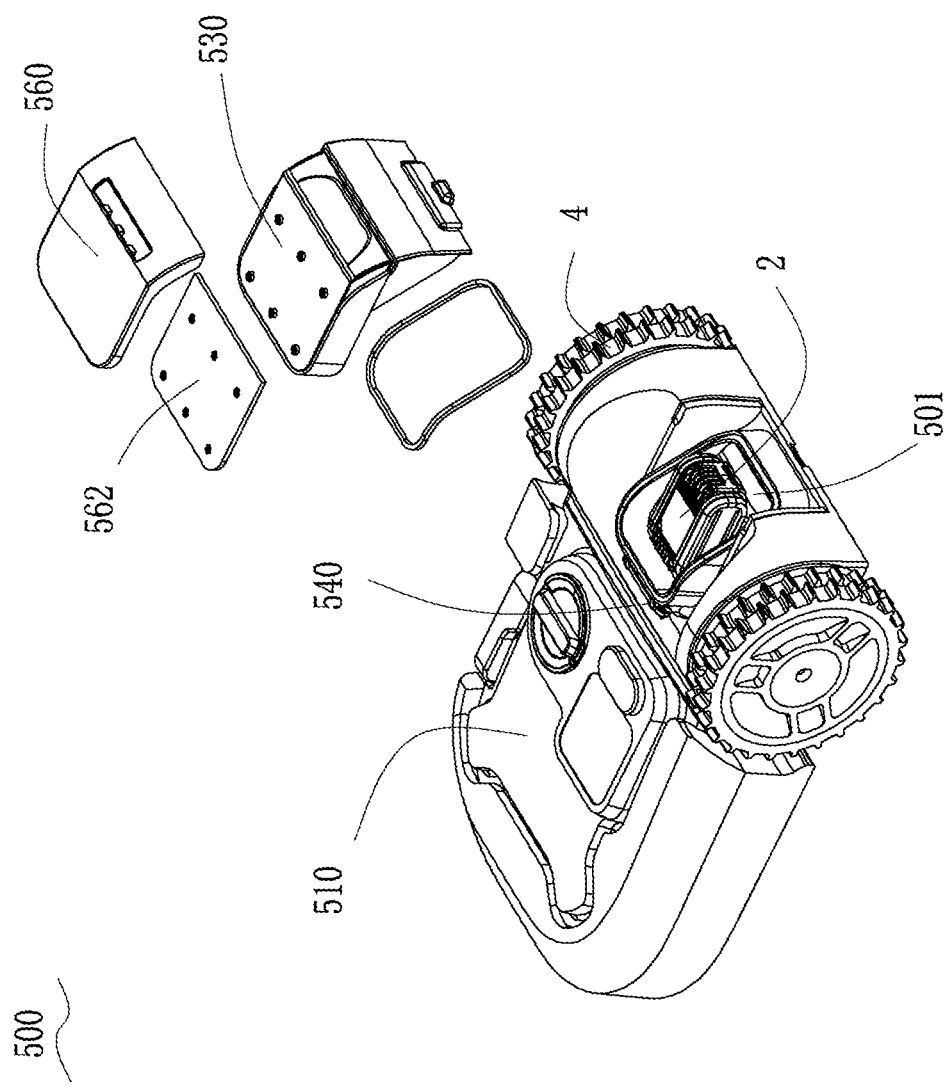
FIG. 47 is a further exploded view of the self-moving device shown in FIG. 46.
Figure 48:
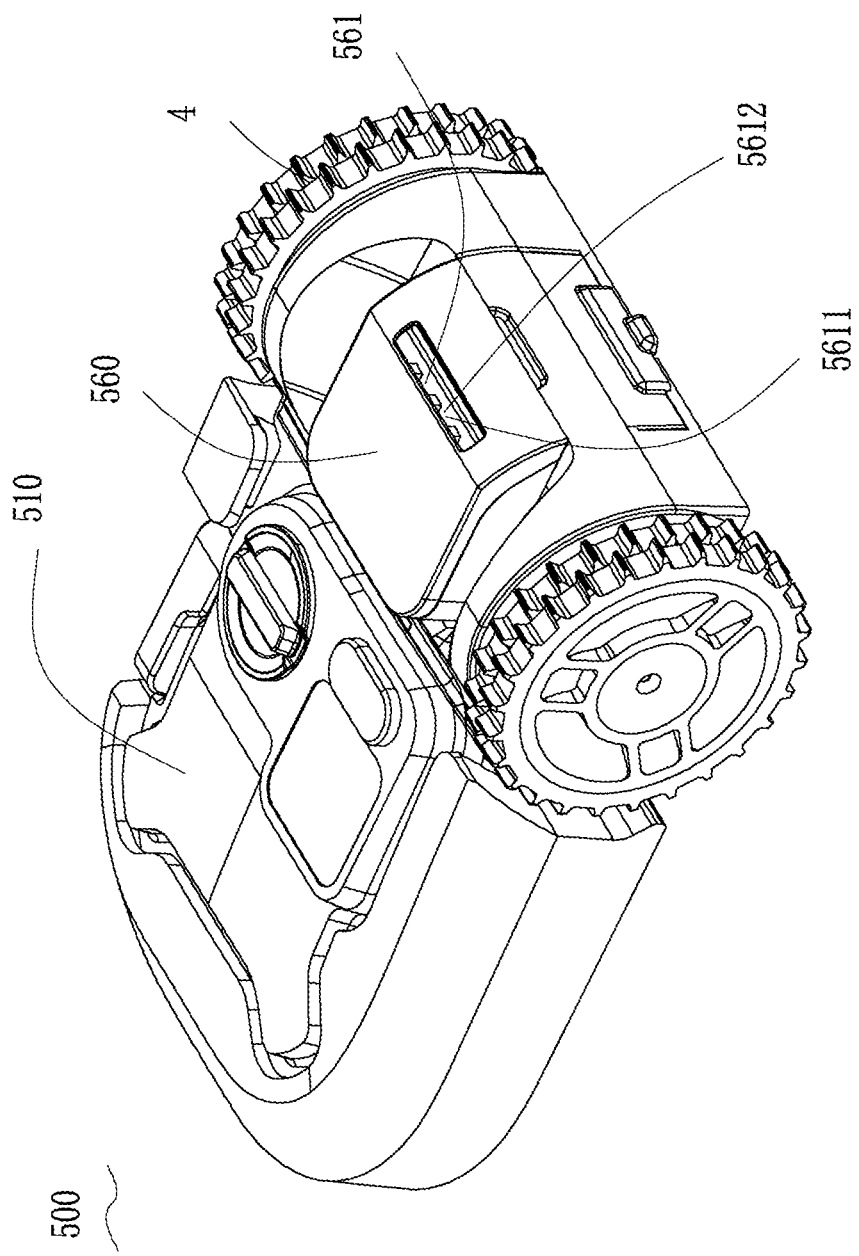
FIG. 48 is an assembled view of the self-moving device shown in FIG. 46.
Figure 49:
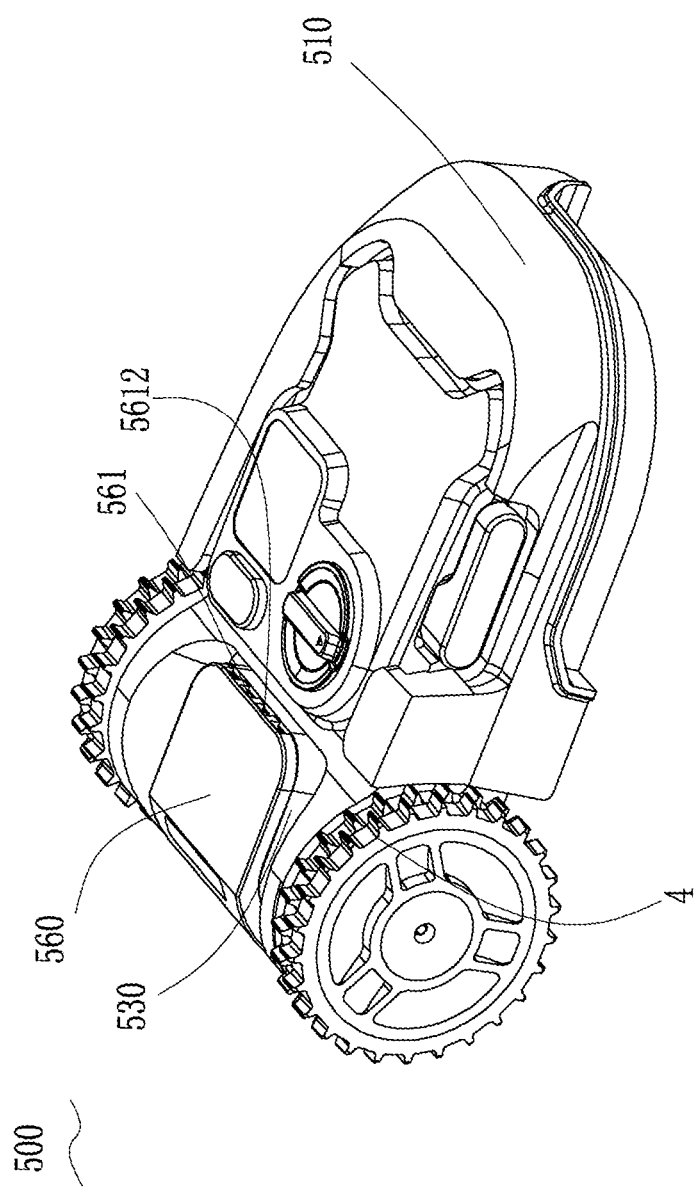
FIG. 49 is a view of the self-moving device shown in FIG. 48 from another angle.
Figure 50:
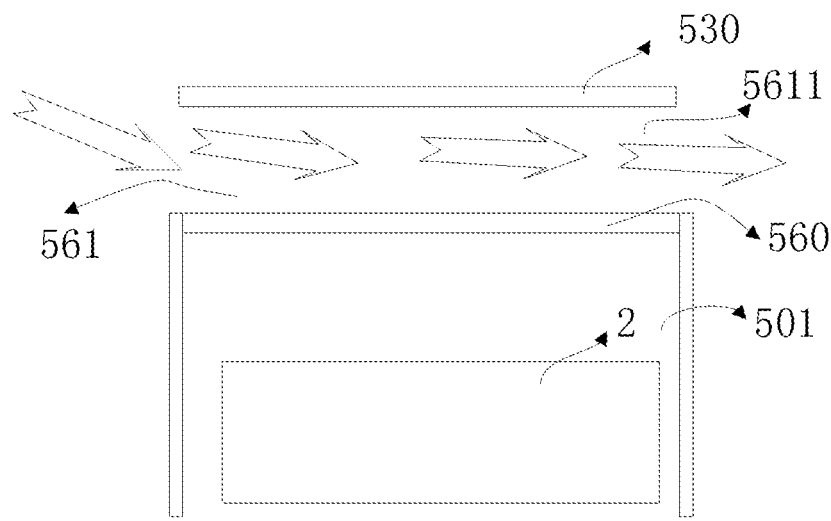
FIG. 50 is a schematic diagram of convection between air inside a thermal insulation space and ambient air according to an embodiment of the present invention.

In an embodiment, as shown in FIG. 46 to FIG. 49, the thermal insulation body 560 and the protective cover 530 are disposed together to form an upper cover 56. The upper cover 56 includes a pivot portion 540 connected to the body 510 to enable the upper cover 56 to be rotatable around the pivot portion 540 to implement opening or closing. The thermal insulation body 560 and the protective cover 530 may be integrally formed into one overall upper cover 56 provided with the thermal insulation space 561. Certainly, the thermal insulation body 560 and the protective cover 530 may be separately formed, and the thermal insulation body 560 and the protective cover 530 are then assembled to form the overall upper cover 56. In this embodiment, the thermal insulation body 560 may be disposed above the protective cover 530. Certainly, in another embodiment, as shown in FIG. 50, the thermal insulation body 560 may be disposed below the protective cover 530. As shown in FIG. 48 and FIG. 49, the thermal insulation space 561 includes a penetrating through hole 5611 located between the thermal insulation body 560 and the protective cover 530. Two ends of the through hole 5611 are in communication with ambient air, to use wind pressure and thermal pressure, and in particular, natural ventilation. Natural wind flows through the through hole 5611, to implement convection between the air in the thermal insulation space 561 and ambient air, so as to take away heat that enters the thermal insulation space, thereby reducing the impact of external heat on the accommodating cavity. While the thermal insulation is implemented, a particular heat dissipation effect is further provided. Specifically, the through hole 5611 may penetrate the upper cover 56 in a horizontal direction. For example, as shown in FIG. 48 and FIG. 49, the through hole 5611 penetrates the upper cover 56 in a longitudinal direction. In other embodiments, the through hole 5611 may penetrate the upper cover 56 in a transverse direction. Certainly, in another embodiment, the through hole 5611 may penetrate the upper cover 56 in another direction, provided that the two ends of the through hole 5611 are in combination with the ambient air. Certainly, in other embodiments, the thermal insulation space 561 may not include a penetrating through hole. For example, the thermal insulation space 561 only includes a plurality of (including one) holes with only one end in communication with the outside, or the thermal insulation space 561 only includes a plurality of (including one) spaces that are completely isolated from the outside.

Figure 51:
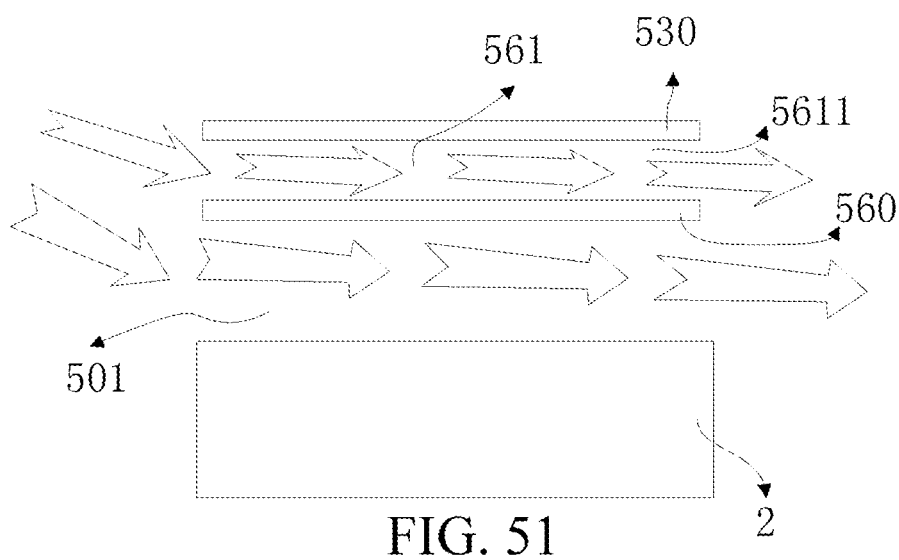
FIG. 51 is a schematic diagram of convection between ambient air and both air inside a thermal insulation space and air inside an accommodating cavity according to an embodiment of the present invention.

As shown in FIG. 50, in an embodiment, for example, the thermal insulation body 560 is located between the protective cover 530 and the accommodating cavity 501. Natural wind may implement convection between the air in the thermal insulation space 561 and ambient air through the through hole 5611, to implement a heat dissipation effect. In another embodiment, as shown in FIG. 51, not only the through hole 5611 is provided between the thermal insulation body 560 and the protective cover 530 to implement air convection, and the through hole may further be provided between the thermal insulation body 560 and the energy module 2. In other words, the accommodating cavity 501 is in communication with ambient air. Natural wind flows through the thermal insulation space above the thermal insulation body 560 to implement convection between air in the thermal insulation space 561 and ambient air, to implement heat dissipation, and also flows through the accommodating cavity 501 below the thermal insulation body 560 to implement convection between the accommodating cavity 501 and ambient air, to implement heat dissipation. In other embodiments, only the accommodating cavity 501 may be in communication with ambient air, and natural wind flows through the accommodating cavity 501 to implement convection between the accommodating cavity 501 and ambient air, to implement heat dissipation.

In this embodiment, the self-moving device 500 further includes a thermal insulation substance 562 located above the energy module 2. The thermal insulation substance 562 may be disposed in the thermal insulation space 561 or may be disposed above the energy module 2 in the accommodating cavity 501. The thermal insulation substance 562 is added to further improve a thermal insulation effect, thereby reducing the impact of sunlight on the energy module 2 and other electrical components in the accommodating cavity 501. Specifically, as shown in FIG. 46 and FIG. 47, the thermal insulation substance 562 may be disposed between the thermal insulation body 560 and the protective cover 530. The thermal insulation substance may be thermal insulation cotton, a thermal insulation coating, another thermal insulation material or the like. The thermal insulation substance is added to the thermal insulation space 561 between the thermal insulation body 560 and the protective cover 530, thereby further improving a thermal insulation effect.

In another embodiment, as shown in FIG. 41, the thermal insulation body 560 and the body 410 may be disposed together. The thermal insulation body 560 may be disposed above the protective cover 430 and/or disposed between the protective cover 430 and the accommodating cavity 401. Specifically, the thermal insulation body 560 may be directly disposed on the body 410 and is a part of the body 410 as shown in FIG. 41. Alternatively, the thermal insulation body 560 may be separately formed and is then assembled on the body 410. Certainly, in other embodiments, a specific position of the thermal insulation body 560 may be set according to an actual case. For example, the thermal insulation body 560 may be disposed in another position between the thermal insulation body 560 and the protective cover 410. Examples are not provided one by one herein. As shown in FIG. 41, in an embodiment, the thermal insulation body 560 is directly disposed on the body 410 and is a part of the body 410. The thermal insulation body 560 is disposed between the protective cover 430 and the accommodating cavity 401. The body 410 includes a base 418 and the thermal insulation body 560 extending from the base 418. The thermal insulation body 560 and the base 418 define the accommodating cavity 401 together. The thermal insulation body 560 covers the accommodating cavity 401 from above and is located between the accommodating cavity 401 and the protective cover 430. The thermal insulation body 560 is formed protruding upward from the middle portion of the base 418. The thermal insulation body 560 includes a thermal insulation top wall 563 located right above the accommodating cavity 401 and a thermal insulation side wall 564 connected between the thermal insulation top wall 563 and the base 418.

In another embodiment, the embodiment in which the thermal insulation body 560 is disposed on the protective cover 530 and the embodiment in which the thermal insulation body 560 is disposed between the protective cover 430 and the accommodating cavity 401 may be combined. That is, the thermal insulation body 560 is disposed above the protective cover 430, and the thermal insulation body 560 is disposed between the protective cover 430 and the accommodating cavity 401. In other words, the self-moving device 500 includes the thermal insulation body 560 disposed above the protective cover 430 and the thermal insulation body 560 disposed between the protective cover 430 and the accommodating cavity 401. For a specific structure of the thermal insulation body 560, reference may be made to the embodiment in which the thermal insulation body 560 is disposed on the protective cover 530 and the embodiment in which the thermal insulation body 560 is disposed between the protective cover 430 and the accommodating cavity 401. Details are not described one by one again herein.

Figure 40:
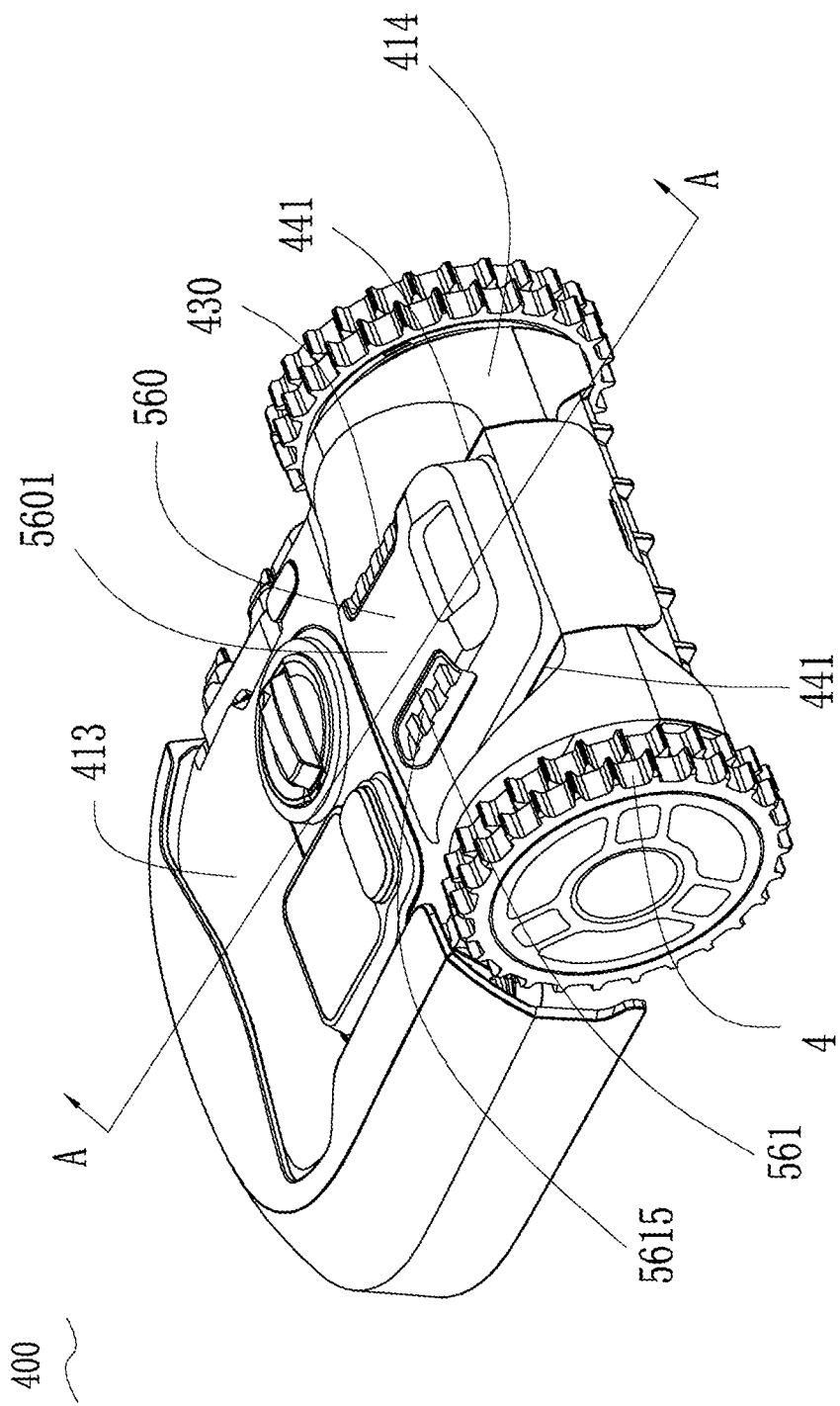
FIG. 40 is a three-dimensional view when a protective cover of a self-moving device is in a closed state according to an embodiment of the present invention.
Figure 45:
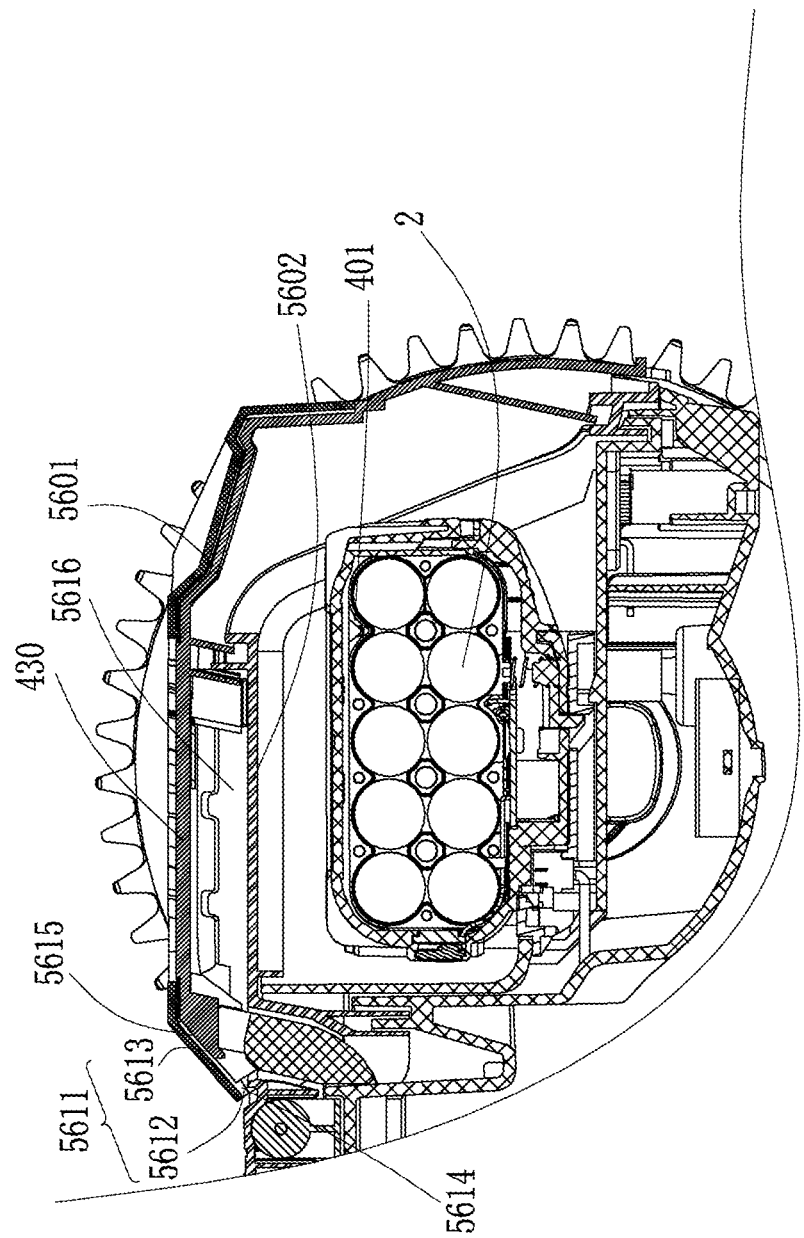
FIG. 45 is a partial enlarged view of a sectional view of the self-moving device shown in FIG. 40 along a line A-A.

In an embodiment, as shown in FIG. 40, FIG. 41, FIG. 44, and FIG. 45, the thermal insulation body 560 includes an upper thermal insulation body 5601 disposed above the protective cover 430 and a lower thermal insulation body 5602 disposed between the protective cover 430 and the accommodating cavity 401. The upper thermal insulation body 5601 and the protective cover 430 are disposed together. The lower thermal insulation body 5602 and the body 410 are disposed together. Specifically, the upper thermal insulation body 5601 and the protective cover 430 are assembled to form an upper cover 56, and the thermal insulation space 561 is provided between the upper thermal insulation body 5601 and the protective cover 430. The thermal insulation space 561 includes a plurality of through holes 5611 penetrating the upper cover 56. The through hole 5611 includes a plurality of end openings 5612 in communication with ambient air and a passage 5613 in communication with the plurality of end openings 5612. Specifically, the through hole 5611 may be a longitudinally penetrating or transversely penetrating through hole, for example, a linearly penetrating through hole. That is, the end openings 5612 of the through hole 5611 are located in a same straight line, to linearly penetrate the upper cover 56. In this embodiment, the through hole 5611 may be a non-linearly penetrating through hole. For example, as shown in FIG. 40 and FIG. 45, the end openings 5612 of the through hole 5611 may be not located in a same straight line. The through hole 5611 includes a first end opening 5614 located on a front side of the upper cover 56 and a second end opening 5615 located on a left or right side of the upper cover 56. The first end opening 5614 and the second end opening 5615 may be generally referred to as the end openings 5612. The first end opening 5614 and the second end opening 5615 are in communication with each other, to enable air to flow through the through hole 5611, to take away heat on the surface of the protective cover 430, thereby achieving the thermal insulation and heat dissipation effects.

The lower thermal insulation body 5602 is disposed between the protective cover 430 and the accommodating cavity 401, and the thermal insulation space 561 is provided between the protective cover 430 and the lower thermal insulation body 5602. Specifically, the lower thermal insulation body 5602 may be directly disposed on the body 410 and is a part of the body 410. In one aspect, the thermal insulation space 561 is used to increase the height of the upper cover 56, so that the distance between the upper cover 56 that is directly exposed to the sun and the accommodating cavity 501 is increased, thereby reducing the impact of sunlight on the accommodating cavity 501. In another aspect, the upper cover 56 is used to block sunlight, to enable the lower thermal insulation body 5602 to perform the secondary thermal transfer, to prevent the direct impact of the sun on the lower thermal insulation body 5602 closest to the accommodating cavity 501, thereby greatly improving a thermal insulation effect. In an embodiment, the height of an upper thermal insulation space 5615 between the protective cover 430 and the upper thermal insulation body 5601 in a vertical direction is less than the height of a lower thermal insulation space 5616 between the protective cover 530 and the lower thermal insulation body 5602 in the vertical direction. In one aspect, the upper thermal insulation space 5615 on the upper cover 56 is designed to be relatively small, so that the upper cover 56 has more desirable appearance. In another aspect, the protective cover 430 and the upper thermal insulation body 5601 are combined more tightly, so that the upper cover 56 is more rigid. The lower thermal insulation space 5616 between the protective cover 430 and the lower thermal insulation body 5602 is designed to be relatively large, to increase the interval between the upper cover 56 and the lower thermal insulation body 5602, thereby enhancing a thermal insulation effect. The upper thermal insulation space 5615 and the lower thermal insulation space 5616 may be generally referred to as the thermal insulation space 561. In this embodiment, the thermal insulation body 560 is disposed above the protective cover 430, and the thermal insulation body 560 is disposed between the protective cover 430 and the accommodating cavity 401, to implement double thermal insulation, thereby greatly improving a thermal insulation effect.

In other specific embodiments, the implementation in which the self-moving device is provided with temperature protection and the implementation in which the self-moving device is provided with a water-proof structure may be combined with each other. Specifically, any at least one foregoing embodiment provided with temperature protection and any at least one foregoing embodiment provided with a water-proof structure may be combined. Details are not described one by one again herein.

Specifically, for example, the following implementation provided with temperature protection with the thermal insulation body 560 and the implementation provided with the drainage system are combined, so that the self-moving device 400 can drain water and insulate heat. As shown in FIG. 40 to FIG. 43, the self-moving device 400 includes an accommodating cavity 401 configured to accommodate the energy module 2. The accommodating cavity 401 is provided with an inlet 405 to make it convenient to insert or pull out the energy module 2. The self-moving device 400 further includes a protective cover 430 configured to block the inlet 405 to prevent water from entering the accommodating cavity 401, a drainage system 420 configured to drain water to prevent water from entering the accommodating cavity 401, and the thermal insulation body 560. The protective cover 430 operably blocks the inlet 405. The thermal insulation body 560 is disposed above the protective cover 430, and/or the thermal insulation body 560 is disposed between the protective cover 430 and the accommodating cavity 401. For a specific structure and position of the drainage system 420, reference may be made to the embodiment in which the self-moving device 400 is provided with the drainage system 420. For a specific structure and position of the thermal insulation body 560, reference may be made to the embodiment in which the self-moving device 500 is provided with the thermal insulation body 560. Details are not described one by one again herein.

In an embodiment, as shown in FIG. 40 to FIG. 43, the self-moving device 400 includes a pivot portion 440 configured to connect the protective cover 430 and the body 410. The protective cover 430 is movable around the pivot portion 440 to implement opening or closing of the protective cover 430. Specifically, the protective cover 430 is rotatable around the pivot portion 440 to implement opening or closing of the protective cover 430. The body 410 includes a pivot groove 450 accommodating the pivot portion 440. The drainage system 420 includes a drainage groove 421 in communication with the outside of the self-moving device 400 to drain water outside. The body 410 includes a bearing portion 411 configured to bear the circumference of the protective cover 430. The drainage groove 421 is provided in the bearing portion 411. The drainage groove 421 includes a pivot portion drainage groove 422 in communication with the pivot groove 450. The pivot portion drainage groove 422 includes a drainage hole 4221 in communication with the outside and a connecting groove 4222 connecting the pivot groove 450 and the drainage hole 4221. The drainage hole 4221 is located below the connecting groove 4222, to enable water to flow into the drainage hole 4221 from top to bottom from the connecting groove 4222 to flow out of the drainage hole 4221. In a travel direction, that is, a longitudinal direction, of the self-moving device 400, the drainage groove 421 divides the body 410 into a front portion and a rear portion. The body 410 includes a front body portion 413 located in front of the drainage groove 421 and a rear body portion 414 located behind the drainage groove 421. The left and right ends of the pivot portion drainage groove 422 are not in communication with the rear body portion 414. In other words, the length of the pivot portion drainage groove 422 in a transverse direction is less than the length of the corresponding position of the body 410 in the transverse direction. The transverse direction is a width direction of the self-moving device 400, that is, a direction perpendicular to the travel direction of the self-moving device 400. As shown in FIG. 43, the drainage groove 421 further includes a water leakage hole 425 disposed at the bottom of the accommodating cavity 401 and configured to enable the accommodating cavity 401 to be in communication with the outside of the self-moving device 400. When water accumulates and permeates into the accommodating cavity 401, the water can flow out of the self-moving device 400 through the water leakage hole 425. A water-stop dust-proof apparatus such as a sponge may be disposed on the water leakage hole 425, so that water inside the self-moving device 400 can flow out, and external dust and water can be stopped from entering the self-moving device 400.

As shown in FIG. 40, FIG. 41, FIG. 44, and FIG. 45, the thermal insulation body 560 includes an upper thermal insulation body 5601 disposed above the protective cover 430 and a lower thermal insulation body 5602 disposed between the protective cover 430 and the accommodating cavity 401. The upper thermal insulation body 5601 and the protective cover 430 are disposed together to form an upper cover 56. The lower thermal insulation body 5602 and the body 410 are disposed together. Specifically, the lower thermal insulation body 5602 is directly disposed on the body 410 and is a part of the body 410. The rear body portion 414 includes a base 418 and a lower thermal insulation body 5602 extending from the base 418. The lower thermal insulation body 5602 and the base 418 together define the accommodating cavity 401. The lower thermal insulation body 5602 covers the accommodating cavity 401 from above and is located between the accommodating cavity 401 and the protective cover 430. The lower thermal insulation body 5602 is formed protruding upward from the middle portion of the base 418. The lower thermal insulation body 5602 includes a thermal insulation top wall 563 located right above the accommodating cavity 401 and a thermal insulation side wall 564 connected between the thermal insulation top wall 563 and the base 418. The thermal insulation space 561 is provided between the upper thermal insulation body 5601 and the protective cover 430. The thermal insulation space 561 includes a penetrating through hole 5611. The through hole 5611 includes a plurality of end openings 5612 in communication with ambient air and a passage 5613 in communication with the plurality of end openings 5612. In this embodiment, for example, the thermal insulation body 560 is disposed above the protective cover 430 and between the protective cover 430 and the accommodating cavity 401. In other embodiments, the thermal insulation body 560 may be disposed only above the protective cover 430 above or only between the protective cover 430 and the accommodating cavity 401.

The drainage system 420 further includes a water guide groove 423 disposed on the surface of the body 410 and provided with a bottom. The water guide groove 423 is formed recessing inward from a part of the base 418. Specifically, the water guide groove 423 is provided in a position of the bearing portion 411, to guide water at a connection between the protective cover 430 and the body 410 out of the body 410. In a transverse direction, the water guide groove 423 is located on two sides of the accommodating cavity 401. The body 410 includes a separating wall 5641 disposed between the water guide groove 423 and the accommodating cavity 401. The separating wall 5641 separates the water guide groove 423 from the accommodating cavity 401, to prevent water in the water guide groove 423 from flowing into the accommodating cavity 401. The water guide groove 423 includes a water guide passage 4232 formed recessing inward from the surface of the body and a water guide hole 4231 that enables the water guide passage 4232 to be in communication with the outside of the self-moving device 400. When water passes through the surface of the self-moving device 400, the water may flow into the water guide hole 4231 along the water guide passage 4232 to flow out of the self-moving device 400. Specifically, the protective cover 430 includes a top cover 4304, a lateral protective wall 4301 extending from the top cover 4304 toward the left and right sides, and a rear protective wall 4303 formed extending backward from the top cover 4304. The rear body portion 414 includes a side wall accommodating groove 4144 accommodating the lateral protective wall 4301. The water guide groove 423 is in communication with the side wall accommodating groove 4144, to enable water flowing down along the lateral protective wall 4301 to flow into the water guide groove 423, so that the water is further guided out of the self-moving device 400 by the water guide groove 423. In this embodiment, in a horizontal direction, the bottom of the water guide groove 423 extends to the outside of the body 410 from the middle of the body 410. In a vertical direction, the bottom of the water guide groove 423 extends from top to bottom, so that the water guide groove 423 automatically guides out water from inside. In the transverse direction, the water guide groove 423 is located on two sides of the thermal insulation side wall 564. In this embodiment, the thermal insulation side wall 564 is the separating wall 5641. The thermal insulation side wall 564 is disposed between the water guide groove 423 and the accommodating cavity 401 and is also located between the side wall accommodating groove 4144 and the accommodating cavity 401. The thermal insulation side wall 564 separates the water guide groove 423 from the accommodating cavity 401 and separates the side wall accommodating groove 4144 from the accommodating cavity 401, to separate water in the water guide groove 423 from water in the side wall accommodating groove 4144, to prevent water in the water guide groove 423 and the side wall accommodating groove 4144 from entering the accommodating cavity 401. Specifically, the base 418 includes an accommodating cavity bottom wall 4018 located below the accommodating cavity 401. In the vertical direction, the water guide hole 4231 is located below the accommodating cavity bottom wall 4018. In other words, an upper surface of the accommodating cavity bottom wall 4018 is higher than the water guide hole 4231. In the horizontal direction, the water guide hole 4231 does not extend from the accommodating cavity bottom wall 4018, to prevent a water flow flowing into the water guide hole 4231 from entering the accommodating cavity 401.

The drainage system 420 further includes a water-stop wall 424 located in front of the inlet 405 to stop water from entering the inlet 405. Specifically, the water-stop wall 424 is disposed between a lower thermal insulation body 5602 and the protective cover 430. As shown in FIG. 41, the water-stop wall 424 includes a plurality of lower water-stop walls 4241 formed protruding outward from an upper surface of the lower thermal insulation body 5602 and a plurality of upper water-stop walls 4242 extending from a lower end of the protective cover 430. The lower water-stop wall 4241 includes a top water-stop wall 4243 formed protruding upward from the thermal insulation top wall 563 and a side water-stop wall 4244 formed protruding outward from the thermal insulation side wall 564. The water-stop wall 424 extends in a transverse direction. The transverse direction is a width direction of the self-moving device 400, that is, a travel direction perpendicular to the self-moving device 400. The water-stop wall 424 extending in the transverse direction includes the water-stop wall 424 extending in parallel to a width direction. That is, the water-stop wall 424 completely extends in the transverse direction, and also includes the water-stop wall 424 having a component extending in the transverse direction. In the self-moving device 400, the water-stop wall 424 extending in the transverse direction is disposed, and an outer edge of the water-stop wall 424 protrudes outward from a corresponding position of the inlet 405, so that when water flows from the middle of the body to the outside of the body, that is, when water flows from front to rear in the travel direction of the self-moving device 400, the water is blocked by a plurality of water-stop walls 424. Every water-stop wall 424 somewhat reduces a flow speed and a flow amount of water. When more water-stop walls 424 are disposed, the flow speed and flow amount of water become smaller. In an embodiment, the upper water-stop wall 4242 may abut against or be at an interval less than a preset distance from the thermal insulation side wall 564, to achieve a better water-stop effect of the upper water-stop wall 4242. In an embodiment, as shown in FIG. 41, a water-stop wall at an inlet may be disposed near the inlet 405. For example, the water-stop wall is formed protruding upward from a preset distance in front of the inlet 405. Alternatively, the water-stop wall 424 is directly formed protruding upward from the circumference of the inlet 405, and a plurality of front water-stop walls are disposed in front of the water-stop wall at an inlet to reduce a water flow. Alternatively, as shown in FIG. 39, the water-stop wall 424 may be disposed on a side, near the inlet 405, of the pivot portion drainage groove 422. Certainly, in other embodiments, the water-stop wall 424 may be disposed in another position between the inlet 405 and the pivot portion drainage groove 422 according to an actual case, provided that a barrier can be established in front of the inlet 405 to stop water to prevent water from flowing into the inlet 405.

In this embodiment, both the drainage system 420 and the thermal insulation body 560 are disposed, so that the self-moving device 400 can insulate heat and can drain water. Moreover, the thermal insulation body 560 disposed between the protective cover 430 and the accommodating cavity 401 in the self-moving device 400 can insulate heat and can further stop water. The thermal insulation body 560 and the base together define the accommodating cavity 401, so that the thermal insulation body 560 establishes water-stop protection around the accommodating cavity 401, thereby preventing the entry of water. Moreover, the water guide groove is further disposed on an outer side of the thermal insulation body 560, and the thermal insulation body 560 is used to separate the water guide groove from the accommodating cavity 401, to prevent water in the water guide groove from flowing into the accommodating cavity. In this solution, both drainage and thermal insulation can be implemented, and the water-proof effect is enhanced while the thermal insulation can be implemented.

The technical features in the foregoing embodiments may be randomly combined. For simplicity of description, all possible combinations of the technical features in the foregoing embodiments are not described. However, it should be considered that these combinations of technical features fall within the scope recorded in the specification provided that these combinations of technical features do not have any conflict.

The foregoing embodiments only describe several implementations of the present invention, and their description is specific and detailed, but cannot therefore be understood as a limitation to the patent scope of the present invention. It should be noted that a person of ordinary skill in the art may further make variations and improvements without departing from the conception of the present invention, and these all fall within the protection scope of the present invention. Therefore, the patent protection scope of the present invention should be subject to the appended claims.

What is claimed is:

1. An automatic working system, comprising a self-moving device moving and working inside a defined working area and an energy module supplying power to the self-moving device, wherein the self-moving device comprises:
   a body;
   a movement module, disposed on the body and configured to drive the self-moving device to move;
   a task execution module, disposed on the body and configured to perform a work task; and
   a control module, configured to: control the movement module to drive the self-moving device to move inside a defined area, and control the task execution module to perform the work task,
   the energy module is selectively configured to supply power to the self-moving device or an electric tool different from the self-moving device, the self-moving device comprises an accommodating cavity provided with an inlet and configured to accommodate the energy module and a protective cover configured to operably block the inlet, and the self-moving device further comprises a drainage system configured to drain water to prevent water from entering the accommodating cavity wherein the drainage system comprises a drainage groove in communication with an outside and an inside of the self-moving device to drain water outside.

2. The automatic working system according to claim 1, wherein the body comprises a bearing portion configured to bear a circumference of the protective cover, and the drainage groove is provided in the bearing portion.

3. The automatic working system according to claim 1, wherein the self-moving device further comprises a pivot portion configured to connect the protective cover and the body, and the protective cover is rotatable around the pivot portion to implement opening or closing, the body further comprises a pivot groove accommodating the pivot portion, and the drainage groove comprises a pivot portion drainage groove in communication with the pivot groove.

4. The automatic working system according to claim 3, wherein the pivot portion drainage groove comprises a drainage hole in communication with the outside and a connecting groove connecting the pivot groove and the drainage hole, the drainage hole is located below the connecting groove.

5. The automatic working system according to claim 1, wherein the protective cover comprises a top cover, a lateral protective wall extending toward a left side and a right side from the top cover, and a rear protective wall formed extending backward from the top cover, the lateral protective wall is located on outer sides of left and right side walls of the body, a bottom of the lateral protective wall is lower than upper surfaces of the left and right side walls of the body, and the rear protective wall is located on an outer side of a rear wall of the body.

6. The automatic working system according to claim 1, wherein the drainage system further comprises a water guide groove disposed on the surface of the body and provided with a bottom, and the water guide groove comprises a water guide passage formed recessing inward from the surface of the body and a water guide hole connecting the water guide passage and the outside of the self-moving device, in a horizontal direction, the bottom of the water guide groove extends from the middle of the body to the outside of the body, and in a vertical direction, the bottom of the water guide groove extends from top to bottom.

7. The automatic working system according to claim 1, wherein the drainage system further comprises a water guide groove disposed on a surface of the body and provided with a bottom, and the water guide groove comprises a water guide passage formed recessing inward from the surface of the body and a water guide hole connecting the water guide passage and the outside of the self-moving device, a projection of the protective cover in a transverse direction is smaller than a projection of a corresponding position of the body in the transverse direction, in the transverse direction, the water guide groove is located on two sides of the accommodating cavity, and the body comprises a separating wall located between the water guide groove and the accommodating cavity.

8. The automatic working system according to claim 7, wherein the protective cover comprises a top cover, a lateral protective wall extending toward the left and right sides from the top cover, and a rear protective wall formed extending backward from the top cover, the self-moving device further comprises a side wall accommodating groove accommodating the lateral protective wall, and the side wall accommodating groove is in communication with the water guide groove.

9. The automatic working system according to claim 1, wherein the drainage system further comprises a water-stop wall located in front of the inlet.

10. The automatic working system according to claim 1, wherein the inlet comprises a vertical opening extending in a vertical direction and a longitudinal opening extending in a longitudinal direction.

11. The automatic working system according to claim 1, wherein the inlet comprises an upper end edge and a lower end edge, and in a travel direction of the self-moving device, the upper end edge is located in front of the lower end edge.

12. The automatic working system according to claim 1, the self-moving device further comprises a temperature protection apparatus configured to perform temperature protection on the energy module, the temperature protection apparatus comprises a thermal insulation body located above the protective cover and/or located between the protective cover and the accommodating cavity, a thermal insulation space is provided between the thermal insulation body and the protective cover.

13. The automatic working system according to claim 12, wherein the thermal insulation body is a part of the body, the body comprises a base and the thermal insulation body extending from the base, the thermal insulation body and the base together define the accommodating cavity, and the thermal insulation body comprises a thermal insulation top wall located right above the accommodating cavity and a thermal insulation side wall connecting the thermal insulation top wall and the base, the drainage system further comprises a water guide groove located on two sides of the thermal insulation side wall and provided with a bottom, in a horizontal direction, the bottom of the water guide groove extends from the middle of the body to the outside of the body, and in a vertical direction, the bottom of the water guide groove extends from top to bottom.

14. The automatic working system according to claim 1, wherein the self-moving device further comprises a thermal insulation body located between the protective cover and the accommodating cavity, the drainage system further comprises a water-stop wall disposed in front of the inlet, and the water-stop wall is located between the protective cover and the thermal insulation body.

15. The automatic working system according to claim 14, wherein the water-stop wall is formed protruding outward from an upper surface of the thermal insulation body, and/or is formed extending from a lower end of the protective cover.

16. The automatic working system according to claim 1, wherein the self-moving device further comprises a self-moving device power supply interface configured to be electrically connected to the energy module, the self-moving device power supply interface comprises at least one of a fast-pluggable self-moving device connector and a wirelessly-rechargeable self-moving device charging interface.

17. The automatic working system according to claim 1, wherein the self-moving device further comprises a self-moving device power supply interface configured to be electrically connected to the energy module, the automatic working system further comprises an electric tool different from the self-moving device, and the electric tool comprises an electric tool power supply interface the same as the self-moving device power supply interface, to enable the energy module to be selectively configured to supply power to the self-moving device or the electric tool.

18. An automatic working system, comprising a self-moving device moving and working inside a defined working area and an energy module supplying power to the self-moving device, wherein the self-moving device comprises:
a body;
a movement module, disposed on the body and configured to drive the self-moving device to move;
a task execution module, disposed on the body and configured to perform a work task; and
a control module, configured to: control the movement module to drive the self-moving device to move inside a defined area, and control the task execution module to perform the work task,
the energy module is selectively configured to supply power to the self-moving device or an electric tool different from the self-moving device, the self-moving device comprises an accommodating cavity provided with an inlet and configured to accommodate the energy module and a protective cover configured to operably block the inlet, and the self-moving device further comprises a drainage system configured to drain water to prevent water from entering the accommodating cavity
a pivot portion configured to connect the protective cover and the body, and the protective cover is rotatable around the pivot portion to implement opening or closing, the body further comprises a pivot groove accommodating the pivot portion, and a drainage groove comprises a pivot portion drainage groove in communication with the pivot groove.

19. An automatic working system, comprising a self-moving device moving and working inside a defined working area and an energy module supplying power to the self-moving device, wherein the self-moving device comprises:
a body;
a movement module, disposed on the body and configured to drive the self-moving device to move;
a task execution module, disposed on the body and configured to perform a work task; and
a control module, configured to: control the movement module to drive the self-moving device to move inside a defined area, and control the task execution module to perform the work task,
the energy module is selectively configured to supply power to the self-moving device or an electric tool different from the self-moving device, the self-moving device comprises an accommodating cavity provided with an inlet and configured to accommodate the energy module and a protective cover configured to operably block the inlet, and the self-moving device further comprises a drainage system configured to drain water to prevent water from entering the accommodating cavity,
a temperature protection apparatus configured to perform temperature protection on the energy module, the temperature protection apparatus comprises a thermal insulation body located above the protective cover and/or located between the protective cover and the accommodating cavity, a thermal insulation space is provided between the thermal insulation body and the protective cover.

* * * * *